(12) United States Patent
Taylor

(10) Patent No.: US 9,401,400 B2
(45) Date of Patent: Jul. 26, 2016

(54) SINGLE ELECTRON TRANSISTOR DEVICE

(71) Applicants: The University of Connecticut, Farmington, CT (US); Opel Solar, Inc., Storrs Mansfield, CT (US)

(72) Inventor: Geoff W. Taylor, Mansfield, CT (US)

(73) Assignees: THE UNIVERSITY OF CONNECTICUT, Farmington, CT (US); Opel Solar, Inc., Storrs Mansfield, CT (US)

(*) Notice: Subject to any disclaimer, the term of this patent is extended or adjusted under 35 U.S.C. 154(b) by 0 days.

(21) Appl. No.: 14/551,619

(22) Filed: Nov. 24, 2014

(65) Prior Publication Data
US 2015/0171197 A1    Jun. 18, 2015

Related U.S. Application Data

(63) Continuation of application No. 13/921,311, filed on Jun. 19, 2013, now Pat. No. 9,082,637, which is a continuation-in-part of application No. PCT/US2012/051265, filed on Aug. 17, 2012.

(51) Int. Cl.
*H01L 29/06* (2006.01)
*H01S 5/34* (2006.01)
(Continued)

(52) U.S. Cl.
CPC .......... *H01L 29/0688* (2013.01); *B82Y 10/00* (2013.01); *G02B 6/125* (2013.01); *H01L 21/0259* (2013.01); *H01L 27/144* (2013.01);
(Continued)

(58) Field of Classification Search
CPC ... H01L 29/0688; H01S 5/026; H01S 5/3412; H01S 5/309; H01S 5/06203; H01S 5/34

USPC .............. 372/43.01, 45.012–45.013, 46.014, 372/50.1
See application file for complete search history.

(56) References Cited

U.S. PATENT DOCUMENTS 5,790,583 A    8/1998 Ho
6,031,243 A    2/2000 Taylor
(Continued)

FOREIGN PATENT DOCUMENTS

WO    WO02/071490 A1    9/2002
WO    WO 2013/025964 A1    2/2013

OTHER PUBLICATIONS

U.S. Appl. No. 08/949,504, Geoff W. Taylor, filed Oct. 14, 1997.
(Continued)

*Primary Examiner* — Dung Nguyen
(74) *Attorney, Agent, or Firm* — Sughrue Mion, PLLC

(57) ABSTRACT

A transistor device is provided that includes a gate electrode disposed between source and drain electrodes and overlying a quantum dot structure realized by a modulation doped quantum well structure. A potential barrier surrounds the quantum dot structure. The transistor device can be configured for operation as a single electron transistor by means for biasing the gate and source electrodes to allow for tunneling of a single electron from the source electrode through the potential barrier surrounding the quantum dot structure and into the quantum dot structure, and means for biasing the gate and drain electrodes to allow for selective tunneling of a single electron from the quantum dot structure through the potential barrier surrounding the quantum dot structure to the drain electrode, wherein the selective tunneling of the single electron is based upon spin state of the single electron.

7 Claims, 31 Drawing Sheets

(51) Int. Cl.

| | | |
|---|---|---|
| *H01L 21/02* | (2006.01) | |
| *H01L 29/12* | (2006.01) | |
| *H01L 29/15* | (2006.01) | |
| *H01S 5/026* | (2006.01) | |
| *H01S 5/062* | (2006.01) | |
| *H01S 5/30* | (2006.01) | |
| *G02B 6/125* | (2006.01) | |
| *B82Y 10/00* | (2011.01) | |
| *H01L 27/144* | (2006.01) | |
| *H01L 27/15* | (2006.01) | |
| *H01L 31/0352* | (2006.01) | |
| *H01L 31/18* | (2006.01) | |
| *H01L 33/00* | (2010.01) | |
| *H01L 33/06* | (2010.01) | |
| *H01L 29/66* | (2006.01) | |
| *H01L 29/778* | (2006.01) | |
| *H01S 5/183* | (2006.01) | |

(52) U.S. Cl.
CPC .......... *H01L 27/15* (2013.01); *H01L 29/0665* (2013.01); *H01L 29/122* (2013.01); *H01L 29/127* (2013.01); *H01L 29/155* (2013.01); *H01L 29/66977* (2013.01); *H01L 29/7786* (2013.01); *H01L 31/035218* (2013.01); *H01L 31/035236* (2013.01); *H01L 31/18* (2013.01); *H01L 33/005* (2013.01); *H01L 33/06* (2013.01); *H01S 5/026* (2013.01); *H01S 5/06203* (2013.01); *H01S 5/309* (2013.01); *H01S 5/34* (2013.01); *H01S 5/3412* (2013.01); *H01S 5/18358* (2013.01)

(56) References Cited

U.S. PATENT DOCUMENTS

| | | | |
|---|---|---|---|
| 6,118,908 A | 9/2000 | Bischel et al. | |
| 6,479,844 B2 | 11/2002 | Taylor | |
| 6,639,930 B2 | 10/2003 | Griffel et al. | |
| 6,720,589 B1 | 4/2004 | Shields | |
| 6,782,021 B2 | 8/2004 | Huang et al. | |
| 6,841,795 B2 | 1/2005 | Taylor et al. | |
| 6,849,866 B2 | 2/2005 | Taylor | |
| 6,853,014 B2 | 2/2005 | Cai et al. | |
| 6,865,314 B1 | 3/2005 | Blair et al. | |
| 6,870,207 B2 | 3/2005 | Taylor | |
| 6,873,273 B2 | 3/2005 | Taylor et al. | |
| 6,954,473 B2 | 10/2005 | Dehmubed et al. | |
| 6,995,407 B2 | 2/2006 | Taylor et al. | |
| 7,103,079 B2 | 9/2006 | McInerney et al. | |
| 7,176,046 B2 | 2/2007 | Taylor | |
| 7,282,732 B2 | 10/2007 | Gray et al. | |
| 7,332,752 B2 | 2/2008 | Taylor et al. | |
| 7,657,132 B1 | 2/2010 | Yap et al. | |
| 2002/0175346 A1 | 11/2002 | Brar | |
| 2002/0176087 A1 | 11/2002 | Numai | |
| 2003/0118066 A1 | 6/2003 | Bour et al. | |
| 2004/0075090 A1 | 4/2004 | Taylor | |
| 2004/0081216 A1* | 4/2004 | Dehmubed | H01L 29/155 372/50.124 |
| 2004/0188669 A1 | 9/2004 | Atanackovic et al. | |
| 2007/0030874 A1 | 2/2007 | Ariga et al. | |
| 2007/0063182 A1* | 3/2007 | Yang et al. | 257/14 |
| 2007/0269968 A1 | 11/2007 | Saxler et al. | |
| 2008/0135831 A1 | 6/2008 | Taylor et al. | |
| 2008/0166095 A1 | 7/2008 | Popovic et al. | |
| 2010/0032552 A1 | 2/2010 | Doshida et al. | |
| 2011/0284824 A1 | 11/2011 | Liu et al. | |

OTHER PUBLICATIONS

U.S. Appl. No. 09/710,217, Geoff W. Taylor, filed Nov. 10, 2000.
U.S. Appl. No. 10/323,513, Geoff W. Taylor, filed Dec. 19, 2002.
Advanced Quantum Dot Configurations, Suwit Kiravittaya et al., Reports on Programs in Physics, 72(2009) 046402 (34pp).
Characteristics of InAs/AlGaAs Self-Organized Quantum Dot Modulation Doped Field Effect Transistors, J Phillips et al., Applied Physics Letters, vol. 72, No. 26, Jun. 29, 1998.
Comparison of Theory and Experiment in a Modified BICFET/HFET Structure, J. Yao et al, Solid State Electronics 53 (2009) 979-987.
GaAs-Based Quantum Dot Emitters for Telecomms and Broadband Applications, Mohammed Abdul Majid, Thesis, University of Sheffield, Aug. 2011.
Memory Operation on InAs Quantum Dot Heterostructure Field Effect Transistor, Heesoo Son, et al., Jpn. J Appl. Phys. vol. 40 (2001) pp. 2801-2803.

* cited by examiner

| Layer Material | Layer Doping Type | Typical Doping Concentration (atoms/cm3) | Typical Layer Thickness (A) | Layer # | | Notes |
|---|---|---|---|---|---|---|
| InGaAs | P+ | 1e20 | 30 | 1107 } | 38 | preferably 10% In; assists in forming top ohmic contact during anneal |
| GaAs | P+ | 1e20 | 500-1500 | 1105 } | 38 | forms top ohmic contact |
| Al(0.7)Ga(0.3)As | P | 5e17 | 600-1000 | 1103 | | provides optical and electrical confinement |
| Al(0.15)Ga(0.85)As | P+ | 7e18 | 60 | 1101 } | 36 | top plate of upper capacitor |
| Al(0.15)Ga(0.85)As | | UD | 100-300 | 1099 } | 34 | |
| Al(0.15)Ga(0.85)As | N+ | 3e18 | 80 | 1097 | | N+ charge sheet-bottom plate of upper capacitor and modulating doping layer |
| Al(0.15)Ga(0.85)As | | UD | 30 | 1095 | | |
| GaAs barrier ⎤ | | UD | 10 | 1093 } | 32 | digital grading of In with 15-20% In |
| InGaAs QW ⎦ x3 | | UD | 60 | 1091 | | |
| GaAs barrier | | UD | 300-500 | 1089 } | 30 | |
| Analog-graded InGaAs QW | | UD | 40 | 1087 | | analog grading of In from In(0.3)Ga(0.7)As to In(0.0375)Ga(0.9625)As -forms top side of the analog-graded InGaAs QW |
| InAs QD growth | | UD | | 1085 } | 28h | forms QDs embedded between the top side and bottom side of the analog-graded InGaAs QW |
| Analog-graded InGaAs QW | | UD | 40 | 1083 | | analog grading of In from In(0.0375)Ga(0.9625)As to In(0.3)Ga(0.7)As -forms bottom side of the analog-graded InGaAs QW |
| GaAs barrier | | UD | 100 | 1081 } | 28g | |
| InGaAs QW | | UD | 40-60 | 1079 | | digital grading of In with 15-20% In-forms the top side of the digitally-graded InGaAs QW |
| InAs QD growth | | UD | 45 | 1077 } | 28f | forms QDs embedded between the top side and bottom side of the digitally-graded InGaAs QW |
| InGaAs QW | | UD | 2 | 1075 | | digital grading of In with 15-20% In-forms the bottom side of the digitally-graded InGaAs QW |
| GaAs barrier | | UD | 300-500 | 1073 } | 28e | |
| Analog-graded InGaAs QW | | UD | 40 | 1071 | | analog grading of In from In(0.3)Ga(0.7)As to In(0.0375)Ga(0.9625)As -forms top side of the analog-graded InGaAs QW |
| InAs QD growth | | UD | | 1069 | | forms QDs embedded between the top side and bottom side of the analog-graded InGaAs QW |

FIG. 12A

| Layer Material | Layer Doping Type | Typical Doping Concentration (atoms/cm3) | Typical Layer Thickness (Å) | Layer # | Notes |
|---|---|---|---|---|---|
| Analog-graded InGaAs QW | | UD | 40 | 1067 } 28d | analog grading of In from In(0.0375)Ga(0.9625)As to In(0.3)Ga(0.7)As -forms bottom side of the analog-graded InGaAs QW |
| GaAs barrier | | UD | 100 | 1065 } 28c | |
| InGaAs QW | | UD | 40-60 | 1063 | digital grading of In with 15-20% In - forms the top side of the digitally-graded InGaAs QW |
| InAs QD growth | | UD | | 1061 } 28b | forms QDs embedded between the top side and bottom side of the digitally-graded InGaAs QW |
| InGaAs QW | | UD | 2 | 1059 | digital grading of In with 15-20% In - forms the bottom side of digitally-graded InGaAs QW |
| GaAs barrier | | UD | 300-500 | 1057 } 28a | |
| Al(0.15)Ga(0.85)As | N | 1-2E016 | 2000 | 1055 } 26 | |
| Al(0.15)Ga(0.85)As | P | 5E015 | 2000 | 1053 | |
| Analog-graded InGaAs QW | | UD | 40 | 1051 | analog grading of In from In(0.3)Ga(0.7)As to In(0.0375)Ga(0.9625)As -forms top side of the analog-graded InGaAs QW |
| InAs QD growth | | UD | | 1049 } 24g | forms QDs embedded between the top side and bottom side of the analog-graded InGaAs QW |
| Analog-graded InGaAs QW | | UD | 40 | 1047 | analog grading of In from In(0.0375)Ga(0.9625)As to In(0.3)Ga(0.7)As -forms bottom side of the analog-graded InGaAs QW |
| GaAs barrier | | UD | 100 | 1045 } 24f | |
| InGaAs QW | | UD | 40-60 | 1043 | digital grading of In with 15-20% In - forms the top side of the digitally-graded InGaAs QW |
| InAs QD growth | | UD | 45 | 1041 } 24e | forms QDs embedded between the top side and bottom side of the digitally-graded InGaAs QW |
| InGaAs QW | | UD | 2 | 1039 | digital grading of In with 15-20% In - forms the bottom side of the digitally-graded InGaAs QW |
| GaAs barrier | | UD | 300-500 | 1037 } 24d | |
| Analog-graded InGaAs QW | | UD | 40 | 1035 | analog grading of In from In(0.3)Ga(0.7)As to In(0.0375)Ga(0.9625)As -forms top side of the analog-graded InGaAs QW |
| InAs QD growth | | UD | | 1033 } 24c | forms QDs embedded between the top side and bottom side of the analog-graded InGaAs QW |

FIG. 12B

| Layer Material | Layer Doping Type | Typical Doping Concentration (atoms/cm3) | Typical Layer Thickness (Å) | Layer # | | Notes |
|---|---|---|---|---|---|---|
| Analog-graded InGaAs QW | | UD | 40 | 1031 } | | analog grading of In from In(0.0375)Ga(0.9625)As to In(0.3)Ga(0.7)As -forms bottom side of the analog-graded InGaAs QW |
| GaAs barrier | | UD | 100 | 1029 } | 26 | |
| InGaAs QW | | UD | 40-60 | 1027 | | digital grading of In with 15-20% In - forms the top side of the digitally-graded InGaAs QW |
| InAs QD growth | | UD | | 1025 } | 24a | forms QDs embedded between the top side and bottom side of the digitally-graded InGaAs QW |
| InGaAs QW | | UD | 2 | 1023 | | digital grading of In with 15-20% In - forms the bottom side of the digitally-graded InGaAs QW |
| GaAs barrier | | UD | 300-500 | 1021 } | 22 | |
| InGaAs QW | | UD | 60 | 1019 | | digital grading of In with 15-20% In |
| GaAs barrier | | UD | 10 | 1017 | 20 | |
| Al(0.15)Ga(0.85)As | | UD | 30 | 1016 | | |
| Al(0.15)Ga(0.85)As | P+ | 7e18 | 40 | 1015 | | P+ charge sheet-top plate of bottom capacitor and modulation doping layer |
| Al(0.15)Ga(0.85)As | N+ | UD | 100-300 | 1014 } | 18 | |
| Al(0.15)Ga(0.85)As | N+ | 3.5e18 | 60 | 1013 | 16 | bottom plate of bottom capacitor |
| Al(0.70)Ga(0.85)As | N | 1e18 | 600-1000 | 1011 | | provides optical and electrical confinement |
| GaAs | N+ | 3.5e18 | 3000 | 1009 | 14 | forms bottom ohmic contact |
| AlAs | | UD | 1660 | 1007 | | |
| GaAs | | UD | 695 | 1005 | 12 | forms bottom DBR mirror |
| AlAs | | UD | 1660 | 1003 | | |
| GaAs substrate | | SI | | 1001 } | 10 | |

FIG. 12C

DBR mirror (Periodic structure of layers 1003 and 1005)

SINGLE ELECTRON TRANSISTOR DEVICE

CROSS REFERENCE TO RELATED APPLICATIONS

The present application is a continuation of Ser. No. 13/921,311, filed on Jun. 19, 2013, which is a continuation-in-part of Intl. Patent Appl. No. PCT/US12/51265, entitled "OPTICAL CLOSED LOOP MICRORESONATOR AND THYRISTOR MEMORY DEVICE" filed on Aug. 17, 2012, herein incorporated by reference in its entirety.

BACKGROUND

1. Field

The present application relates to semiconductor integrated circuits that implement a variety optoelectronic functions (such as optical emitters, optical detectors, optical modulators, optical amplifiers, and optical switches) and electronic functions (such as heterojunction field effect transistors and bipolar field effect transistors).

2. State of the Art

The present application builds upon technology (referred to by the Applicant as "Planar Optoelectronic Technology" or "POET") that provides for the realization of a variety of devices (optoelectronic devices, logic circuits and/or signal processing circuits) utilizing inversion quantum-well channel device structures as described in detail in U.S. Pat. No. 6,031,243; U.S. patent application Ser. No. 09/556,285, filed on Apr. 24, 2000; U.S. patent application Ser. No. 09/798,316, filed on Mar. 2, 2001; International Application No. PCT/US02/06802 filed on Mar. 4, 2002; U.S. patent application Ser. No. 08/949,504, filed on Oct. 14, 1997, U.S. patent application Ser. No. 10/200,967, filed on Jul. 23, 2002; U.S. application Ser. No. 09/710,217, filed on Nov. 10, 2000; U.S. Patent Application No. 60/376,238, filed on Apr. 26, 2002; U.S. patent application Ser. No. 10/323,390, filed on Dec. 19, 2002; U.S. patent application Ser. No. 10/280,892, filed on Oct. 25, 2002; U.S. patent application Ser. No. 10/323,390, filed on Dec. 19, 2002; U.S. patent application Ser. No. 10/323,513, filed on Dec. 19, 2002; U.S. patent application Ser. No. 10/323,389, filed on Dec. 19, 2002; U.S. patent application Ser. No. 10/323,388, filed on Dec. 19, 2002; U.S. patent application Ser. No. 10/340,942, filed on Jan. 13, 2003; all of which are hereby incorporated by reference in their entireties.

With these structures, a fabrication sequence can be used to make the devices on a common substrate. In other words, n type and p type contacts, critical etches, etc. can be used to realize all of these devices simultaneously on a common substrate. The essential features of this device structure include 1) an n-type modulation doped interface and a p-type modulation doped quantum well interface, 2) self-aligned n-type and p-type channel contacts formed by ion implantation, 3) n-type metal contacts to the n-type ion implants and the bottom n-type layer structure, and 4) p-type metal contacts to the p-type ion implants and the top p-type layer structure. The active device structures are preferably realized with a material system of group III-V materials (such as a GaAs/AlGaAs).

POET can be used to construct a variety of optoelectronic devices. POET can also be used to construct a variety of high performance transistor devices, such as complementary NHFET and PHFET unipolar devices as well as n-type and p-type HBT bipolar devices.

SUMMARY

A semiconductor device includes a plurality of semiconductor layers supported on a substrate. The plurality of semiconductor layers include at least one modulation doped quantum well (QW) structure offset from a quantum dot in quantum well (QD-in-QW) structure. The modulation doped QW structure includes a charge sheet spaced from at least one QW by a spacer layer. The QD-in-QW structure has quantum dots (QDs) embedded in one or more QWs. The QDs are sized to support optical functions (emission, amplification, absorption) of electromagnetic radiation at a characteristic wavelength.

In one embodiment, the QD-in-QW structure can include at least one template/emission substructure pair separated by a barrier layer, the template substructure can have smaller size QDs than the emission substructure. Furthermore, the template substructure can define QDs embedded in a digital-graded quantum well, and the emission substructure can define QDs embedded in an analog-graded quantum well.

In another embodiment, the QD-in-QW structure can define QDs embedded in at least one analog-graded quantum well.

In yet another embodiment, the plurality of semiconductor layers can include a plurality of QD-in-QW structures with QDs sized to support optical functions (emission, amplification, absorption) of electromagnetic radiation of different characteristic wavelengths (such as optical wavelengths in range from 1300 nm to 1550 nm).

In still another embodiment, the QD-in-QW structure can be disposed opposite the charge sheet of the modulation doped QW structure and offset from the at least one quantum well of the modulation doped QW structure by a spacer layer. The spacer layer can have a thickness in the range of 300-500 Å.

The semiconductor device can realize an integrated circuit including a wide variety of optoelectronic devices that perform optical functions (emission, amplification, absorption) for electromagnetic radiation at the characteristic wavelength(s) supported by the QDs of the QD-in-QW structure(s) as well as including electrical transistors for configuration of such optoelectronic devices, logic circuitry and signal processing circuitry as needed.

Advantageously, the QDs embedded within the QD-in-QW structure(s) of the optoelectronic device improve the efficiency of such optoelectronic devices and integrated circuits based thereon. Specifically, the population inversion necessary for emission and amplification as well as the photon absorption mechanism for necessary for optical detection occurs more efficiently with the introduction of the quantum dots and thus decreases the necessary current required for lasing action and amplification and increases the photocurrent produced by absorption. Furthermore, the size of the embedded QDs can be controlled to dictate the wavelength of the desired optical function (emission, amplification and absorption).

In another aspect, a transistor device is provided with a gate terminal electrode disposed between a source terminal electrode and a drain terminal electrode. The gate terminal electrode overlies a quantum dot structure realized by a modulation doped quantum well structure including a charge sheet offset from at least one quantum well. A potential barrier surrounds the quantum dot structure. The potential barrier can be defined by an ion implant region that surrounds the QD structure. In one embodiment, the ion implant region is formed from an ion species that reacts with the charge sheet of the modulation doped quantum well structure under predefined high temperature conditions. The location and dimensions of the potential barrier can be dictated by the location and size of an opening defined by a photomask that allows for the implantation of the ion species. The ion species can include oxygen ions.

The transistor device can be configured for operation as a single electron transistor. In this configuration, the transistor device includes means for biasing the gate and source terminal electrodes to allow for tunneling of a single electron from the source terminal electrode through the potential barrier surrounding the quantum dot structure and into the quantum dot structure, and means for biasing the gate and drain terminal electrodes to allow for selective tunneling of a single electron from the quantum dot structure through the potential barrier surrounding the quantum dot structure to the drain terminal electrode, wherein the selective tunneling of the single electron is based upon spin state of the single electron.

BRIEF DESCRIPTION OF THE DRAWINGS

FIGS. 12A to 12C, collectively, are a chart illustrating an exemplary layer structure for realizing the optoelectronic integrated circuit device structures of FIGS. 1 to 11B.

FIG. 15A is a perspective schematic view of the passive waveguide structure and the quantum well laser or detector device; FIG. 15B is a cross-sectional schematic view of the quantum well laser or detector device through the cross-section labeled 15B-15B in FIG. 15A; FIG. 15C is a cross-sectional schematic view of the passive waveguide structure through the cross-section labeled 15C-15C in FIG. 15A.

FIG. 18A is a perspective schematic view of the closed-loop microresonator; FIG. 18B is a top schematic view of the closed-loop microresonator; FIG. 18C is a cross-sectional schematic view of the closed-loop microresonator through the cross-section labeled 18C-18C in FIG. 18B; FIG. 18D is a cross-sectional schematic view of the closed-loop microresonator through the cross-section labeled 18D-18D in FIG. 18B; FIG. 18E is a perspective schematic view of the closed-loop microresonator fabricated alongside a heater transistor device for wavelength tuning; and FIG. 18F is a perspective schematic view of the closed-loop microresonator fabricated alongside a set of evanescently coupled closed-loop waveguide structures for wavelength tuning.

FIG. 19A is a top schematic view of the waveguide optical coupler; FIG. 19B is a cross-sectional schematic view of the waveguide optical coupler through the cross-section labeled 19B-19B in FIG. 19A; FIG. 19C is a cross-sectional schematic view of the waveguide optical coupler through the cross-section labeled 19C-19C in FIG. 19A.

FIG. 20A is a perspective schematic view of the waveguide optical amplifier and associated passive waveguides for guiding light into and out of the waveguide optical amplifier; FIG. 20B is a cross-sectional schematic view of the waveguide optical amplifier through the cross-section labeled 20B-20B in FIG. 20A; and FIG. 20C is a cross-sectional schematic view of the passive waveguide through the cross-section labeled 20C-20C in FIG. 20A.

DETAILED DESCRIPTION OF THE PREFERRED EMBODIMENTS

Figure 1:
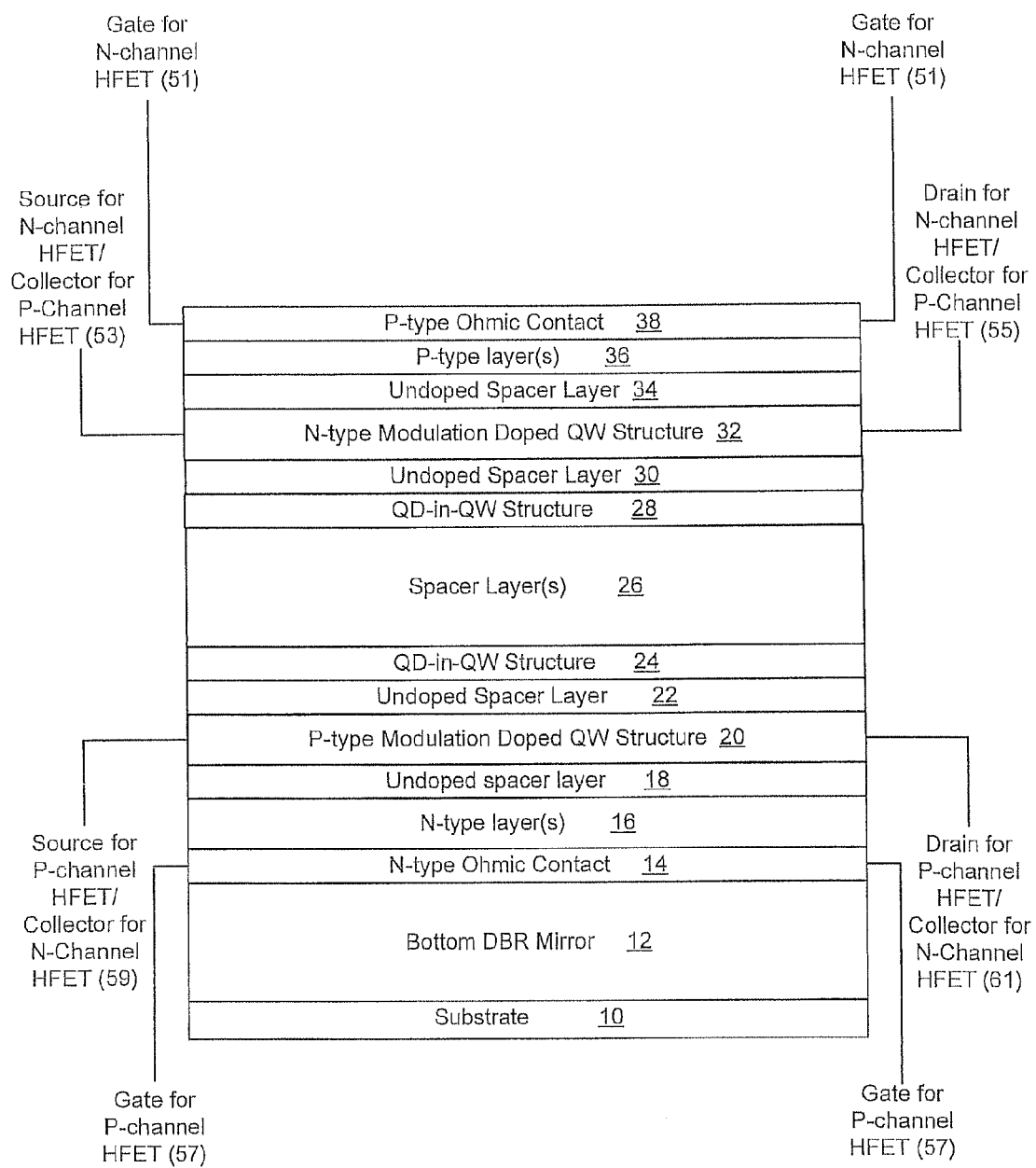
FIG. 1 is a schematic illustration of an exemplary optoelectronic integrated circuit device structure in accordance with the present application, with an n-channel HFET device and/or p-channel HFET device included therein.

Turning now to FIG. 1, the device structure of the present application includes bottom dielectric distributed bragg reflector (DBR) mirror 12 formed on substrate 10. The bottom DBR mirror 12 is typically formed by depositing pairs of semiconductor or dielectric materials with different refractive indices. When two materials with different refractive indices are placed together to form a junction, light will be reflected at the junction. The amount of light reflected at one such boundary is small. However, if multiple junctions/layer pairs are stacked periodically with each layer having a quarter-wave ($\lambda/4$) optical thickness, the reflections from each of the boundaries will be added in phase to produce a large amount of reflected light (e.g., a large reflection coefficient) at the particular center wavelength $\lambda_D$. Deposited upon the bottom DBR mirror 12 is the active device structure suitable for realizing complementary heterostructure field-effect transistor (HFET) devices. The first of these complementary HFET devices is a p-channel HFET which has a p-type modulation doped quantum well (QW) structure 20 with an n-type gate region (i.e., n-type ohmic contact layer 14 and n-type layer(s) 16)) below the p-type modulation doped QW structure 20. A QD-In-QW structure 22 is formed above the p-type modulation doped QW structure 20. The QD-In-QW structure 24 includes at least one QW layer with self-assembled quantum dots (QDs) embedded therein. The QD-In-QW structure 24 is spaced from the QW(s) of the p-type modulation doped QW structure 20 by an undoped spacer layer 22. The second of these complementary HFET devices is an n-channel HFET which includes an n-type modulation doped QW structure 32 with a p-type gate region (i.e., p-type layer(s) 36 and p-type ohmic contact 38) formed above the n-type modulation doped QW structure 32. A QD-In-QW structure 28 is formed below the n-type modulation doped QW structure 32. The QD-In-QW structure 28 includes at least one QW layer with self-assembled quantum dots (QDs) embedded therein. The QD-In-QW structure 28 is spaced from the QWs of the n-type modulation doped QW structure 20 by an undoped spacer layer 30. The QD-In-QW structure 28 is formed above one or more spacer layers 26 that interface to the QD-in-QW structure 24. The layers encompassing the spacer layer 30, the QD-in-QW structure 28, the spacer layer(s) 26, the QD-in-QW structure 24, the spacer layer 22, and the p-type modulation doped QW structure 20 forms the collector region of the n-channel HFET. The layers encompassing the spacer layer 22, the QD-in-QW structure 24, the spacer layer(s) 26, the QD-in-QW structure 28, the spacer layer 30, and the n-type modulation doped QW structure 32 forms the collector region of the p-channel HFET. Such collector regions are analogous to the substrate region of a MOSFET device as is well known. Therefore a non-inverted n-channel HFET device is stacked upon an inverted p-channel HFET device as part of the active device structure.

The active device layer structure begins with n-type ohmic contact layer(s) 14 which enables the formation of ohmic contacts thereto. Deposited on layer 14 are one or more n-type layers 16 and an undoped spacer layer 18 which serve electrically as part of the gate of the p-channel HFET device and optically as a part of the lower waveguide cladding of the device. Deposited on layer 18 is the p-type modulation doped QW structure 20 that defines a p-type charge sheet offset from one or more QWs (which may be formed from strained or unstrained heterojunction materials) by an undoped spacer layer. The p-type charge sheet is formed first below the undoped spacer and the one or more QWs of the p-type modulation doped QW structure 20. All of the layers grown thus far form the p-channel HFET device with the gate ohmic contact on the bottom. Deposited on the p-type modulation doped QW structure 20 is an undoped spacer layer 22 followed by the QD-In-QW structure 24 (which includes at least one QW layer with self-assembled QDs embedded therein). The undoped spacer layer 22 provides an offset between the QW(s) of the p-type modulation doped QW structure 20 and the QD-In-QW structure 24.

Deposited on the QD-In-QW structure 24 is the spacer layer(s) 26 followed by the QD-in-QW structure 28, the undoped spacer layer 30 and the n-type modulation doped QW structure 32. The n-type modulation doped QW structure 32 defines an n-type charge sheet offset from one or more QWs by an undoped spacer layer. The n-type charge sheet is formed last above the undoped spacer and the one or more QWs of the n-type modulation doped QW structure 32. The undoped spacer layer 30 provides an offset between the QD-In-QW structure 28 and the QW(s) of the b-type modulation doped QW structure 32.

Deposited on the n-type modulation doped QW structure 32 is an undoped spacer layer 34 and one or more p-type layers 36 which can serve electrically as part of the gate of the n-channel HFET and optically as part of the upper waveguide cladding of the device. Preferably, the p-type layers 36 include two sheets of planar doping of highly doped p-material separated by a lightly doped layer of p-material. These p-type layers are offset from the n-type modulation doped quantum well structure 32 by the undoped spacer material 34. In this configuration, the top charge sheet achieves low gate contact resistance and the bottom charge sheet defines the capacitance of the n-channel HFET with respect to the n-type modulation doped QW structure 32. Deposited on p-type layer(s) 36 is one or more p-type ohmic contact layer(s) 38, which enables the formation of ohmic contacts thereto.

For the n-channel HFET device, a gate terminal electrode (two shown as 51) of the n-channel HFET device is operably coupled to the top p-type ohmic contact layer(s) 38. A source terminal electrode 53 and a drain terminal electrode 55 of the re-channel HFET device are operably coupled to opposite ends of a QW channel(s) realized in the n-type modulation doped QW structure 32. One or more terminal electrodes (such as electrodes 59 and 61) can be operably coupled to the p-type modulation doped QW structure 20 and used as collector terminal electrodes for the n-channel HFET device.

For the p-channel HFET device, a gate terminal electrode (two shown as 57) of the p-channel HFET device is operably coupled to the bottom n-type ohmic contact layer(s) 14. A source terminal electrode 59 and a drain terminal electrode 61 of the p-channel HFET device are operably coupled to opposite ends of a QW channel(s) realized in the p-type modulation doped QW structure 20. One or more terminal electrodes (such as the electrodes 53 and 55) can be operably coupled to the n-type modulation doped QW structure 32 and used as a collector terminal electrode for the p-channel HFET device.

Both the n-channel HFET device and the p-channel HFET device are field effect transistors where current flows as a two-dimensional gas through a QW channel with contacts at either end. The basic transistor action is the modulation of the QW channel conductance by a modulated electric field that is perpendicular to the QW channel. The modulated electric field modulates the QW channel conductance by controlling an inversion layer (i.e., a two-dimensional electron gas for the n-channel HFET device or a two-dimensional hole gas for the p-channel HFET) as a function of gate voltage relative to source voltage.

For the n-channel HFET device, the QW channel conductance is turned on by biasing the gate terminal electrode 51 and source terminal electrode 53 at voltages where the P/N junction of the gate and source regions is forward biased with minimal gate conduction and an inversion layer of electron gas is created in the QW channel of the n-type modulation doped quantum well structure 32 between the source terminal electrode 53 and the drain terminal electrode 55. In this configuration, the source terminal electrode 53 is the terminal electrode from which the electron carriers enter the QW channel of the n-type modulation doped quantum well structure 32, the drain terminal electrode 55 is the terminal electrode where the electron carriers leave the device, and the gate terminal electrode 51 is the control terminal for the device.

Figure 2:
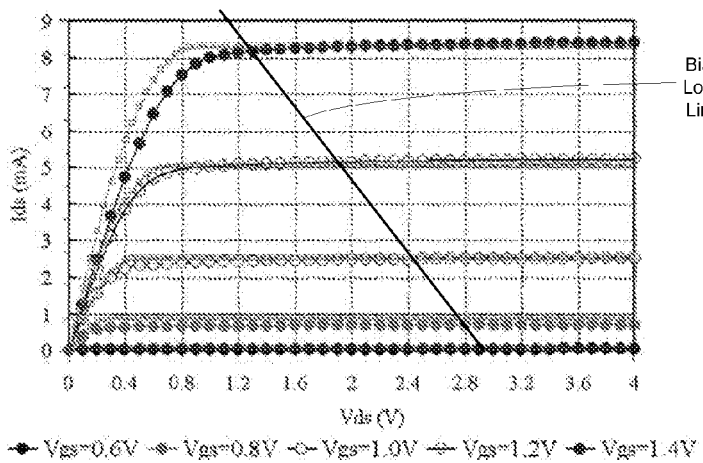
FIG. 2 is an exemplary current-voltage characteristic curve for an n-channel HFET device realized by the optoelectronic integrated circuit device structure of FIG. 1.

FIG. 2 shows the current-voltage characteristics of an exemplary n-channel HFET device. The n-channel HFET device can configured to operate as a field effect electrical transistor by biasing the device, for example, as shown in the load bias line of FIG. 2. With $V_{GS}$ set such that there is minimal gate conduction, an inversion layer of electrons (i.e., two-dimensional electron gas) is created in the QW channel of the n-type modulation doped quantum well structure 32 and the application of a voltage $V_{DS}$ causes current $I_D$ to flow from the drain terminal electrode 55 to the source terminal electrode 53. If $V_{GS}$ is set below the threshold voltage, the inversion layer of electrons (i.e., two-dimensional electron gas) is not formed in the QW channel of the n-type modulation doped quantum well structure 32. The channel has in effect disappeared, and no current $I_D$ flows from the drain terminal electrode 55 to the source terminal electrode 53 (i.e., $I_D$=0). Since the gate-channel junction is always biased such that there is minimal gate conduction of electrons, only a leakage current flows through the gate terminal electrode 51. The collector terminal(s) electrode 59, 61 of the n-channel HFET device can be coupled to the source terminal electrode 53 or possibly reverse biased with respect to the source terminal electrode 53 and the drain terminal electrode 55 in order to minimize such leakage current.

The p-channel HFET device operates in a similar manner to the n-channel HFET device with the current direction and voltage polarities reversed with respect to those of the n-channel HFET device. For the p-channel HFET device, the QW channel conductance is turned on by biasing the gate terminal electrode 57 and the source terminal electrode 59 at a voltages where the P/N junction of the source and gate regions is forward-biased with minimal gate conduction and an inversion layer of hole gas is created in the QW channel of the p-type modulation doped quantum well structure 20 between the source terminal electrode 59 and the drain terminal electrode 61. In this configuration, the source terminal electrode 59 is the terminal from which the hole carriers enter the QW channel of the p-type modulation doped quantum well structure 20, the drain terminal electrode 61 is the terminal where the hole carriers leave the device, and the gate terminal electrode 57 is the control terminal for the device.

Figure 3:
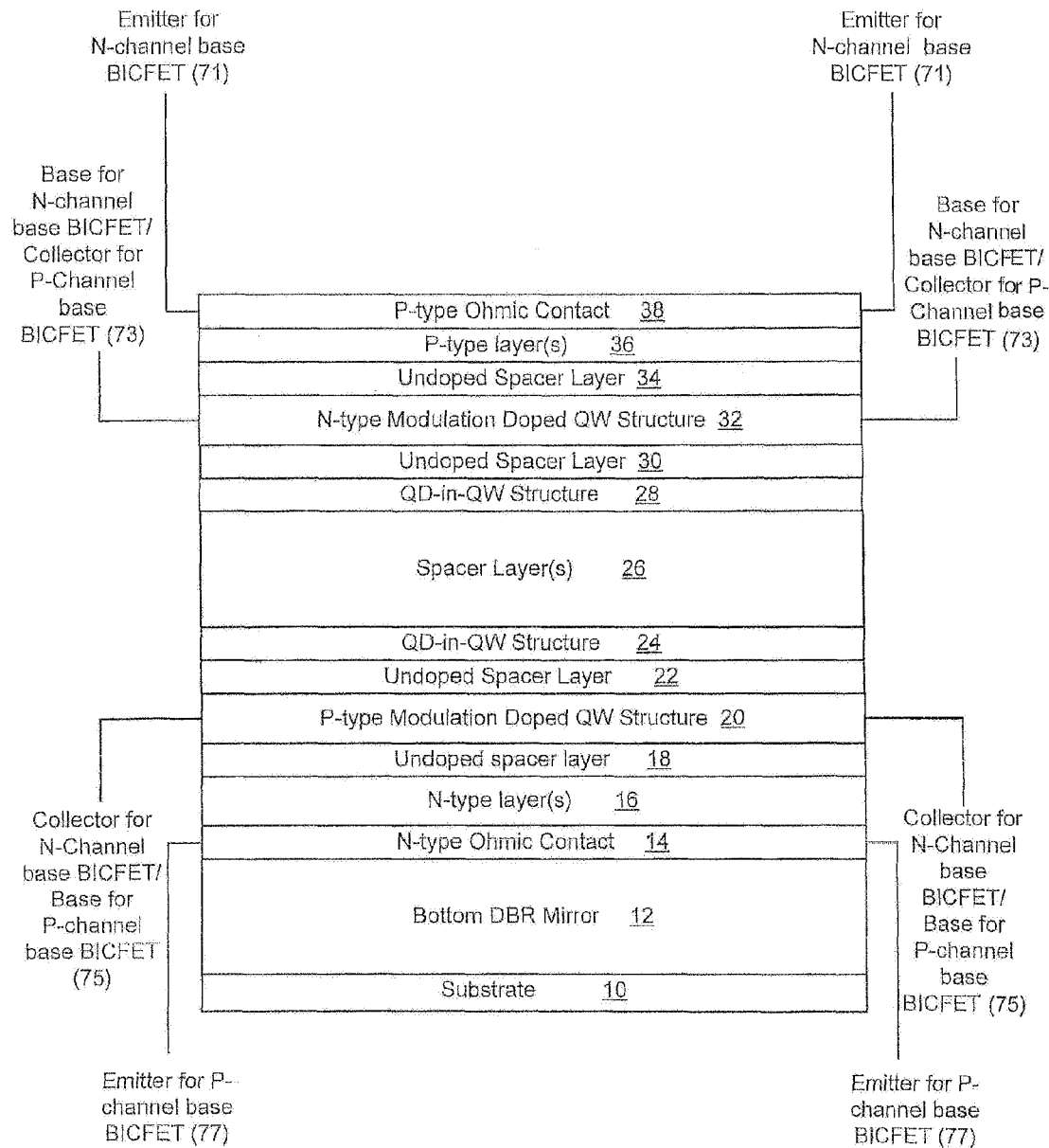
FIG. 3 is a schematic illustration of the exemplary optoelectronic integrated circuit device structure of the present application with an n-channel base BICFET device or a p-channel base BICFET device included therein.

The device structure of the present application can also be configured to realize bipolar inversion channel field-effect transistors (BICFET) with either an n-type modulation doped quantum well inversion channel base region (n-channel base BICFET) or a p-type modulation doped quantum well inversion channel base region (p-channel base BICFET) as shown in FIG. 3.

For the n-channel base BICFET device, an emitter terminal electrode 71 of the n-channel base BICFET device is operably coupled to the top p-type ohmic contact layer(s) 38 of the active device structure. A base terminal electrode 73 of the n-channel base BICFET device is operably coupled to the QW channel(s) realized in the n-type modulation doped QW structure 32. A collector terminal electrode 75 of the n-channel base BICFET device is operably coupled to the p-type modulation doped QW structure 20. The n-channel base BICFET device is a bipolar junction type transistor which can be operated in an active mode by applying a forward bias to the PN junction of the emitter and base regions while applying a reverse bias to the PN junction of the base and collector regions, which causes holes to be injected from the emitter terminal electrode 71 to the collector terminal electrode 75. Because the holes are positive carriers, their injection contributes to current flowing out of the collector terminal electrode 75 as well as current flowing into the emitter terminal electrode 71. The bias conditions also cause electrons to be injected from the base to the emitter, which contributes to current flowing out of the base terminal electrode 73 as well as the current flowing into the emitter terminal electrode 71.

For the p-channel base BICFET device, an emitter terminal electrode 77 of the p-channel base BICFET device is operably coupled to the bottom n-type ohmic contact layer(s) 14 of the active device structure. A base terminal electrode 75 of the p-channel base BICFET device is operably coupled to the QW channel(s) realized in the p-type modulation doped QW structure 20. A collector terminal electrode 73 of the p-channel base BICFET device is operably coupled to the n-type modulation doped QW structure 32. The p-channel base BICFET device is a bipolar junction type transistor which can be operated in an active mode by applying a forward bias to the PN junction of the emitter and base regions while applying a reverse bias to the PN junction of the base and collector regions, which causes electrons to be injected from the emitter terminal electrode 77 to the collector terminal electrode 73. Because the electrons are negative carriers, their injection contributes to current flowing into the collector terminal electrode 73 as well as current flowing out of the emitter terminal electrode 77. The bias conditions also cause holes to be injected from the base to the emitter, which contributes to current flowing into the base terminal electrode 75 as well as the current flowing out of the emitter terminal electrode 77.

Figure 4:
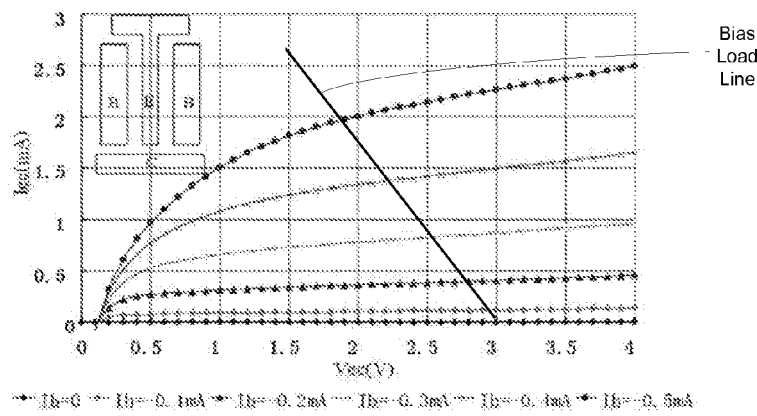
FIG. 4 is an exemplary current-voltage characteristic curve for an n-channel base BICFET device realized from the optoelectronic integrated circuit device structure of FIG. 3.

FIG. 4 shows the current-voltage characteristics of an exemplary n-channel base BICFET device. The n-channel base BICFET device can configured to operate as a bipolar junction transistor in its active mode by biasing the device, for example, as shown in the load bias line of FIG. 4 where a forward bias is applied to the PN junction of the emitter and base regions while a reverse bias is applied to the PN junction of the base and collector. In this active mode configuration, the collector current $I_C$ flowing out of the collector can be related to the base current $I_B$ flowing out of the base by a simple ideal equation $I_C=\beta_f*I_B$ where the parameter $\beta_f$ is the forward DC current gain of the transistor. The simple ideal equation can be adjusted to account for the non-zero slope of voltage-current characteristics for the constant current region of operation utilizing an early voltage parameter (such as $V_A$ or $r_0$) as is well known. The p-channel base BICFET operates in a similar manner to the n-channel HFET device with the current directions and voltage polarities reversed with respect to those of the n-channel base BICFET device.

Figure 5:
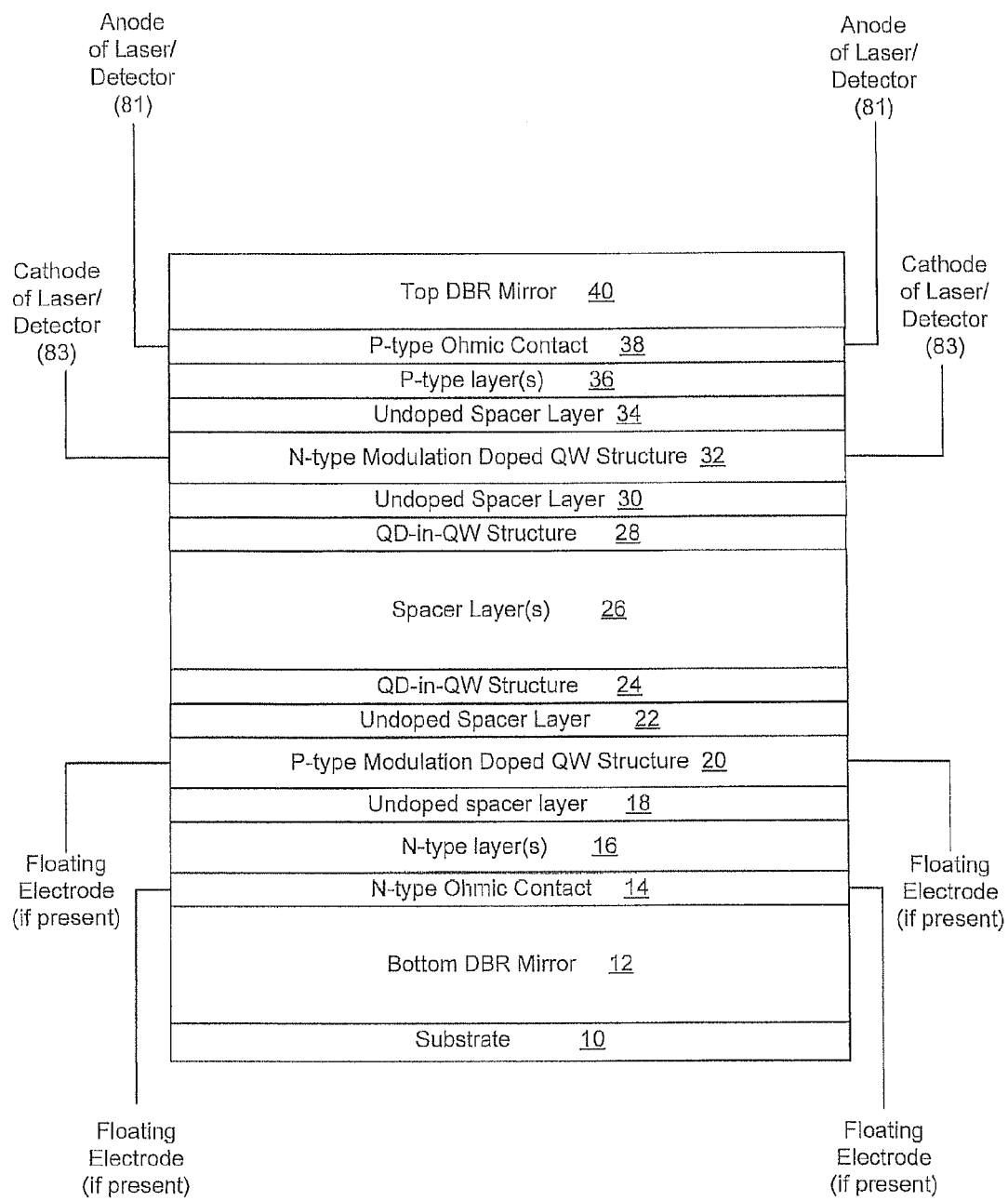
FIG. 5 is a schematic illustration of the exemplary optoelectronic integrated circuit device structure of the present application with a quantum well laser or detector device included therein.

The device structure of the present application can also be configured to realize optoelectronic devices such as an electrically-pumped laser or optical detector as shown in FIG. 5. To form a resonant cavity device for optical signal emission and/or detection, a top DBR mirror 40 can be formed over the active device structure described above. The top DBR mirror can be formed by depositing pairs of semiconductor or dielectric materials with different refractive indices. The distance between the top DBR mirror 40 and bottom DBR mirror 12 represents the length of the optical cavity and can be set to correspond to the designated wavelength (such as 1 to 3 times the designated wavelength). This distance can take into account the penetration depth of the light into the bottom and top DBR mirror. This distance is controlled by adjusting the thickness of one or more of the layers therebetween to enable this condition. For configurations where light is input into and/or emitted from the device laterally (i.e., from a direction normal to the cross section of FIG. 5), a diffraction grating can be formed in the top DBR mirror 40 over the active device structure described above. When the device is operating in the lasing mode, the diffraction grating performs the function of diffracting light produced by the vertical cavity into light propagating laterally in a waveguide which has the top DBR mirror 40 and bottom DBR mirror 12 as waveguide cladding layers and which has lateral confinement regions (typically formed by implants as described herein in more detail). When the device is operating in the optical detection mode, the diffraction grating performs the function of diffracting incident light that is propagating in the lateral direction into the vertical cavity mode, where it is absorbed resonantly in the vertical cavity. Alternatively, light may enter and exit the resonant vertical cavity through an optical aperture (not shown) in the top surface of the device. In this case, the diffraction grating is omitted, the top DBR mirror 40 defines a cavity for the vertical emission and absorption of light, and the device operates as a vertical cavity surface emitting laser/detector.

For the laser or detector of FIG. 5, an anode terminal electrode 81 of the quantum well laser or detector can be operably coupled to the top p-type ohmic contact layer(s) 38. A cathode terminal electrode 83 of the quantum well laser or detector can be operably coupled to the n-type modulation doped QW structure 32. One or more optional electrodes can be operably coupled to the p-type modulation doped QW structure 20 as well as to the bottom n-type ohmic contact layer(s) 14. If present, these optional electrodes are configured to float electrically with respect to the electrical signals of the anode terminal electrode 81 as well as of the cathode terminal electrode 83. In this manner, the p-type region of the p-type modulation doped QW structure 20 floats with respect to the electrical signals of the anode terminal electrode 81 as well as of the cathode terminal electrode 83.

Figure 6:
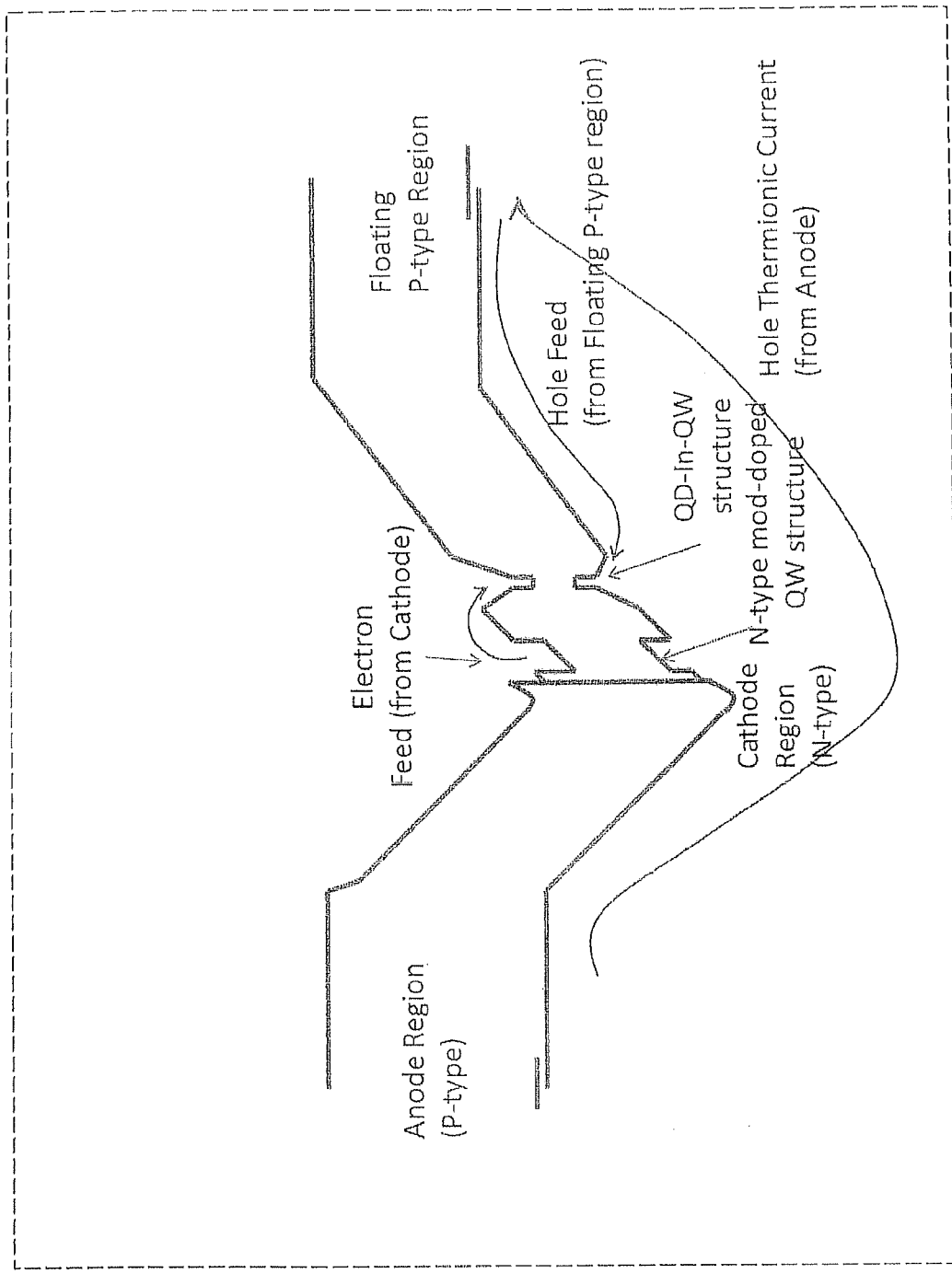
FIG. 6 is an exemplary energy band diagram showing the currents generated during lasing operation of a quantum well laser realized from the optoelectronic integrated circuit device structure of FIG. 5.

The device of FIG. 5 can be configured to operate as an electrically-pumped laser emitter by forward biasing the anode terminal electrode 81 relative to the cathode terminal electrode 83 such that holes are injected from the anode terminal electrode 81 into the QW channel(s) realized in the n-type modulation doped QW structure 32. The lower p-type region of the active device structure (which includes the p-type modulation doped QW structure 20) floats with respect to the electrical signals of the anode terminal electrode 81 as well as of the cathode terminal electrode 83. As shown in the energy band diagram of FIG. 6, hole thermionic current flows into this p-type region and the positive hole carriers build up there and cause this p-type region to become self-biased, i.e. it moves downwards in FIG. 6. This has the effect of reducing the energy difference between the QD-in-QW structure 28 and this p-type region, which enables hole carriers to diffuse toward the QD-in-QW structure 28 and populate the QDs embedded in the QD-in-QW structure 28. At the same time, the self-biasing of the p-type region also reduces the barrier for electrons in the QW channel of the n-type modulation doped QW structure 32 to flow toward the QD-in-QW structure 28 by thermal excitation in the conduction band and populate the QDs embedded in the QD-in-QW structure 28. The simultaneous injection of holes and electrons into the QDs embedded in the QD-in-QW structure 28 allows for laser emission arising from spontaneous emission and stimulated emission of photons in the QDs embedded in the QD-in-QW structure 28. The confinement of carriers afforded by the QDs of the QD-in-QW structure 28 enhances the interaction between the carriers and radiation that results in the laser emission.

Figure 7:
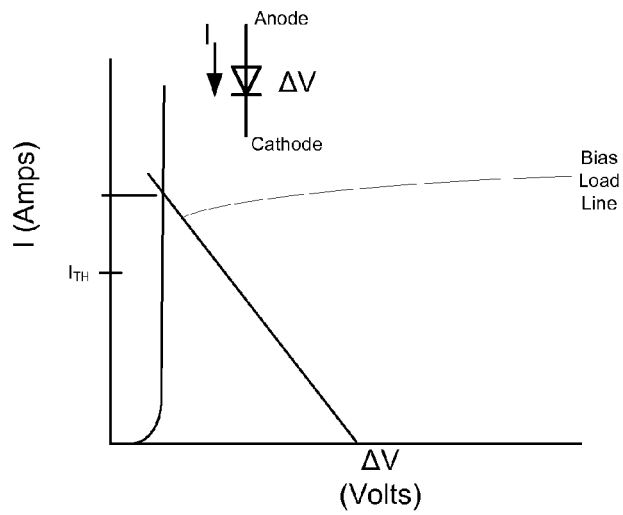
FIG. 7 is an exemplary current-voltage characteristic curve for a quantum well laser realized from the optoelectronic integrated circuit device structure of FIG. 5.

FIG. 7 shows the current-voltage characteristics of an exemplary quantum well laser device. The quantum well laser can configured to emit light by biasing the device, for example, as shown in the load bias line of FIG. 7 where the anode terminal electrode 81 is forward biased with respect to the cathode terminal electrode 83 in order to produce a current I through the device that is larger than the threshold lasing current $I_{TH}$ as shown. The quantum well laser can configured into an off state that does not emit light by biasing the device such that current I through the device that is less than the threshold lasing current $I_{TH}$ (for example, in the cutoff region where the current I is at or near 0).

The device of FIG. 5 can be configured to operate as an optical detector by reverse biasing the anode terminal electrode 81 relative to the cathode terminal electrode 83. The lower p-type region of the active device structure (which includes the p-type modulation doped QW structure 20) floats with respect to the electrical signals of the anode terminal electrode 81 as well as of the cathode terminal electrode 83. The reverse bias conditions are selected such that the device produces photocurrent proportional to the intensity of an optical input signal absorbed by the QDs embedded in the QD-in-QW structure 28. The photocurrent is derived from optical absorption in the QDs whereby photons collide with a valence electron and elevate the electron into the conduction band. This interaction creates an electron in the conduction band and a hole in the valence band—an electron-hole pair. The electron-hole pair contributes to the photocurrent generated by the device in response to the optical input signal. The confinement of carriers afforded by the QDs of the QD-in-QW structure 28 enhances the interaction between the carriers and the incident photons.

Figure 8:
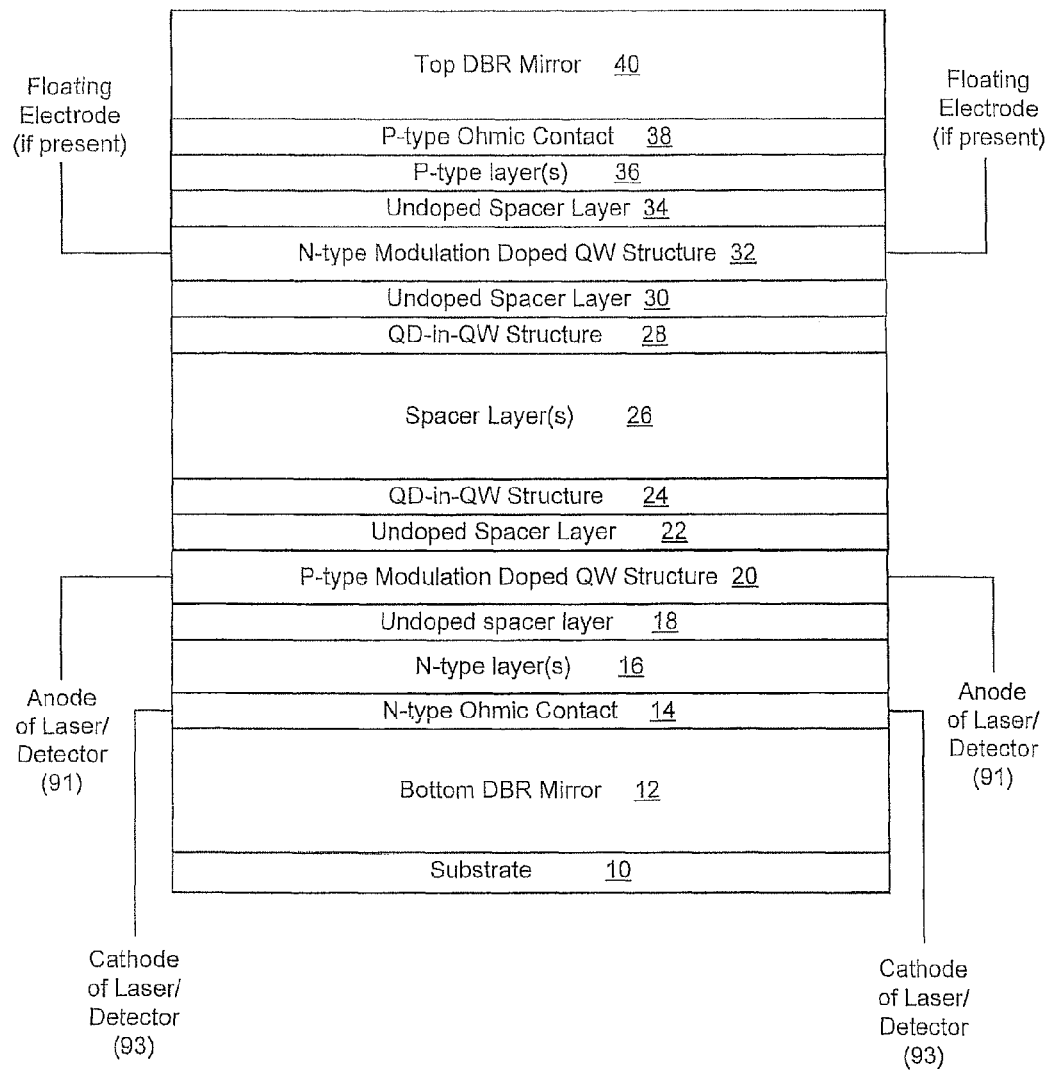
FIG. 8 is a schematic illustration of the exemplary optoelectronic integrated circuit device structure of the present application with a different quantum well laser or detector device included therein.

The device structure of the present application can also be configured to realize an electrically-pumped laser or optical detector as shown in FIG. 8. To form a resonant cavity device for optical signal emission and/or detection, a top DBR mirror 40 is formed over the active device structure as described above. For configurations where light is input into and/or emitted from the device laterally (i.e., from a direction normal to the cross section of FIG. 8), diffraction grating can be formed in the top DBR mirror 40 over the active device structure as described above. Alternatively, light may enter and exit the resonant vertical cavity through an optical aperture (not shown) in the top surface of the device. In this case, the diffraction grating is omitted, the top DBR mirror 40 defines a cavity for the vertical emission and absorption of light, and the device operates as a vertical cavity surface emitting laser/detector.

For the electrically-pumped laser or detector of FIG. 8, an anode terminal electrode 91 of the laser or detector is operably coupled to the p-type modulation doped QW structure 20. A cathode terminal electrode 93 of the laser or detector is operably coupled to the bottom n-type ohmic contact layer(s) 14. One or more optional electrodes can be operably coupled to the n-type modulation doped QW structure 32 as well as to the top p-type ohmic contact layer(s) 38. If present, these optional electrodes are configured to float electrically with respect to the electrical signals of the anode terminal electrode 91 as well as of the cathode terminal electrode 93. In this manner, the n-type region of the n-type modulation doped QW structure 32 floats with respect to the electrical signals of the anode terminal electrode 91 as well as of the cathode terminal electrode 93.

The device of FIG. 8 can be configured to operate as an electrically-pumped laser by forward biasing the anode terminal electrode 91 relative to the cathode terminal electrode 93 such that holes are injected from the anode terminal electrode 91 into the QW channel(s) realized in the p-type modulation doped QW structure 20. The n-type region of the n-type modulation doped QW structure 32 floats with respect to the electrical signals of the anode terminal electrode 81 as well as of the cathode terminal electrode 83. Similar to the operation of the optical devices of FIG. 5 with the carriers reversed, electron thermionic current flows into this n-type region and the negative electron carriers build up there and cause this n-type region to become self-biased. This has the effect of reducing the energy difference between the QD-in-QW structure 24 and this n-type region, which enables electron carriers to diffuse toward the QD-in-QW structure 24 and populate the QDs embedded in the QD-in-QW structure 24. At the same time, the self-biasing of the n-type region also reduces the barrier for holes in the QW channel of the p-type modulation doped QW structure 20 to flow toward the QD-in-QW structure 24 by thermal excitation in the valence band and populate the QDs embedded in the QD-in-QW structure 24. The simultaneous injection of holes and electrons into the QDs embedded in the QD-in-QW structure 24 allows for laser emission arising from spontaneous emission and stimulated emission of photons in the QDs embedded in the QD-in-QW structure 24. The confinement of carriers afforded by the QDs of the QD-in-QW structure 24 enhances the interaction between the carriers and radiation that results in the laser emission. The current-voltage characteristics of the quantum well laser device can be similar to that shown in FIG. 7.

The device of FIG. 8 can also be configured to operate as an optical detector by reverse biasing the anode terminal electrode 91 relative to the cathode terminal electrode 93. The n-type region of the modulation doped QW structure 32 floats with respect to the electrical signals of the anode terminal electrode 91 as well as of the cathode terminal electrode 93. The reverse bias conditions are selected such that the device produces photocurrent proportional to the intensity of an optical input signal absorbed by the QDs embedded in the QD-in-QW structure 24. The photocurrent is derived from optical absorption in the QDs whereby photons collide with a valence electron and elevate the electron into the conduction band. This interaction creates an electron in the conduction band and a hole in the valence band—an electron-hole pair. The electron-hole pair contributes to the photocurrent generated by the device in response to the optical input signal. The confinement of carriers afforded by the QDs of the QD-in-QW structure 24 enhances the interaction between the carriers and the incident photons.

Figure 9:
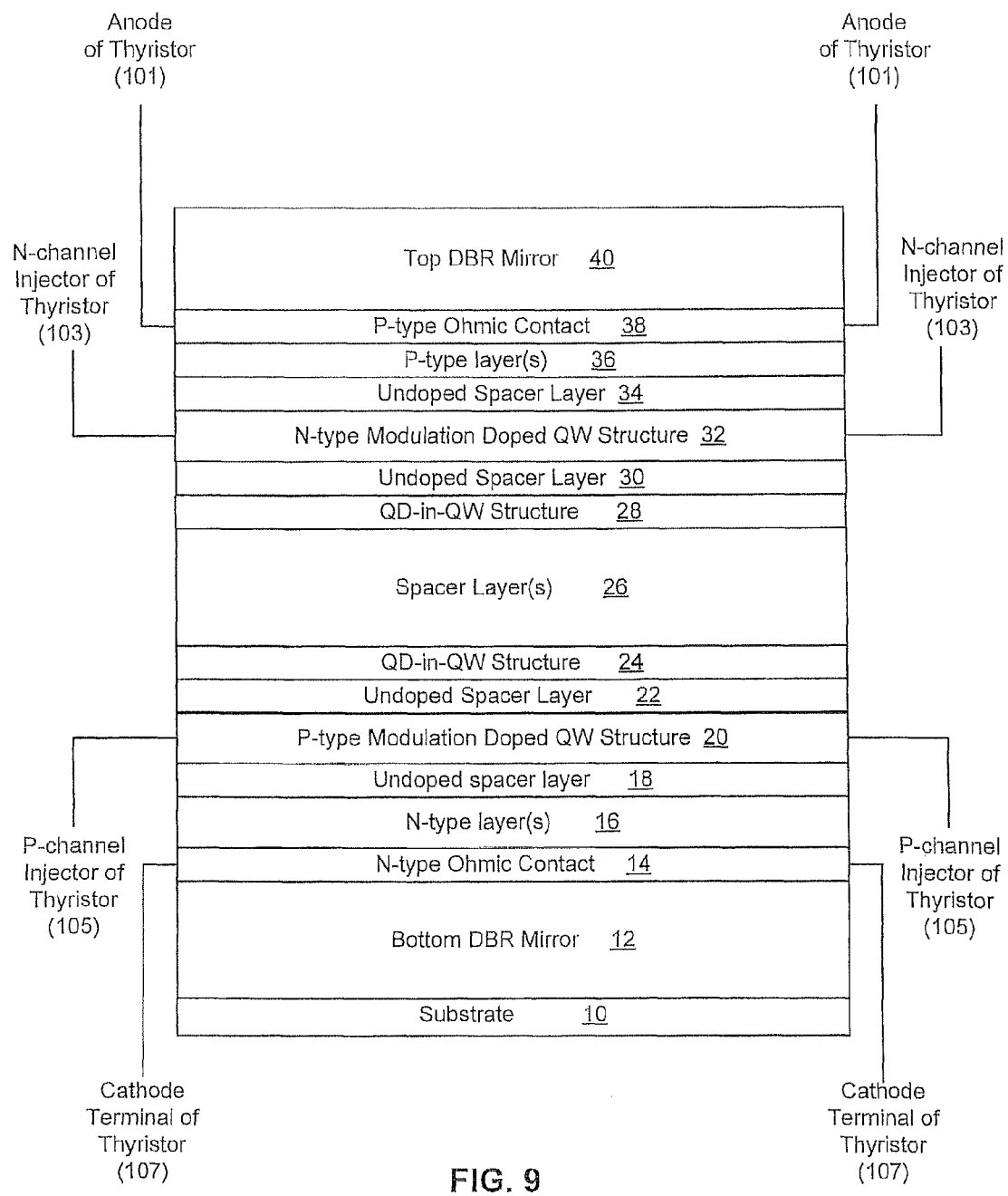
FIG. 9 is a schematic illustration of the exemplary optoelectronic integrated circuit device structure of the present application with a quantum well thyristor device included therein.

The device structure of the present application can also be configured to realize an electrically-pumped thyristor laser or optical detector as shown in FIG. 9. To form a resonant cavity device for optical signal emission and/or detection, a top DBR mirror 40 is formed over the active device structure as described above. For configurations where light is input into and/or emitted from the device laterally (i.e., from a direction normal to the cross section of FIG. 9), a diffraction grating can be formed in the top DBR mirror 40 over the active device structure as described above. Alternatively, light may enter and exit the resonant vertical cavity through an optical aperture (not shown) in the top surface of the device. In this case, the diffraction grating is omitted, the top DBR mirror 40 defines a cavity for the vertical emission and absorption of light, and the device operates as a vertical cavity surface emitting laser/detector.

For the thyristor laser or detector device of FIG. 9, an anode terminal electrode (two parts shown as 101) is operably coupled to the top p-type contact layer 38. A bottom cathode terminal electrode (two parts shown as 107) is operably coupled to the bottom n-type contact layer 14. An n-channel injector terminal (two parts shown as 103) is operably coupled to the n-type modulation doped QW structure 32. A p-channel injector terminal (two parts shown as 105) is operably coupled to the p-type modulation doped QW structure 20.

For the electrically-pumped thyristor laser, the device switches from a non-conducting/OFF state (where the current I through the device is substantially zero) to a conducting/ON state (where current I is substantially greater than zero) when i) the anode terminal electrode 101 is forward biased with respect to the cathode terminal electrode 107 and ii) the voltage between n-channel injector 103 and the anode electrode 101 is biased such that charge is produced in the n-type modulation doped QW structure 32 that is greater than the critical switching charge $Q_{CR}$, which is that charge that reduces the forward breakdown voltage such that no off state bias point exists. The voltage between p-channel injector electrode 105 and cathode electrode 107 can also be configured to produce a charge in the p-type modulation doped QW structure 20 that is greater than the critical switching charge $Q_{CR}$. The critical switching charge $Q_{CR}$ is unique to the geometries and doping levels of the device. The device switches from the conducting/ON state (where the current I is substantially greater than zero) to a non-conducting/OFF state (where current I is substantially zero) when the current I through device falls below the hold current of the device for a sufficient period of time such that the charge in the n-type modulation doped QW structure 32 (or the charge in the p-type modulation doped QW structure 20) decreases below the holding charge $Q_H$, which is the critical value of the channel charge which will sustain holding action. Thus, if the anode terminal 101 is forward biased with respect to the cathode terminal 107 and the n-channel injector 103 (and/or the p-channel injector terminal 105) is biased to produce the critical switching charge $Q_{CR}$ in the n-type modulation doped QW structure 32 (or the p-type modulation doped QW structure 20), then the thyristor device will switch to its conducting/ON state. If the current I in the conducting/ON state is above the threshold for lasing $I_{TH}$, then laser emission will occur. In this configuration, the current I involves the simultaneous injection of holes and electrons into the QDs embedded in the QD-in-QW structures 24 and 28 to allow for laser emission arising from spontaneous emission and stimulated emission of photons in the QDs embedded in the QD-in-QW structures 24 and 28. The confinement of carriers afforded by the QDs of the QD-in-QW structures 24 and 28 enhances the interaction between the carriers and radiation that results in the laser emission.

Figure 10:
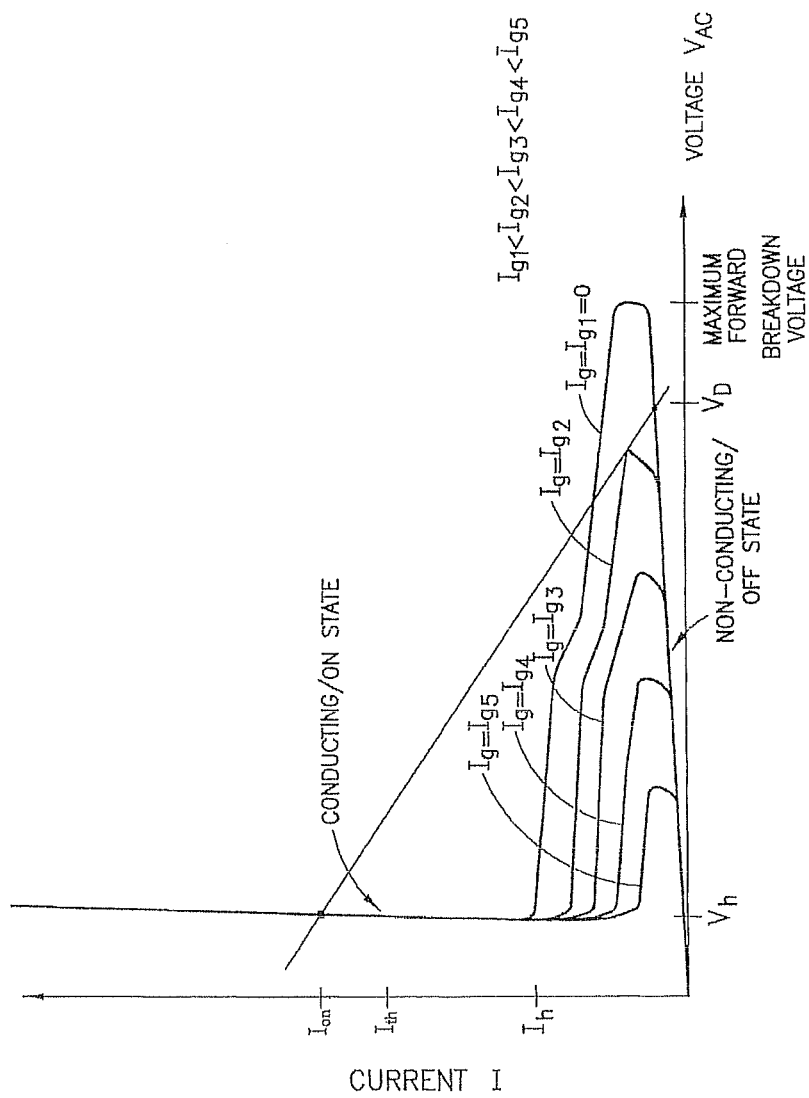
FIG. 10 is an exemplary current-voltage characteristic curve for a quantum well thyristor realized from the optoelectronic integrated circuit device structure of FIG. 9.

FIG. 10 shows the current-voltage characteristics of an exemplary thyristor laser device under a variety of injector bias conditions where an injector current $I_g$ supplies charge (electrons) to the n-type modulation-doped QW structure of the device. The thyristor laser device can configured to emit light by biasing the device, for example, as shown in the load bias line of FIG. 10 where the anode terminal electrode 101 is forward biased with respect to the cathode electrode 107 in order to produce a current I through the device that is larger than the threshold lasing current $I_{TH}$ as shown. The thyristor laser device can configured into an off state that does not emit light by biasing the device such that current I through the device that is less than the threshold lasing current $I_{TH}$ (for example, in the cutoff region where the current I is at or near 0).

For the thyristor detector, the device switches from a non-conducting/OFF state (where the current I through the device is substantially zero) to a conducting/ON state (where current I is substantially greater than zero) in response to an input optical pulse that produces charge in the n-type modulation doped QW structure 32 and/or the p-type modulation doped QW structure 20 resulting from photon absorption of the input optical pulse. Specifically, the anode terminal electrode 101 is forward biased with respect to the cathode terminal electrode 107 and the voltage between n-channel injector 103 and the anode electrode 101 (and/or the voltage between the p-channel injector 105 and the cathode terminal electrode 107) is biased such that that charged produced in the n-type modulation doped QW structure 32 (and/or the p-type modulation doped QW structure 20) resulting from photon absorption of the input optical pulse is greater than the critical switching charge $Q_{CR}$. When the input optical pulse is removed, the device switches from the conducting/ON state (where the current I is substantially greater than zero) to a non-conducting/OFF state (where current I is substantially zero) when the charge in the n-type modulation doped QW structure 32 (and/or the p-type modulation doped QW structure 20) decreases below the holding charge $Q_H$. The confinement of carriers afforded by the QDs of the QD-in-QW structures 24 and 28 enhances the interaction between the carriers and the incident photons.

The self-assembled quantum dots (QDs) embedded within the QD-in-QW structures 24 and 28 improves the efficiency of the optoelectronic devices described herein. Specifically, the population inversion necessary for laser action and amplification and the photon absorption mechanism for necessary for optical detection occurs more efficiently with the introduction of the quantum dots and thus decreases the necessary current required for lasing action and amplification increases the photocurrent produced by absorption. Furthermore, the size of the embedded QDs can be controlled to dictate the wavelength of the desired optical function (emission for lasing, amplification, absorption for detection). For example, the size of the QDs in either or both QD-in-QW structures 22, 26 can be controlled to dictate the wavelength in range from 1300 nm up to 1550 nm for use in the O to L (1260-1625 nm) bands employed in commercial optical telecommunication networks. Furthermore, the density distribution of the embedded QDs can be controlled to dictate the laser output power. High density of embedded QDs can provide for an increase of laser output power, but require a greater threshold lasing current.

Figure 11A:
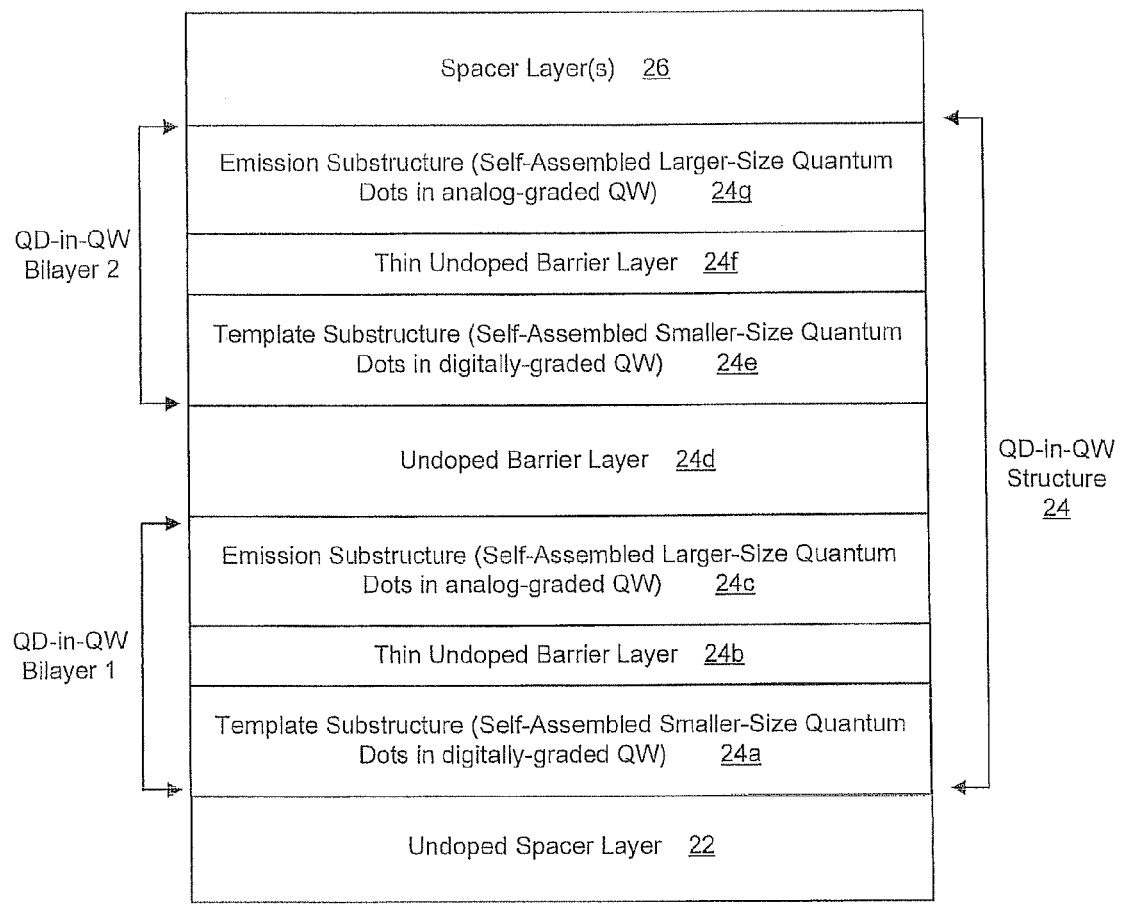
FIGS. 11A and 11B are schematic illustrations of exemplary layer structures for the QD-in-QW structures (24, 28) of the optoelectronic integrated circuit device structures of FIGS. 1 to 10.

In one embodiment, the QD-in-QW structure 24 is realized by first and second bilayer structures with an undoped barrier layer therebetween. Both the first and second bilayer structures include a template substructure offset from an emission substructure by a thin undoped barrier layer as shown in FIG. 11A. More specifically, the QD-in-QW structure 24 includes the first bilayer structure including a template substructure 24a, a thin undoped barrier layer 24b, and an emission substructure 24c. An undoped barrier layer 24d is deposited on the emission substructure 24c. The second bilayer structure is formed on the barrier layer 24d and includes a template substructure 24e, a thin undoped barrier layer 24f, and an emission substructure 24g as shown in FIG. 11A.

The template substructure 24a is formed on the undoped spacer layer 22 that lies above the p-type modulation doped QW structure 20. The spacer layer 22 acts as a barrier between the QDs embedded in the template substructure 24a and the QW(s) of the underlying p-type modulation doped QW structure 20. The spacer layer 22 is realized from a material with a higher bandgap energy than the QW material of the template substructure 24a (such as a GaAs spacer layer to support an InGaAs QW material of the template structure 24a). Similarly, the template substructure 24e is formed on the undoped barrier layer 24d. The template substructures 24a and 24e each include a digitally-graded QW with self-assembled QDs embedded therein. The self-assembled QDs can be formed during molecular beam epitaxy growth by a self-assembly method known as the Stranski-Krastanov process. In this process, an initial layer (such as InGaAs) that is part a digitally-graded quantum well (such as a digitally graded InGaAs QW) is deposited. A compound semiconductor that is lattice mismatched relative to the initial layer and underlying layer is deposited on the initial layer (such as lattice mismatched InAs grown in an InGaAs QW initial layer above GaAs). In particular, the lattice mismatch of the compound semiconductor is such that the growth forms three dimensional islands after a deposition of a critical thickness of the compound semiconductor. The growth is continued to allow the three dimensional islands to expand to form the self-assembled QDs that have the desired characteristic dimensional range. After the self-assembled QDs are formed on the initial layer, the deposition of the digitally-graded QW material resumes such that the self-assembled QDs are covered and fully embedded within the digitally-graded QW material.

The thin undoped barrier layer 24b is deposited on the template substructure 24a. Similarly, the thin undoped barrier layer 24f is deposited on the template substructure 24e. The undoped barrier layers 24b and 24f are each realized from a material with a higher bandgap energy than the QW material of both the template substructure and the emission substructure (such as a GaAs barrier layer to support an InGaAs QW material of the template substructure and the emission substructure).

The emission substructure 24c is formed on the barrier layer 24b. Similarly, the emission substructure 24g is formed on the barrier layer 24f. The emission substructures 24c and 24g each include an analog-graded QW with self-assembled QDs embedded therein. The self-assembled QDs can be formed during molecular beam epitaxy growth by a self-assembly method known as the Stranski-Krastanov process similar to the growth conditions of the template substructure. In this process, an initial layer (such as InGaAs) that is part an analog-graded quantum well (such as an analog-graded InGaAs QW) is deposited. A compound semiconductor that is lattice mismatched relative to the initial layer and underlying layer is deposited on the initial layer (such as lattice mismatched InAs grown in an InGaAs QW initial layer above GaAs). In particular, the lattice mismatch of the compound semiconductor is such that the growth forms three dimensional islands after a deposition of a critical thickness of the compound semiconductor. The three dimensional islands of the emission substructure are formed such that they are aligned with the self-assembled QDs of the underlying template structure. The growth is continued to allow the three dimensional islands to expand to form the self-assembled QDs that have the desired characteristic dimensional range. After the self-assembled QDs are formed on the initial layer, the deposition of the analog-graded QW material resumes such that the self-assembled QDs are covered and fully embedded within the analog-graded QW of the respective emission structure.

The undoped barrier layer 24d is formed between the emission substructure 24c and the template substructure 24e of the respective bilayer structures. The barrier layer 24d is realized from a material with a higher bandgap energy than the QW material of both the template substructure 24e and the emission substructure 24c (such as a GaAs barrier layer to support an InGaAs QW material of the template substructure 24e and the emission substructure 24c).

The spacer layer(s) 26 is formed on the emission substructure 24g as shown.

Figure 11B:
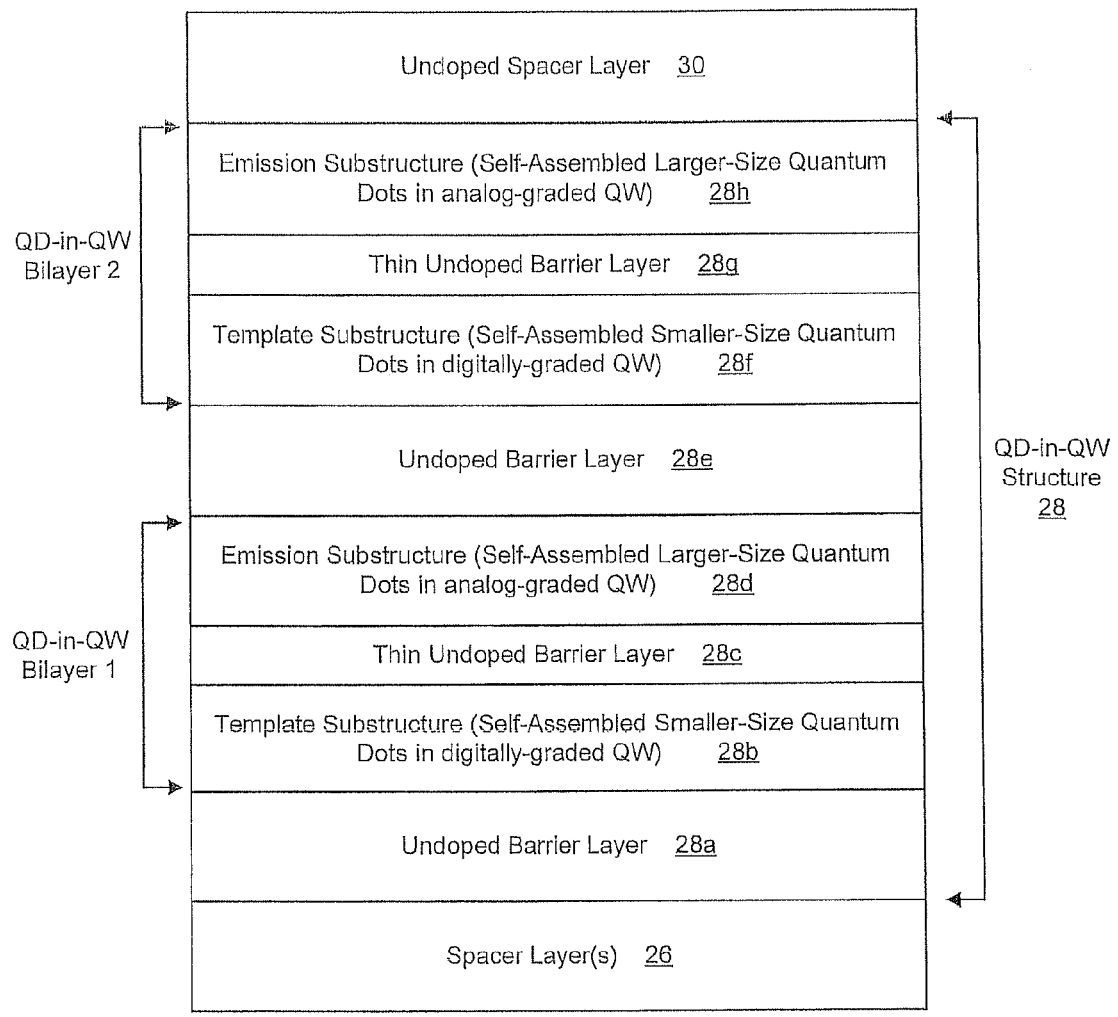

The QD-in-QW structure 28 can also be realized by bilayer structures that include first and second bilayer structures as shown in FIG. 11B. Both the first and second bilayer structures include a template substructure offset from an emission substructure by a thin undoped barrier layer as shown in FIG. 11B. More specifically, the QD-in-QW structure 28 includes an undoped spacer layer 28a followed by the first bilayer structure including a template substructure 28b, a thin undoped barrier layer 28c, and an emission substructure 28d. An undoped barrier layer 28e is deposited on the emission substructure 28d. The second bilayer structure is formed on the barrier layer 28e and includes a template substructure 28f, a thin undoped barrier layer 28g, and an emission substructure 28h as shown in FIG. 11B.

The template substructure 28b is formed on the undoped barrier layer 28a that lies above the spacer layer(s) 26. The barrier layer 28a is realized from a material with a higher bandgap energy than the QW material of the template substructure 28b (such as a GaAs spacer layer to support an InGaAs QW material of the template substructure 28b). Similarly, the template substructure 28f is formed on the undoped barrier layer 28e. The template substructures 28b and 28f each include a digitally-graded QW with self-assembled QDs embedded therein. The self-assembled QDs can be formed during molecular beam epitaxy growth by a self-assembly method known as the Stranski-Krastanov process. In this process, an initial layer (such as InGaAs) that is part a digitally-graded quantum well (such as a digitally graded InGaAs QW) is deposited. A compound semiconductor that is lattice mismatched relative to the initial layer and underlying layer is deposited on the initial layer (such as lattice mismatched InAs grown in an InGaAs QW initial layer above GaAs). In particular, the lattice mismatch of the compound semiconductor is such that the growth forms three dimensional islands after a deposition of a critical thickness of the compound semiconductor. The growth is continued to allow the three dimensional islands to expand to form the self-assembled QDs that have the desired characteristic dimensional range. After the self-assembled QDs are formed on the initial layer, the deposition of the digitally-graded QW material resumes such that the self-assembled QDs are covered and fully embedded within the digitally-graded QW material.

The thin undoped barrier layer 28c is deposited on the template substructure 28b. Similarly, the thin undoped barrier layer 28g is deposited on the template substructure 28f. The undoped barrier layers 28c and 28g are each realized from a material with a higher bandgap energy than the QW material of both the underlying template substructure and the overlying emission substructure (such as a GaAs barrier layer to support an InGaAs QW material of the underlying template substructure and the overlying emission substructure).

The emission substructure 28d is formed on the barrier layer 28c. Similarly, the emission substructure 28h is formed on the barrier layer 28g. The emission substructures 28d and 28c each include an analog-graded QW with self-assembled QDs embedded therein. The self-assembled QDs can be formed during molecular beam epitaxy growth by a self-assembly method known as the Stranski-Krastanov process similar to the growth conditions of the template substructure. In this process, an initial layer (such as InGaAs) that is part an analog-graded quantum well (such as an analog-graded InGaAs QW) is deposited. A compound semiconductor that is lattice mismatched relative to the initial layer and underlying layer is deposited on the initial layer (such as lattice mismatched InAs grown in an InGaAs QW initial layer above GaAs). In particular, the lattice mismatch of the compound semiconductor is such that the growth forms three dimensional islands after a deposition of a critical thickness of the compound semiconductor. The three dimensional islands of the emission substructure are formed such that they are aligned with the self-assembled QDs of the underlying template substructure. The growth is continued to allow the three dimensional islands to expand to form the self-assembled QDs that have their desired characteristic dimensional range. After the self-assembled QDs are formed on the initial layer, the deposition of the analog-graded QW material resumes such that the self-assembled QDs are covered and fully embedded within the analog-graded QW of the respective emission substructure.

The undoped spacer layer(s) 30 is formed on the emission substructure 28h as shown. The undoped spacer layer 20 acts as a barrier between the QDs embedded in the emission substructure 28h and the QW(s) of the overlying n-type modulation doped QW structure 32.

The size of the QDs of the template and emission substructures of the QD-in-QW structures 24 and 28 dictates the wavelength of the electromagnetic radiation emitted or absorbed for the desired optical function (laser emission, amplification, optical detection). For example, the size of the QDs in the QD-in-QW structures 24 and 28 can be controlled to dictate the emission/absorption wavelength in range from 1300 nm up to 1550 nm for use in the O to L (1260-1625 nm) bands employed in commercial optical telecommunication networks. Furthermore, the characteristic emission/absorption wavelengths can be different for the QD-in-QW structures 24 and 28. For example, the size of the QDs in QD-in-QW structure 24 can be controlled to dictate the emission/absorption wavelength in range near 1310 nm, and the size of the QDs in the QD-in-QW structure 28 can be controlled to dictate the emission/absorption wavelength in range near 1550 nm.

Furthermore, the density distribution of the QDs of the template and emission substructures dictates the laser output power. A high density of embedded QDs can provide for an increase of laser output power, but require a greater threshold lasing current. The density distribution of the QDs of the template substructures dictates the density distribution of the QDs of the adjacent emission substructure and allows the growth conditions of the emission substructure to be tuned to control the size of the QDs of the adjacent emission substructure. Furthermore, the template substructure relaxes the strain mismatch of the emission substructure that arises from the layer underlying the template substructure and thus allows for the larger sized QDs to be assembled in the adjacent emission substructure.

FIGS. 12A-C illustrates an exemplary layer structure utilizing group III-V materials for realizing the multilayer structures described herein. The layer structure of FIGS. 12A-C can be made, for example, using known molecular beam epitaxy (MBE) techniques. As shown, a semiconductor layer 1003 of AlAs and a semiconductor layer 1005 of GaAs are alternately deposited (with preferably at least seven pairs) upon a semi-insulating gallium arsenide substrate 1001 in sequence to form the bottom distributed bragg reflector (DBR) mirror. The number of AlAs layers will preferably always be one greater than the number of GaAs layers so that the first and last layers of the mirror are shown as layer 1003. In the preferred embodiment, the AlAs layers 1003 are subjected to high temperature steam oxidation during fabrication to produce the compound $Al_xO_y$ so that a mirror will be formed at the designed center wavelength. This center wavelength is selected such that all of the resonant wavelengths for the various cavities of the array will be subject to high reflectivity. Therefore the thicknesses of layers 1003 and 1005 in the mirror are chosen so that the final optical thickness of GaAs and $Al_xO_y$ are one quarter wavelength of the center wavelength $\lambda_D$. Alternatively the mirrors could be grown as alternating layers of one-quarter wavelength thickness of GaAs and AlAs at the designed wavelength so that the oxidation step is not used. In that case, many more pairs are required (with typical numbers such as 22 pairs) to achieve the reflectivity needed for efficient optical lasing and detection.

Deposited upon the last bottom mirror layer 1003 is the active device structure which begins with layer 1009 of N+ type GaAs that enables the formation of ohmic contacts thereto (for example, when contacting to the gate terminal of an inverted p-channel HFET device, the emitter terminal of the p-channel base BICFET device, the cathode terminal of the quantum well laser/detector device, and the cathode terminal of the thyristor laser or detector device). Layer 1009 has a typical thickness of 3000 Å and a typical n-type doping of $3.5 \times 10^{18}$ cm$^{-3}$. The N+ doped GaAs layer 1009 corresponds to the ohmic contact layer 14 of FIGS. 1, 3, 5, 8, 9 as described above.

Deposited on layer 1009 is layer 1011 of n-type $Al_{x1}Ga_{(1-x1)}As$ with a typical thickness of 600-1000 Å and a typical doping of $1 \times 10^{18}$ cm$^{-3}$. The parameter x1 is preferably in the range between 70% and 80% for layer 1009. This layer serves as part of the gate region of the p-channel HFET device and optically as a small part of the lower waveguide cladding of the respective optical device. Note that a majority of the lower waveguide cladding for waves propagating in the guide formed by the optically active region of the device is provided by the lower DBR mirror itself. The lower DBR mirror causes the light to be guided partially as a dielectric waveguide and partially as a mirror waveguide. Next are four layers (1013, 1014, 1015, 1016) of $Al_{x2}Ga_{(1-x2)}As$. These four layers collectively have a total thickness of about 230-430 Å and where x2 is about 15%. The first layer 1013 is about 60 Å thick and is doped N+ type in the form of delta doping with a typical n-type doping of $3.5 \times 10^{18}$ cm$^{-3}$. The second layer 1014 is about 100-300 Å thick and is undoped. The third layer 1015 is about 40 Å thick and is doped P+ type in the form of delta doping with a typical p-type doping of $7 \times 10^{18}$ cm$^{-3}$. The fourth layer 1016 is about 30 Å thick and is undoped to form a spacer layer. This layer forms the lower separate confinement heterostructure (SCH) layer for the optical devices. The n-type AlGaAs layers 1011 and 1013 correspond to the n-type layer(s) 16 of FIGS. 1, 3, 5, 8, and 9 as described above. The undoped AlGaAs layer 1014 corresponds to the spacer layer 18 of FIGS. 1, 3, 5, 8, and 9 as described above.

Next is an undoped GaAs barrier layer 1017 and an InGaAs quantum well layer 1019 repeated for a number of quantum wells (such as three or more quantum wells) for the inverted p-type modulation doped quantum structure. Single quantum well structures may also be used. The undoped GaAs barrier layer 1017 preferably is about 10 Å thick. The InGaAs quantum well layer 1019 is preferably about 60 Å thick. Layers 1015 to 1019 correspond to the inverted p-type modulation doped quantum structure 20 of FIGS. 1, 3, 5, 8, and 9 as described above.

An undoped GaAs spacer layer 1021 that is about 300-500 Å thick follows the last InGaAs quantum well layer 1019. Layer 1021 corresponds to spacer layer 22 of FIGS. 1, 3, 5, 8, and 9 as described above.

Following the spacer layer 22 are layers 1024 to 1051 that correspond to the QD-in QW structure 24 of FIG. 11A for the devices of FIGS. 1, 3, 5, 8, and 9 as described above. Layers 1023 to 1027 form the template structure 24a of FIG. 11A with QDs embedded within an InGaAs quantum well that employs digital grading of In with 15-20% In. The initial layer 1023 of the InGaAs quantum well that is deposited before the QD growth sequence (specified as 1025) is preferably about 2 Å thick. The layer 1027 of the InGaAs quantum well that is deposited after the QD growth sequence is preferably about 40-60 Å thick. An undoped GaAs barrier layer 1029 is deposited on the InGaAs quantum well layer 1027. The undoped GaAs barrier layer 1029 is preferably about 100 Å thick and corresponds to the barrier layer 24b of FIG. 11A.

Layers 1031 to 1035 form the emission structure 24c of FIG. 11A with QDs embedded within an InGaAs quantum well that employs analog grading of In. The initial layer 1031 of the InGaAs quantum well that is deposited before the QD growth sequence (specified as 1033) is preferably about 40 Å thick and has analog grading of In in the range from In(0.375)Ga(0.9625)As at the interface to barrier layer 1029 to In(0.3)Ga(0.7)As at the interface of the QD growth sequence. The layer 1035 of the InGaAs quantum well that is deposited after the QD growth sequence (specified as 1033) is preferably about 40 Å thick and has analog grading of In in the range from In(0.3)Ga(0.7)As at the interface of the QD growth sequence to In(0.375)Ga(0.9625)As at the interface to barrier layer 1037.

An undoped GaAs barrier layer 1037 is deposited on the InGaAs quantum well layer 1035. The undoped GaAs barrier layer 1037 is preferably about 300-500 Å thick and corresponds to the barrier layer 24d of FIG. 11A.

Following barrier layer 1037 is layers 1039 to 1043 that form the template structure 24e of FIG. 11A with QDs embedded within an InGaAs quantum well that employs digital grading of In with 15-20% In. The initial layer 1039 of the InGaAs quantum well that is deposited before the QD growth sequence (specified as 1041) is preferably about 2 Å thick. The layer 1043 of the InGaAs quantum well that is deposited after the QD growth sequence is preferably about 40-60 Å thick. An undoped GaAs barrier layer 1045 is deposited on the InGaAs quantum well layer 1043. The undoped GaAs barrier layer 1045 is preferably about 100 Å thick and corresponds to the barrier layer 24f of FIG. 11A.

Following barrier layer 1045 is layers 1047 to 1051 that form the emission structure 24g of FIG. 11A with QDs embedded within an InGaAs quantum well that employs analog grading of In. The initial layer 1047 of the InGaAs quantum well that is deposited before the QD growth sequence (specified as 1049) is preferably about 40 Å thick and has analog grading of In in the range from In(0.375)Ga(0.9625)As at the interface to barrier layer 1045 to In(0.3)Ga(0.7)As at the interface of the QD growth sequence. The layer 1051 of the InGaAs quantum well that is deposited after the QD growth sequence is preferably about 40 Å thick and has analog grading of In in the range from In(0.3)Ga(0.7)As at the interface of the QD growth sequence to In(0.375)Ga(0.9625) As at the interface to next layer 1053.

Next are two layers (1053, 1055) of $Al_2Ga_{(1-x2)}As$. These two layers collectively have a total thickness of about 4000 Å and where x2 is about 15%. The first layer 1053 is about 2000 Å thick and is doped P-type with a p-type doping of $5\times10^{15}$ $cm^{-3}$. The second layer 1055 is about 2000 Å thick and is doped n-type with an n-type doping of $1-2\times10^{16}$ $cm^{-3}$. Layers 1053 and 1055 correspond to the spacer layer(s) 26 of FIGS. 1, 3, 5, 8, and 9 as described above.

Following the spacer layers 1053 and 1055 are layers 1057 to 1087 that correspond to the QD-in QW structure 28 of FIG. 11B for the devices of FIGS. 1, 3, 5, 8, and 9 as described above. Layer 1057 is an undoped GaAs barrier layer that is preferably on the order of 300-500 Å thick and corresponds to the barrier layer 28a of FIG. 11B. Layers 1059 to 1063 form the template structure 28b of FIG. 11B with QDs embedded within an InGaAs quantum well that employs digital grading of In with 15-20% In. The initial layer 1059 of the InGaAs quantum well that is deposited before the QD growth sequence (specified as 1061) is preferably about 2 Å thick. The layer 1063 of the InGaAs quantum well that is deposited after the QD growth sequence is preferably about 40-60 Å thick. An undoped GaAs barrier layer 1065 is deposited on the InGaAs quantum well layer 1063. The undoped GaAs barrier layer 1065 is preferably about 100 Å thick and corresponds to the barrier layer 28c of FIG. 11B.

Layers 1067 to 1071 form the emission structure 28d of FIG. 11B with QDs embedded within an InGaAs quantum well that employs analog grading of In. The initial layer 1067 of the InGaAs quantum well that is deposited before the QD growth sequence (specified as 1069) is preferably about 40 Å thick and has analog grading of In in the range from In(0.375) Ga(0.9625)As at the interface to barrier layer 1065 to In(0.3) Ga(0.7)As at the interface of the QD growth sequence. The layer 1071 of the InGaAs quantum well that is deposited after the QD growth sequence is preferably about 40 Å thick and has analog grading of In in the range from In(0.3)Ga(0.7)As at the interface of the QD growth sequence to In(0.375)Ga (0.9625)As at the interface to barrier layer 1073.

An undoped GaAs barrier layer 1073 is deposited on the InGaAs quantum well layer 1071. The undoped GaAs barrier layer 1073 is preferably about 300-500 Å thick and corresponds to the barrier layer 28e of FIG. 11B.

Following barrier layer 1073 is layers 1075 to 1079 that form the template structure 28f of FIG. 11B with QDs embedded within an InGaAs quantum well that employs digital grading of In with 15-20% In. The initial layer 1075 of the InGaAs quantum well that is deposited before the QD growth sequence (specified as 1077) is preferably about 2 Å thick. The layer 1079 of the InGaAs quantum well that is deposited after the QD growth sequence is preferably about 40-60 Å thick. An undoped GaAs barrier layer 1081 is deposited on the InGaAs quantum well layer 1079. The undoped GaAs barrier layer 1081 is preferably about 100 Å thick and corresponds to the barrier layer 28g of FIG. 11B.

Following barrier layer 1081 is layers 1083 to 1087 that form the emission structure 28hg of FIG. 11B with QDs embedded within an InGaAs quantum well that employs analog grading of In. The initial layer 1083 of the InGaAs quantum well that is deposited before the QD growth sequence (specified as 1085) is preferably about 40 Å thick and has analog grading of In in the range from In(0.375)Ga(0.9625) As at the interface to barrier layer 1081 to In(0.3)Ga(0.7)As at the interface of the QD growth sequence. The layer 1087 of the InGaAs quantum well that is deposited after the QD growth sequence is preferably about 40 Å thick and has analog grading of In in the range from In(0.3)Ga(0.7)As at the interface of the QD growth sequence to In(0.375)Ga(0.9625) As at the interface to the next layer 1089.

An undoped GaAs barrier layer 1089 is deposited on the InGaAs quantum well layer 1087. The undoped GaAs barrier layer 1089 is preferably about 300-500 Å thick and corresponds to the spacer layer 30 of FIG. 11B.

Next is an InGaAs quantum well layer 1091 an undoped GaAs barrier layer 1093 that are repeated for a number of quantum wells (such as three or more quantum wells) for the n-type modulation doped quantum structure. Single quantum well structures may also be used. The InGaAs quantum well layer 1091 is preferably about 60 Å thick. The undoped GaAs barrier layer 1093 is preferably about 10 Å thick.

Next are four layers (1095, 1097, 1099, 1101) of $Al_{x2}Ga_{(1-x2)}As$. These four layers collectively have a total thickness of about 270-470 Å and where x2 is about 15%. The first layer 1095 is about 30 Å thick and is undoped to form a spacer layer. The second layer 1097 is about 80 Å thick and is doped N+ type with an n-type doping of $3\times10^{18}$ $cm^{-3}$. The third layer 1099 is about 100-300 Å thick and is undoped. The fourth layer 1101 is about 60 Å thick and is doped P+ type with a p-type doping of $7\times10^{18}$ $cm^{-3}$. The layers 1097 to 1091 corresponds to the n-type modulation doped quantum well structure 32 of FIGS. 1, 3, 5, 8, and 9 as described above.

Next, a layer 1103 of p-type $Al_{x1}Ga_{(1-x1)}As$ is deposited. Preferably, layer 1103 has a thickness on the order of 600-1000 Å and has a P-type doping of $5\times10^{17}$ $cm^{-3}$. The parameter x1 of layer 1103 is preferably about 70%. The undoped AlGaAs layer 1099 corresponds to the undoped spacer layer 34 of FIGS. 1, 3, 5, 8, and 9 as described above. Layers 1101 and 1103 corresponds to the p-type layer(s) 36 of FIGS. 1, 3, 5, 8, and 9 as described above.

Deposited next are ohmic contact layers of GaAs (1105) and InGaAs (1107). Layer 1105 is about 500-1500 Å thick. Layer 1107 is about 30 Å thick. Both layers 1105 and 1107 are doped to a very high level of P+ type doping (about $1\times10^{20}$ $cm^{-3}$) to enable formation of ohmic contacts thereto. Layers 1105 and 1107 corresponds to the p-type ohmic contact layer(s) 38 of FIGS. 1, 3, 5, 8, and 9 as described above.

The size of the embedded QDs of the template and emission substructures of layers 1023-1051 and 1059-1087 contributes to the emission/absorption wavelength of such structures. In one embodiment, the embedded QDs of the template and emission substructures of layers 1023-1051 and 1059-1087 have the following characteristics:

QDs of the emission substructure having a maximal characteristic dimension of 50-60 Å for production/absorption of light with a characteristic wavelength at or near 1310 nm, and QDs of the template substructure having a maximal characteristic dimension of 20-30 Å (which are of smaller size that the emission substructure) for production/absorption of light with a characteristic wavelength at or near 1310 nm;

QDs of the emission substructure having maximal characteristic dimension of 20-30 Å for production/absorption of light with a characteristic wavelength at or near 1430 nm, and QDs of the template substructure having a maximal characteristic dimension of 20-30 Å (which are of smaller size that the emission substructure) for production/absorption of light with a characteristic wavelength at or near 1430 nm;

QDs of the emission substructure having a maximal characteristic dimension of 100-110 Å for production/absorption of light with a characteristic wavelength at or near 1550 nm, and QDs of the template substructure having a maximal characteristic dimension of 20-30 Å

(which are of smaller size that the emission substructure) for production/absorption of light with a characteristic wavelength at or near 515 nm; and QDs with an aspect ratio on the order of three (i.e., the characteristic base dimension of the QD is about three times larger than the characteristic height dimension of the QD).

Such QD size and aspect ratio are dictated by growth conditions, particularly the number of monolayers for three dimensional InAs QD growth. For example, 2 ML of three dimensional InAs QD growth can be used for the template substructures, and 3.2 ML of three dimensional InAs QD growth can be used for the emission substructures. Other suitable monolayer growths can be used as well. Moreover, the thickness of the barrier layer(s) between the QDs of the template substructure and the emission substructure can be controlled in order that the strain energy from the template substructure have a desired influence on the larger dot size and quality of the emission substructure. For example, the barrier layers 1029, 1045, 1065, 1081 of FIGS. 12A-12C are 100 Å in thickness. Other suitable barrier thicknesses can be used as well. Moreover, the In concentration of the analog graded quantum well material onto which the QDs are grown can be used to control the amount of strain and thus the maximum size of the QDs formed thereon. For example, the analog graded quantum well layers 1031, 1047, 1067, 1083 can have a maximum In concentration of 36-40% (more preferably 38%) relative to the concentration of Ga, which is suitable for QD sizes to support 1550 nm emission. In another example, the analog graded quantum well layers 1031, 1047, 1067, 1083 can have a maximum In concentration of 30-36% (more preferably 33%) relative to the concentration of Ga, which is suitable for QD sizes to support 1430 nm emission. In yet another example, the analog graded quantum well layers 1031, 1047, 1067, 1083 can have a maximum In concentration of 27-33% (more preferably 30%) relative to the concentration of Ga, which is suitable for QD sizes to support 1310 nm emission. Other maximum In concentrations for the analog graded quantum well layers 1031, 1047, 1067, 1083 (including maximum In concentrations relative to Ga greater than 40%) can be used as well. It is contemplated that maximum In concentrations relative to Ga greater than 40% for the analog graded quantum well layers 1031, 1047, 1067, 1083 can reduce the amount of strain and thus increase the maximum size of the QDs formed thereon.

An integrated circuit employing a wide variety of optoelectronic devices and transistors can be made utilizing the layer structure of FIGS. 12A to 12C. For all of the devices, n-type and p-type ion implants are used to contact the n-type and p-type modulation doped QW structures, respectively. N-type metal is used to contact to the n-type ion implants and the bottom n-type ohmic layer. P-type metal is used to contact to the p-type ion implants and the top p-type ohmic layer.

Figure 15A:
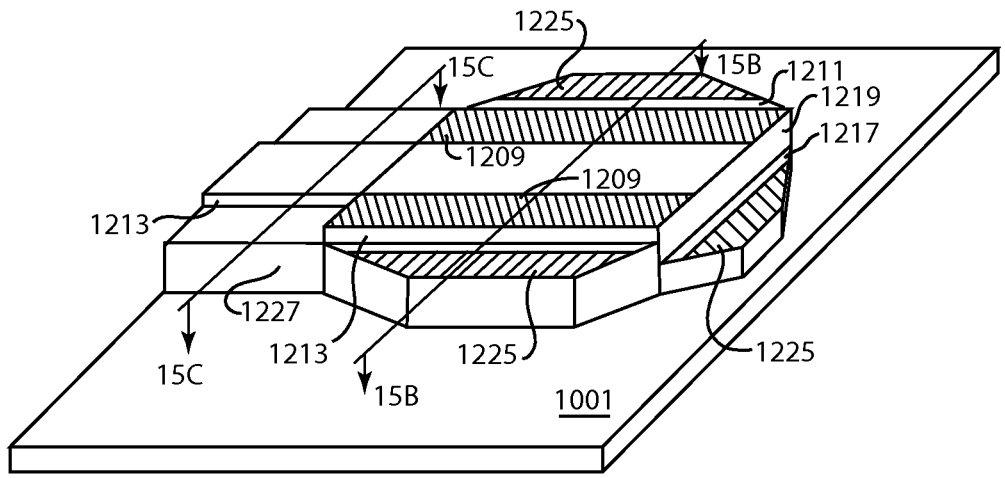
FIGS. 15A-15C are schematic illustrations of an exemplary quantum well laser or detector device realized as part of an optoelectronic integrated circuit that employs the layer structure of FIGS. 12A to 12C.
Figure 15B:
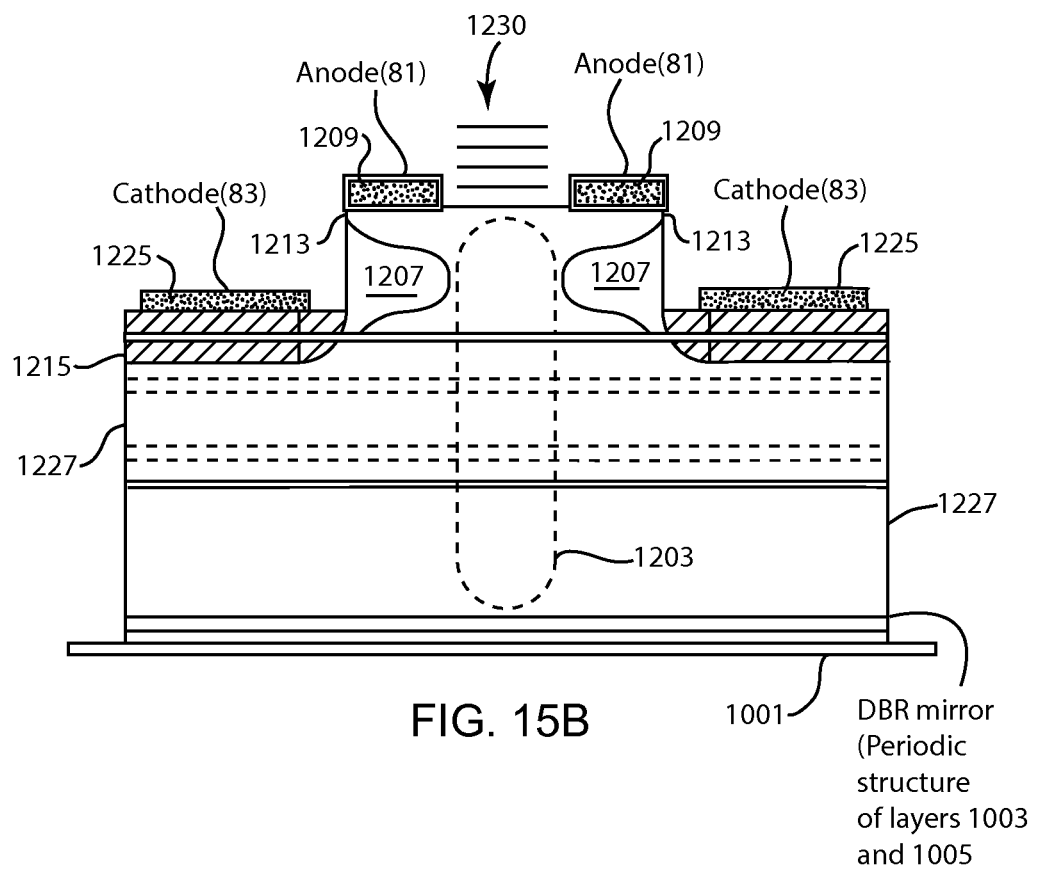
Figure 15C:
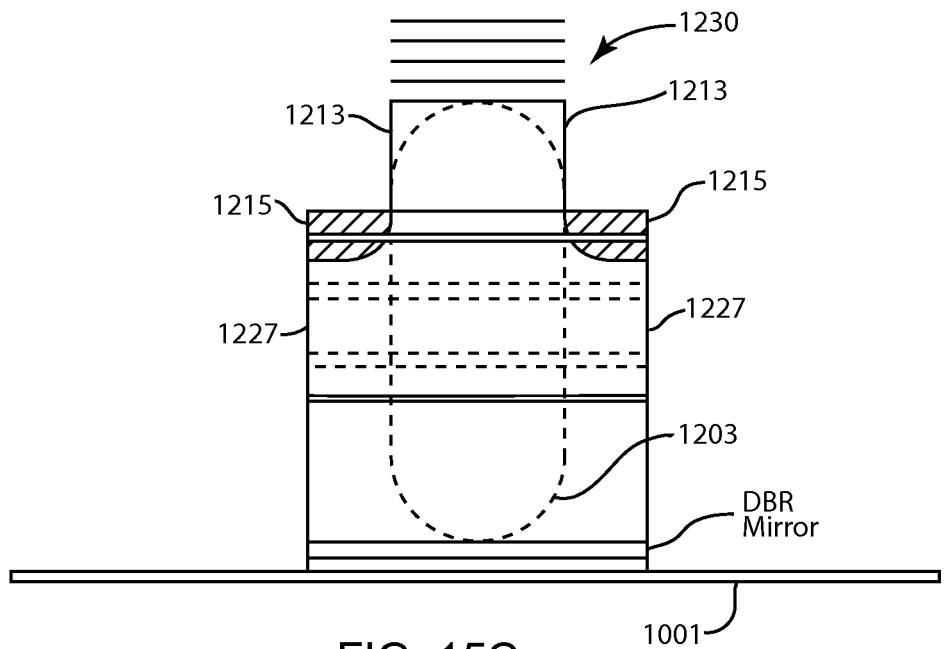

FIGS. 15A-15C shows a straight passive waveguide section that operates passively to guide light produced by a quantum well laser of the type that is described above with respect to FIG. 5 and shown in more detail in the cross-section of FIG. 15B. The straight passive waveguide section is shown in more detail in the cross-section of FIG. 15C. The straight passive waveguide section employs a top DBR mirror 1230 (preferably realized from pairs of semiconductor or dielectric materials with different refractive indices) that operates as cladding to provide guiding of the optical mode 1203 between the top DBR mirror 1230 and the bottom DBR mirror formed by the periodic structure of layers 1003 and 1005. The lateral confinement of the optical mode 1203 is provided by the index change associated with vertical sidewalls 1213 of top rib as well as n-type ion implants 1215 that are subsequently formed as described below. The lateral confinement of the optical mode 1203 can also be supported by covering the sidewalls 1213, 1227 with the periodic layer structure of the top DBR mirror 1230 (not shown). The n-type implants 1215 also introduce impurity free vacancy disordering into the adjacent waveguide core region when subjected to rapid thermal annealing. The bandgap of the disordered waveguide core region is increased locally to substantially reduce absorption and associated optical loss. The top DBR mirror structure 1230 can also extend in a continuous manner to form cladding over the active region of the quantum well laser as is evident from the cross-section of FIG. 15B. In this configuration, the top DBR mirror structure 1230 operates as cladding for the optical mode 1203 generated by the quantum well laser between the top DBR mirror structure 1230 and the bottom DBR mirror formed by the periodic structure of layers 1003 and 1005. The lateral confinement of the optical mode 1203 is provided by the n-type ion implants 1207 under the anode metal 1209 of the quantum well laser that are subsequently formed as described below. The size of the embedded QDs of the template and emission substructures of layers 1059-1087 1023-1051 correspond to the desired emission/absorption wavelength of the optical mode 1203 emitted by the quantum well laser.

Figure 16:
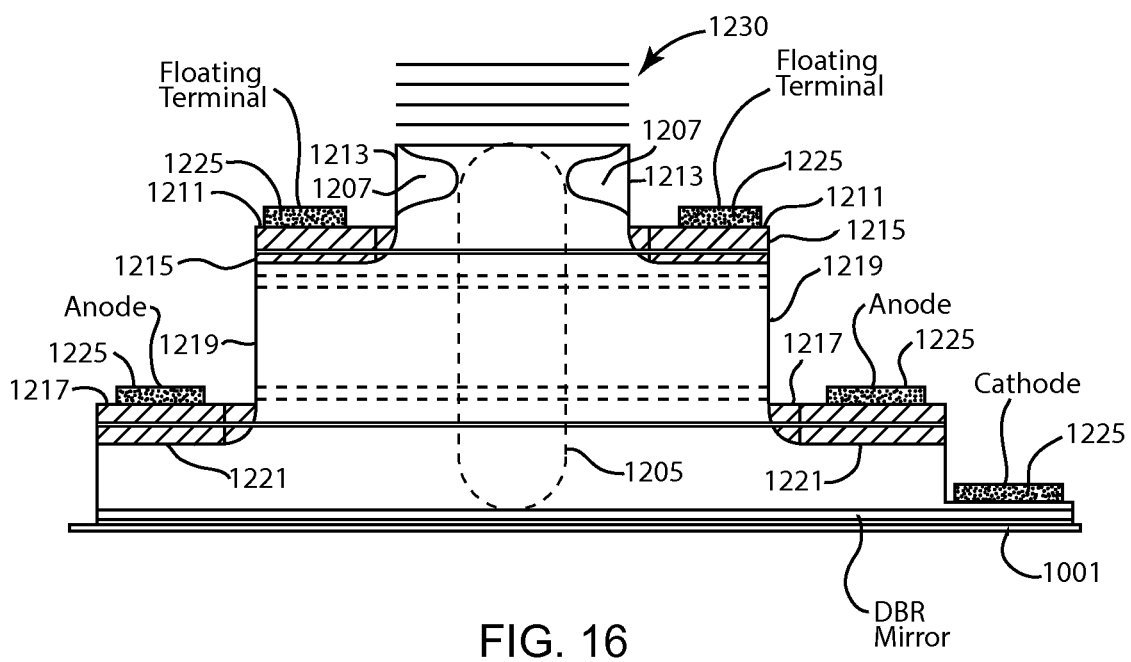
FIG. 16 is a schematic illustration of a different quantum well laser or detector device realized as part of an optoelectronic integrated circuit that employs the layer structure of FIGS. 12A to 12C.

FIG. 16 shows a configuration of a quantum well laser of the type that is described above with respect to FIG. 8. This configuration can be utilized in conjunction with the straight passive waveguide section of FIGS. 15A and 15C in a manner similar to the quantum well laser of FIG. 15B. For the quantum well laser, the top DBR mirror structure 1230 can extend in a continuous manner to form cladding over the active region of the quantum well laser as is evident from the cross-section of FIG. 16. In this configuration, the top DBR mirror structure 1230 operates as cladding for the optical mode 1205 generated by the quantum well laser between the top DBR mirror structure 1230 and the bottom DBR mirror formed by the periodic structure of layers 1003 and 1005. The lateral confinement of the optical mode 1205 is provided by the n-type ion implants 1207 that are subsequently formed in the top p-type region of the device as described below. The size of the embedded QDs of the template and emission substructures of layers 1023-1051 correspond to the desired emission/absorption wavelength of the optical mode 1205 emitted by the quantum well laser.

Figure 17:
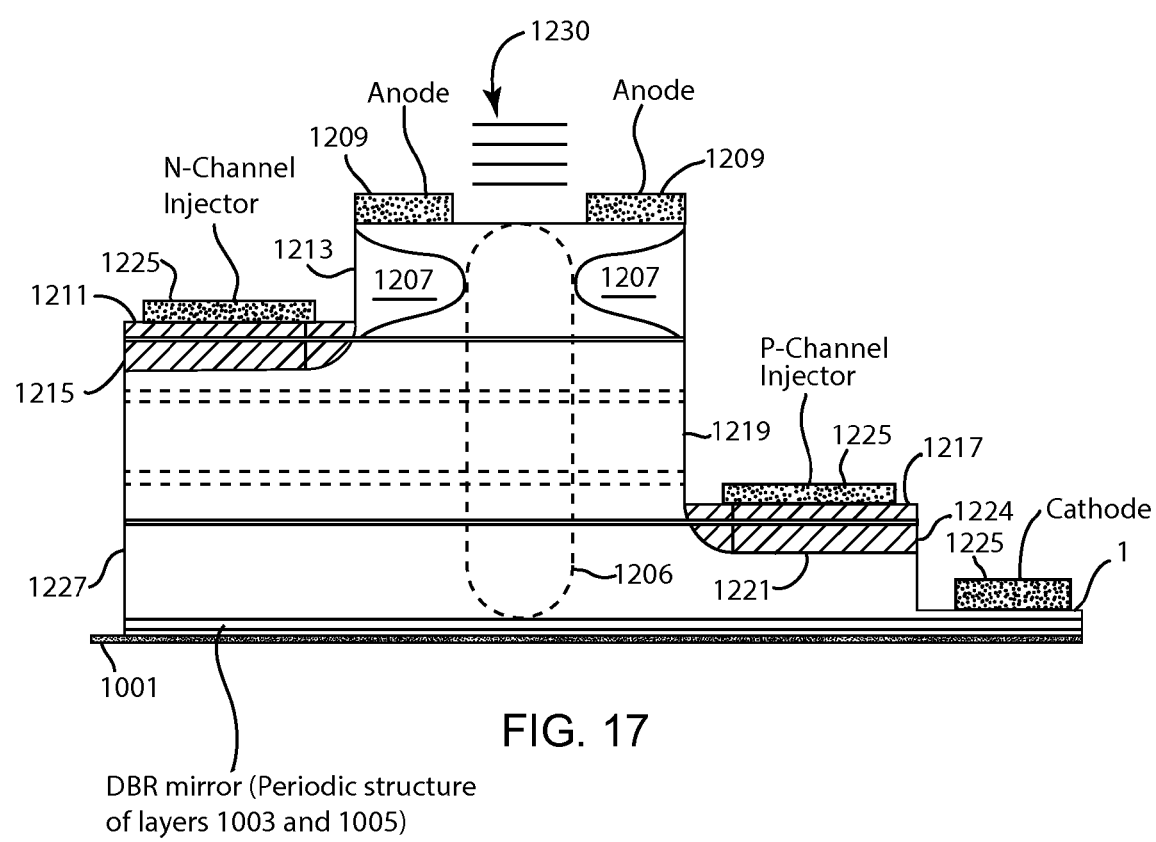
FIG. 17 is a schematic illustration of an exemplary quantum well thyristor device realized as part of an optoelectronic integrated circuit that employs the layer structure of FIGS. 12A to 12C.

FIG. 17 shows a configuration of a thyristor laser of the type that is described above with respect to FIG. 9. This configuration can be utilized in conjunction with the straight passive waveguide section of FIGS. 15A and 15C similar to the quantum well lasers of FIGS. 15B and 16. For the thyristor laser, the top DBR mirror structure 1230 can extends in a continuous manner to form cladding over the active region of the thyristor laser as is evident from the cross-section of FIG. 17. In this configuration, the top DBR mirror structure 1230 operates as cladding for the optical mode 1206 generated by the thyristor laser between the top DBR mirror structure 1230 and the bottom DBR mirror formed by the periodic structure of layers 1003 and 1005. The lateral confinement of the optical mode 1205 is provided by the n-type ion implants 1207 that are subsequently formed under the top anode metal as described below. The size of the embedded QDs of the template and emission substructures of layers 1059-1087 and 1023-1051 correspond to the desired emission/absorption wavelength of the optical mode 1206 emitted by the quantum well laser.

Figure 18A:
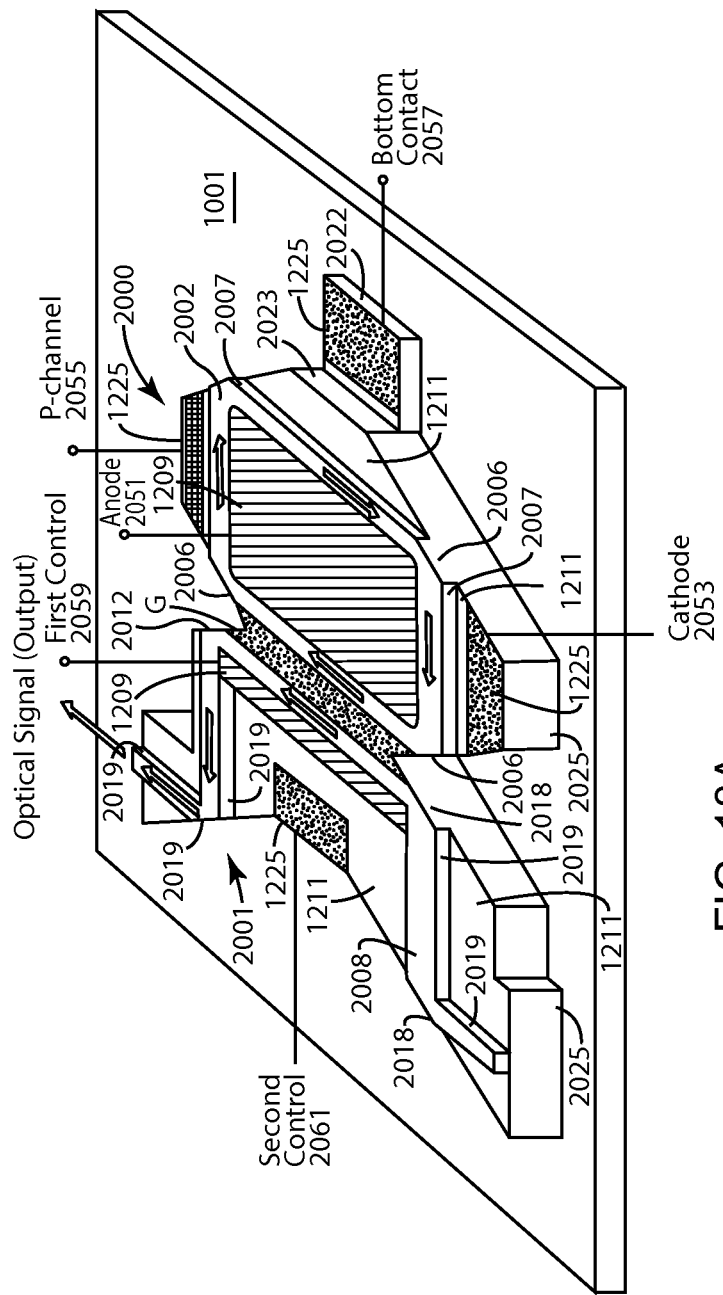
FIGS. 18A-18F are schematic illustrations of an exemplary closed-loop microresonator realized as part of an optoelectronic integrated circuit that employs the layer structure of FIGS. 12A to 12C.
Figure 18B:
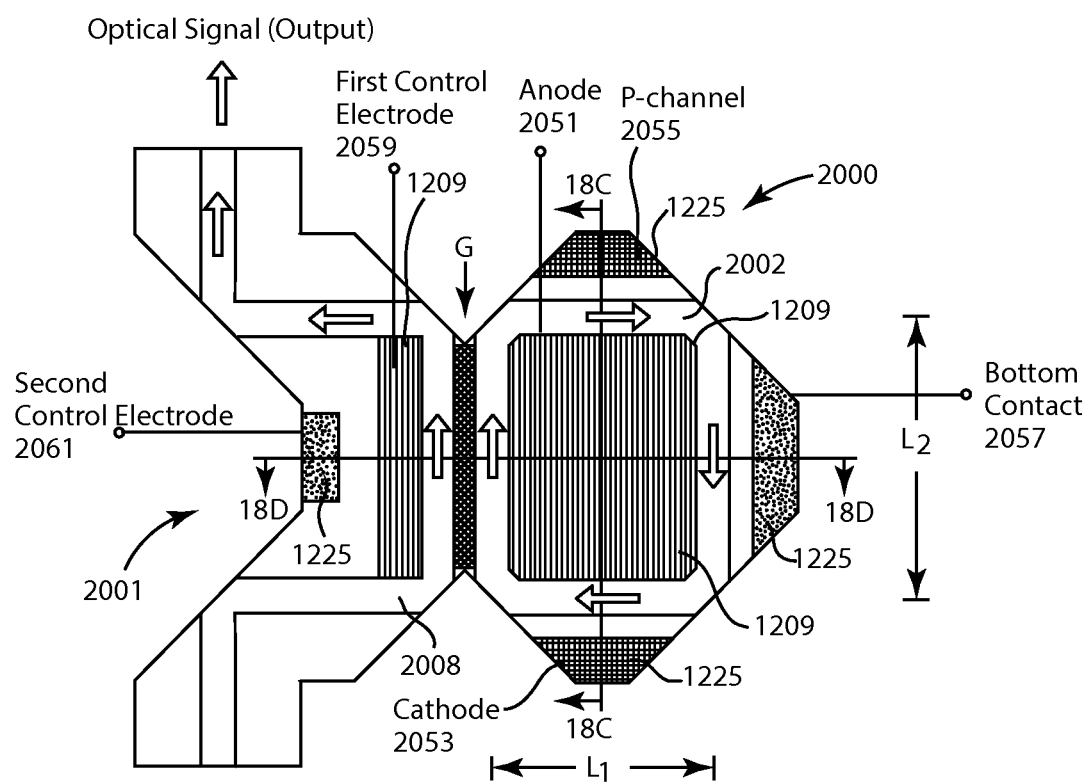

FIGS. 18A-18F illustrate a configuration of an optical closed loop microresonator that can be made utilizing the layer structure of FIGS. 12A to 12C, which includes a microresonator 2000 spaced from a section of a zig-zag waveguide structure 2001 by a gap region G. The zig-zag waveguide structure 2001 is optically coupled to the microresonator 2000 by evanescent-wave coupling over the gap region G. The microresonator 2000 defines a waveguide 2002 that follows a closed path that is generally rectangular in shape. The length of the closed path waveguide 2002 is tuned to the particular wavelength of the optical mode 2004 that is to propagate in the waveguide 2002. Specifically, the length of the rectangular closed path waveguide 2002 is given as $2(L_1+L_2)$ for the $L_1$ and $L_2$ length parameters of the waveguide 2002 as best shown in FIG. 18B. In this configuration, the $L_1$ and $L_2$ parameters are selected to conform to the following:

$$2(L_1 + L_2) = \frac{2\pi m \lambda_D}{n_{eff}} \quad (1)$$

where $L_1$ and $L_2$ are the effective lengths of the opposed sides of the closed path waveguide 2002;

m is an integer greater than zero;

$\lambda_D$ is the wavelength of the optical mode 2004 that is to propagate in the waveguide 2002; and $n_{eff}$ is the effective refractive index of the waveguide 2002. The size of the embedded QDs of the template and emission substructures of layers 1059-1087 (and possibly also layers 1023-1051) correspond to the desired wavelength $\lambda_D$.

The width (W) of the closed path waveguide 2002 can be less than 2 μm, and possibly 1 μm or less. The width of the gap region G (i.e., the spacing between the waveguide 2002 and the zig-zag waveguide 2001) can be less than 2 μm, and possibly on the order of 1 μm or less.

The optical mode 2004 circulates around the waveguide 2002 and is strongly confined within the waveguide 2002 by internal reflection at the reflective interfaces of the waveguide 2002. Specifically, cladding for guiding the optical mode 2004 in the waveguide 2002 is provided by the top DBR mirror structure 1230 and the bottom DBR mirror defined by the periodic structure of layers 1003 and 1005 as best shown in the cross-section of FIG. 18C. Lateral confinement of the optical mode 2004 in the waveguide 2002 can be provided by: i) a refractive index change at the sidewalls 2006, 2007, 2021 that define the outer boundary of the waveguide 2002 (FIG. 18A), ii) a refractive index change at the corner sidewalls 2006 (FIG. 18A), iii) a refractive index change at the periphery of the implant regions 1215, 1221 located adjacent the sidewalls 2007, 2021 of the rib waveguide 2002 as evident from FIG. 18C, iv) a refractive index change at the periphery of the central implant region 2012 located under the top anode electrode 2051 as evident from FIGS. 18C and 18D, and v) a refractive index change at the interface of the top mirror 1230 that covers the sidewalls 2006, 2007, and 2021 as shown.

The zig-zag waveguide 2001 of FIGS. 18A to 18F defines a rib waveguide 2008 that forms a zig-zag path. The optical mode 2010 is strongly confined within the waveguide 2008 by internal reflection at the reflective interfaces of the waveguide 2008. Specifically, cladding for guiding the optical mode 2010 in the waveguide 2008 can be provided by the top DBR mirror structure 1230 and the bottom DBR mirror defined by the periodic structure of layers 1003 and 1005 as best shown in the cross-section of FIG. 18D. Lateral confinement of the optical mode 2010 in the waveguide 2008 can be provided by i) a refractive index change at the top rib defined by the sidewalls 2019 that define the outer boundary of the waveguide 2008 (FIG. 18A), ii) a refractive index change at n-type ion implants 1215 adjacent the top rib sidewalls similar to the n-type implant 1215 shown in FIG. 18D for the microresonator waveguide 2002, iii) a refractive index change at the corner sidewalls 2018 (FIG. 18A), and iv) a refractive index change at the interface of the top mirror 1230 that covers the sidewalls 2018 and 2019.

In the coupling region, the waveguide 2008 includes a section that extends parallel to and is closely-spaced from a straight section of the microresonator waveguide 2002 by the gap region G. In this section of the waveguide 2008, lateral confinement of the optical mode 2010 is provided by a refractive index change at the periphery of the implant region 2014 under the metal 1209 of the first control electrode 2059 as shown in FIG. 18D, and a refractive index change at the periphery of the implant region 2016 in the coupling region (gap G) as evident from FIG. 18D. In the coupling section of the microresonator waveguide 2002, lateral confinement of the optical mode 2004 is further provided by a refractive index change at the periphery of the implant region 2016 in the coupling region (gap G) as evident from FIG. 18D.

Figure 18C:
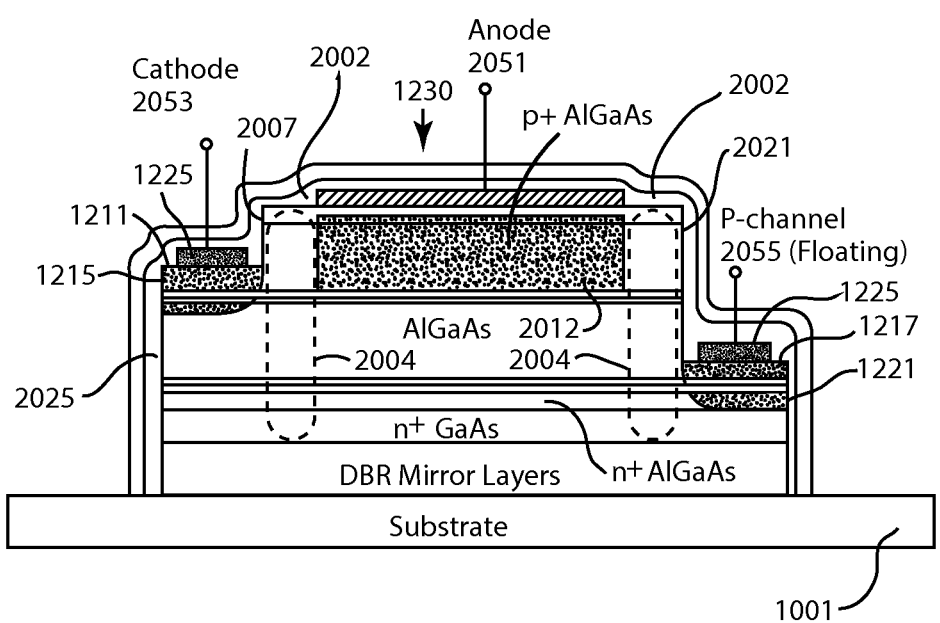
Figure 18D:
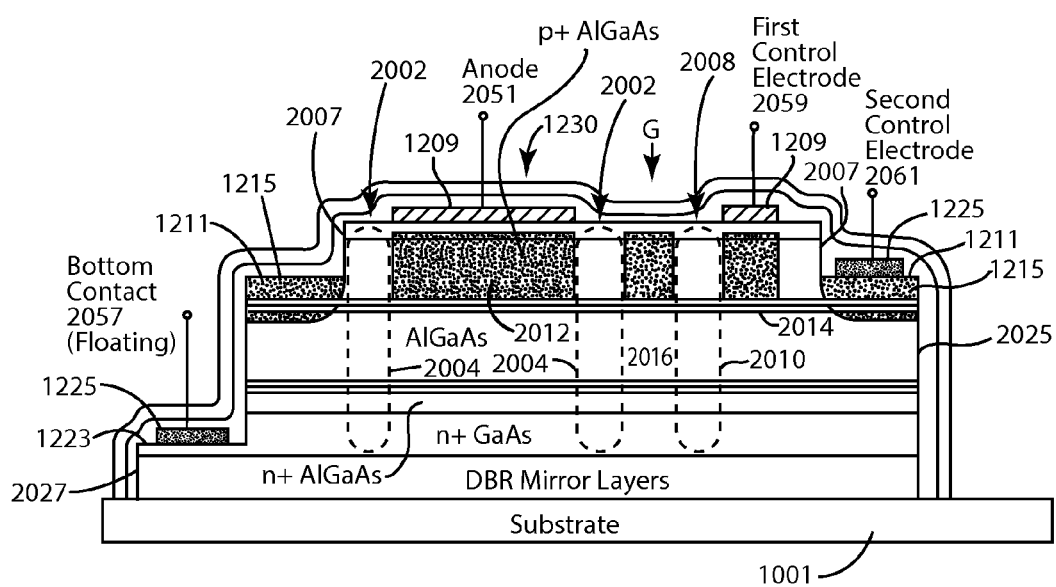

The microresonator 2000 further includes a top anode terminal electrode 2051 that is electrically coupled to the top p-type ohmic contact layer (layer 1107) as best shown in FIGS. 18C and 18D, a cathode terminal electrode 2053 that is electrically coupled to the n-type modulation doped QW structure (layers 1097-1091) via an n-type ion implants 1215 as best shown in FIG. 18C, a p-channel terminal electrode 2055 that is electrically coupled to the p-type modulation doped QW structure (layers 1019-1015) via a p-type ion implants 1221 as best shown in FIG. 18C, and a bottom contact terminal electrode 2057 that is electrically coupled to the bottom n-type contact layer (layer 1009) as best shown in FIG. 18D. The zig-zag waveguide structure 2001 includes first control electrode 2059 that is electrically coupled to the top p-type ohmic contact layer (layer 1107) as best shown in FIG. 18D, and a second control terminal electrode 2061 that is electrically coupled to the n-type modulation doped QW structure (layers 1097-1091) via an n-type ion implant region 1215 as best shown in FIG. 18D. Note that the implant regions 2012, 2014, and 2016 can locally shift the band gap in the underlying n-type modulation doped quantum well structure (layers 1097-1091). This bandgap shift can prohibit charge transfer in the QWs of the n-type modulation doped QW structure (layers 1097-1091) across the gap region G between the adjacent waveguides 2002, 2008. For the waveguide 2008, voltage signals applied to the top control electrode 2059 can overcome this effect to allow charge to enter (or exit) from the QWs of the n-type modulation doped QW structure (layers 1097-1091) via the second control electrode 2061 as desired. It is also contemplated that additional process steps, such as etching away the top p+ contact layers (layers 1107-1105) and possibly additional layers thereunder in the gap region G, can be performed in order to prevent any charge transfer across the gap region G.

The optical closed loop microresonator of FIGS. 18A to 18E can be configured as an electrically-pumped in-plane laser by forward biasing the anode terminal electrode 2051 of the microresonator 2000 relative to the cathode terminal electrode 2053 while allowing the p-channel electrode 2055 and the bottom contact electrode 2057 to float. The bias conditions of the anode terminal electrode 2051 and the cathode terminal electrode 2053 are configured to induce current flow into the active waveguide region of the device sufficient to produce lasing action. Such lasing action is controlled in a similar manner as described above with respect to the electrically-pumped laser of FIG. 5. In this configuration, the size of the embedded QDs of the template and emission substructures of layers 1059-1087 (and possibly also layers 1023-1051) correspond to the desired wavelength $\lambda_D$. With these bias conditions, the microresonator 2000 generates a continuous-wave optical signal at the desired wavelength $\lambda_D$ that propagates clockwise in the waveguide 2002. Concurrent with such operation, a time-varying differential electrical signal is supplied to the first control electrode 2059 and the second control electrode 2061 of the waveguide structure 2001 to change the amount of charge (electrons) that fills the n-type modulation doped QW structure (layers 1097-1091) for the waveguide 2008 which induces a change in the refractive index of the material of the n-type modulation doped QW structure for the waveguide 2008. The change in the refractive index of the material of the n-type modulation doped QW structure for the waveguide 2008 modulates the coupling coefficient for the waveguide 2008 to cause modulation of the evanescent-wave coupling between the two waveguides 2002, 2008 in the coupling region G over time. Specifically, the coupling coefficient for the waveguide 2008 (and thus the evanescent-wave coupling between the two waveguides 2002, 2008 in the coupling region G) is controlled by the amount of charge (electrons) that fills the n-type modulation doped QW structure (layers 1097-1091) for the waveguide 2008, which dictates the shifting of the absorption edge of the QW(s) of the n-type modulation doped QW structure for the waveguide 2008. The n-type modulation doped QW structure (layers 1097-1091) for the waveguide 2008 can be filled with charge (electrons) by forward biasing the first control electrode 2059 with respect to the second control electrode 2061 under conditions where there is minimal conduction between the first control electrode 2059 and the second control electrode 2061. In this configuration, the first control electrode 2059 makes contact to the p-type ohmic contact layer which extends over the waveguide 2008. The isolation implant 2014 populates the QW channel of the n-type modulation doped QW structure due to its effect on the modulation doping. Effectively this moves the contact to the point in the waveguide 2008 on the other side of the isolation implant 2014. The forward bias condition of the first control electrode 2059 with respect to the second control electrode 2061 results in minimal conduction between the first control electrode 2059 and the second control electrode 2061 while producing a field effect that controls the charge (electrons) that fills the n-type modulation doped QW structure (layers 1097-1091) for the waveguide 2008. Such bias operations are similar to the bias conditions of the n-channel HFET in forming the 2-dimensional electron gas for the operation of the n-channel HFET as described above. Since the charge is now in the waveguide, the absorption edge of the QW of the n-type modulation doped QW structure for the waveguide 2008 shifts to change the coupling coefficient for the waveguide 2008.

Such coupling modulation generates a modulated optical signal based upon the continuous-wave optical signal that propagates clockwise in the waveguide 2002. The modulated optical signal propagates from the coupling region of the waveguide 2008 and is output from the waveguide 2008 as best shown in FIGS. 18A and 18B. The modulated optical signal output from the waveguide 2008 can have an optical OOK modulation format (i.e., digital pulsed-mode optical signal) or possibly a higher order optical modulation format (such as optical differential phase shift keying format or optical differential quadrature phase shift keying format). The bias conditions of the anode terminal electrode 2051 and the cathode terminal electrode 2053 as well as the electrical signals supplied to the first and second control electrodes 2059, 2061 can be provided by resistors and/or transistors integrated on-chip (i.e., on the substrate 1001) or off-chip. Advantageously, it is expected that the electronic control of the evanescent coupling between the waveguide 2002 and the waveguide 2008 can modulate the optical signal output from the waveguide 2008 at high bandwidths, which can possibly extend up to 100 GHz.

For continuous-wave emission of the laser, a DC differential electrical signal can be supplied to the first and second control electrodes 2059, 2061 of the waveguide structure 2001 (instead of the time-varying signal for the modulated emission). The DC electrical signal controls the device to operate in the coupled state. In this coupled state, the continuous-wave optical signal that propagates clockwise in the waveguide 2002 is transferred to the waveguide 2008 (in the coupling region of waveguide 2008) and is output from the waveguide 2008.

The characteristic wavelength $\lambda_D$ of the continuous-wave optical signal that propagates clockwise in the waveguide 2002 can be tuned by controlled heating of the device to control the temperature of the microresonator 2000. Such controlled heating can be carried out by localized heating through controlled operation of a transistor device (such as n-channel or p-channel HFET device) that is integrally formed on the substrate in a position adjacent to or near the microresonator 2000. The transistor device is operated as a resistive heater to generate heat in a controlled manner. The heat transfers by diffusion to heat the microresonator 2000. Temperature of the microresonator 2000 (or of a device in the local vicinity thereof) can be used to provide feedback to control the heating of the microresonator 2000 via the transistor heater device. The heating current of the heater transistor device for controlling the optical closed loop microresonator to emit light at the desired characteristic wavelength $\lambda_D$ can be measured by spectral analysis of the wavelength of the light output from the optical closed loop microresonator as compared to the desired characteristic wavelength $\lambda_D$ and adjusting the heating current of the heater transistor device such that the wavelength of the output light matches the desired characteristic wavelength $\lambda_D$. The spectral analysis can be accomplished by using a 4-port directional coupler with 2 ports (an input port and output port) for two waveguides. The two waveguides of the directional coupler are configured to couple an optical signal at the desired characteristic wavelength $\lambda_D$ that is supplied to the input port of one waveguide to the other waveguide for output therefrom, and vice versa. Light output by the optical closed loop microresonator is tapped off and fed into the input port of one of the waveguides of the directional coupler. The light output of a reference source that operates at the desired characteristic wavelength $\lambda_D$ is fed into the input port of the other waveguide of the directional coupler. The light output of the two output ports of the waveguides of the directional coupler is directed to two photodetectors, which are arranged as balanced detectors that produce an output signal proportional to the difference between the wavelength of the light output by the optical closed loop microresonator and the desired characteristic wavelength $\lambda_D$ for the light output by the reference source. This output signal is used in a feedback loop that dynamically adjusts the heating current of the heater transistor device (which changes the wavelength of the light output by the optical closed loop microresonator) to drive the output signal to near zero such that the wavelength of the output by the optical closed loop microresonator matches the desired characteristic wavelength $\lambda_D$.

Figure 18E:
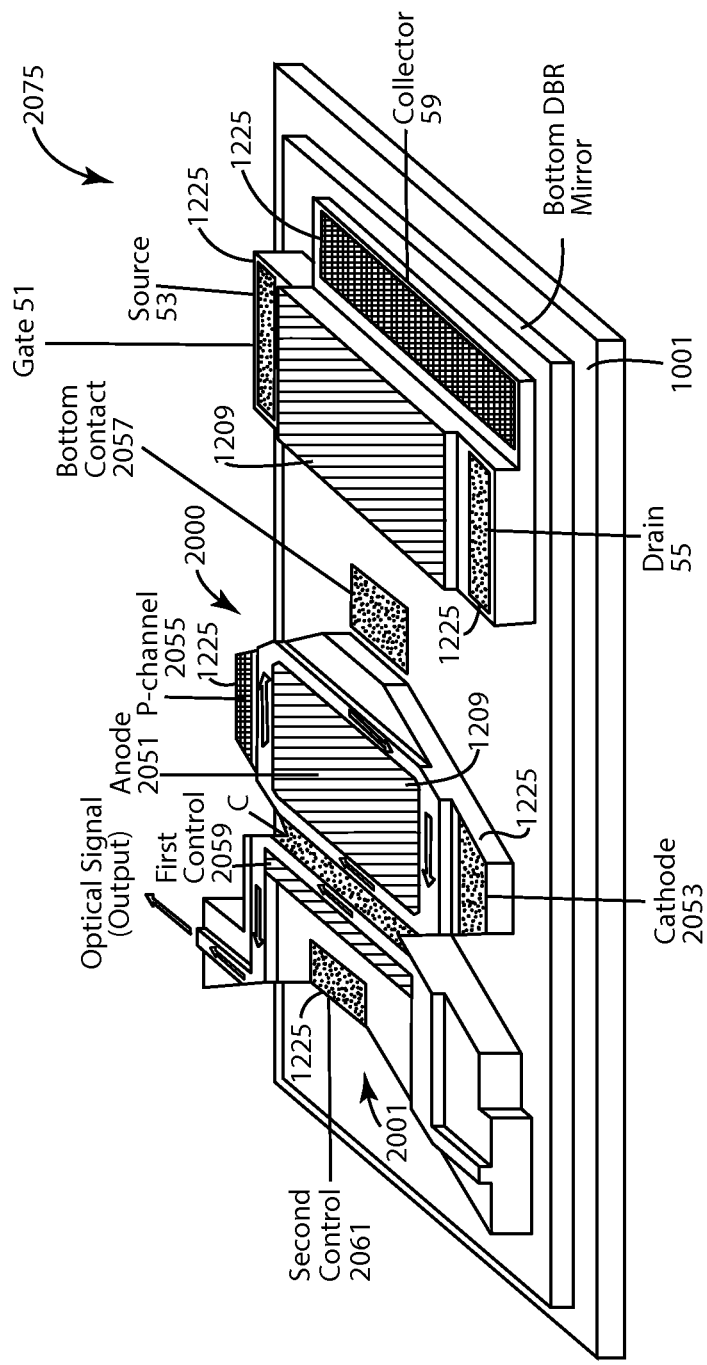

In the preferred embodiment, the microresonator 2000 as well as the zig-zag waveguide structure 2001 and the transistor heater device are all formed over a continuous section of the bottom DBR mirror (and possibly a number of layers above the bottom DBR mirror). This is realized by omitting the isolation etch through the bottom DBR mirror for the region between the microresonator 2000 and the transistor heater device (or portions thereof). This configuration allows the heat generated by the transistor heater device to diffuse through this continuous section of the bottom DBR mirror (and possibly through a number of layers above the bottom DBR mirror) to the microresonator 2000 for the desired heating. FIG. 18E illustrates an exemplary configuration where the microresonator 2000 and a heating n-channel HFET device 2075 are both formed over a continuous section of the bottom mirror. The operation of the re-channel HFET device 2075 is described above with respect to FIG. 1. Note that the isolation etch through the bottom DBR mirror is omitted for the region between the microresonator 2000 and the transistor heater device 2075 (or portions thereof) in order to allow the heat generated by the transistor heater device 2075 to diffuse through this continuous section of the bottom DBR mirror to the microresonator 2000 for the desired heating. The heat generated by the transistor heater device 2075 can be controlled electronically by biasing the transistor heater device 2075 to control the conductance of the channel of the transistor heater device 2075 and by controlling the amount of current that flows through the channel between the source terminal electrode 53 and the drain terminal electrode 55 in the conducting (ON) state of the transistor heater device 2075. Other suitable control operations can be implemented for other designs. The layout for the transistor heater device 2075 can be different from that shown in FIG. 18E. For example, a long channel design or serpentine channel design can be used.

Figure 18F:
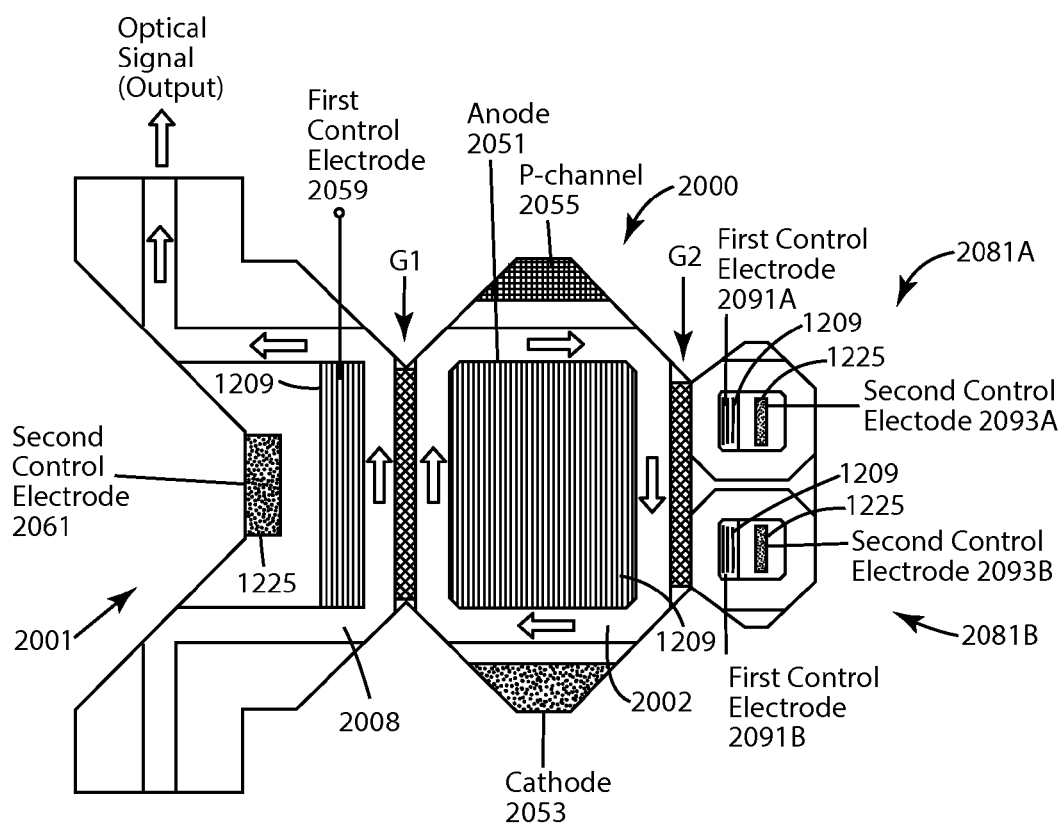

The characteristic wavelength $\lambda_D$ of the continuous-wave optical signal that propagates clockwise in the waveguide 2002 can also be tuned by changing the effective length of the optical path of the waveguide 2002. This can be accomplished with the addition of one or more closed-path waveguides (two shown as 2081A, 2081B) that are evanescently coupled to the closed-path waveguide 2002 over a second gap region G2 as shown in FIG. 18F.

The closed path waveguides 2081A, 2081B each follow a closed path that is generally rectangular in shape, which allow for circulation of a corresponding optical mode signal around the respective closed-path waveguide. The optical modes are strongly confined within the closed-path waveguides by internal reflection at the reflective interfaces of the closed-path waveguides similar to the zig-zag waveguide 2008. Specifically, cladding for guiding the optical mode in the respective closed-path waveguide 2081A or 2081B is provided by the top DBR mirror structure 1230 and the bottom DBR mirror defined by the periodic structure of layers 1003 and 1005 similar to confinement of the optical mode 2010 as shown in the cross-section of FIG. 18D. Lateral confinement of the optical mode in the respective closed-path waveguide 2081A or 2081B can be provided by refractive index changes at the top rib defined by the sidewalls that define the outer boundary of the respective waveguide (similar to the sidewalls shown in FIG. 18A), at n-type ion implants 1215 adjacent the top rib sidewalls similar to the n-type implant 1215 shown in FIG. 18D for the microresonator waveguide 2002, at the corner sidewalls 2018 (similar to the corner sidewalls shown in FIG. 18A), and at the interface of the top mirror 1230 that covers the sidewalls 2018 and 2019. In their respective coupling region, the closed-path waveguide 2081A or 2081B includes a section that extends parallel to and is closely-spaced from a straight section of the microresonator waveguide 2002 by the gap region G2. In this section of the waveguide 2081A or 2081B, lateral confinement of the optical mode is provided by i) a refractive index change at the periphery of the implant region under the metal 1209 of the first control electrode (2091A or 2091B), which is similar to the implant region 2014 shown in FIG. 18D, and ii) a refractive index change at the periphery of the implant region in the coupling region (gap G2), which is similar to the implant region 1216 shown in FIG. 18D.

The closed path waveguides 2081A, 2081B each include a respective first control electrode (2091A, 2091B) that is electrically coupled to the top p-type ohmic contact layer (layer 1107) in a manner similar to the control electrode 2059 shown in FIG. 18D, and a respective second control terminal electrode (2093A, 2093B) that is electrically coupled to the n-type modulation doped QW structure (layers 1097-1091) via an n-type ion implant region 1215 similar to the control electrode 2061 shown in FIG. 18D. Note that implant regions similar to the implant regions 2014 and 2016 of FIG. 18D can be provided to locally shift the band gap in the underlying n-type modulation doped quantum well structure (layers 1097-1091). This bandgap shift can prohibit charge transfer in the QWs of the n-type modulation doped QW structure (layers 1097-1091) across the gap region G between the adjacent waveguides. For each respective closed path waveguides 2081A/2081B, voltage signals applied to the top control electrode 2091A/2091B3019 can overcome this effect to allow charge to enter (or exit) from the QWs of the n-type modulation doped QW structure (layers 1097-1091) via the corresponding second control electrode 2093A, 2093B as desired. It is also contemplated that additional process steps, such as etching away the top p+ contact layers (layers 1107-1105) and possibly additional layers thereunder in the gap region G between the adjacent waveguides, can be performed in order to prevent any charge transfer across the gap region G between the adjacent waveguides.

Concurrent with the operation of the microresonator 2000 (and the zig-zag waveguide 2008), electrical signals are supplied to the first and second control electrodes (2091A/2091B and 2093A, 2093B) for the closed path waveguides 2081A, 2081B to control the amount of charge (electrons) that fills the n-type modulation doped QW structure (layers 1097-1091) for the closed path waveguides 2081A, 2081B, which induces a change in the refractive index of the material of the n-type modulation doped QW structure for the closed path waveguides 2081A, 2081B. The change in the refractive index of the material of the n-type modulation doped QW structure for the closed path waveguides 2081A, 2081B modulates the coupling coefficient for the closed path waveguides 2081A, 2081B to cause modulation of the evanescent-wave coupling between the waveguide 2002 and the closed path waveguides 2081A and 2081B in the coupling region G2 over time. The change in such coupling coefficients changes the effective optical path of the waveguide 2002, which can be used to tune the characteristic wavelength $\lambda_D$ of the continuous-wave optical signal that propagates clockwise in the waveguide 2002. The control signals for the coupling between the waveguide 2002 and the closed path waveguides 2081A and 2081B that controls the optical closed loop microresonator 2000 to emit light at the desired characteristic wavelength $\lambda_D$ can be measured by spectral analysis of the wavelength of the light output from the optical closed loop microresonator as compared to the desired characteristic wavelength $\lambda_D$ and adjusting the control signals for the coupling between the waveguide 2002 and the closed path waveguides 2081A and such that the wavelength of the output light matches the desired characteristic wavelength $\lambda_D$. The spectral analysis can be accomplished by using a 4-port directional coupler with 2 ports (an input port and output port) for two waveguides. The two waveguides of the directional coupler are configured to couple an optical signal at the desired characteristic wavelength $\lambda_D$ that is supplied to the input port of one waveguide to the other waveguide for output therefrom, and vice versa. Light output by the optical closed loop microresonator is tapped off and fed into the input port of one of the waveguides of the directional coupler. The light output of a reference source that operates at the desired characteristic wavelength $\lambda_D$ is fed into the input port of the other waveguide of the directional coupler. The light output of the two output ports of the waveguides of the directional coupler is directed to two photodetectors, which are arranged as balanced detectors that produce an output signal proportional to the difference between the wavelength of the light output by the optical closed loop microresonator and the desired characteristic wavelength $\lambda_D$ for the light output by the reference source. This output signal is used in a feedback loop that dynamically adjusts the control signals for the coupling between the waveguide 2002 and the closed path waveguides 2081A and 2081B (which changes the effective optical path of the waveguide 2002 and thus the wavelength of the light output by the optical closed loop microresonator) to drive the output signal to near zero such that the wavelength of the output by the optical closed loop microresonator matches the desired characteristic wavelength $\lambda_D$.

The optical closed loop microresonator of FIGS. 18A to 18F can also be configured as an in-plane laser by forward biasing the p-channel injector terminal electrode 2055 of the microresonator 2000 relative to the bottom contact electrode 2057 while allowing the n-channel injector electrode 2053 and the top contact electrode 2051 to float. The bias conditions of the anode terminal electrode 2051 and the cathode terminal electrode 2053 are configured to induce current flow into the active waveguide region of the device sufficient to produce lasing action. Such lasing action is controlled in a similar manner as described above with respect to the quantum well laser of FIG. 8. In this configuration, the size of the embedded QDs of the template and emission substructures of layers 1023-1051 correspond to the desired wavelength $\lambda_D$. Concurrent with such operation, a time-varying differential electrical signal can be supplied to the first control electrode 2059 and the second control electrode 2061 of the waveguide structure 2001 to change the coupling coefficient for the waveguide 2008 and modulate the evanescent coupling between the waveguides 2002 and 2008. Alternately, for continuous output, a DC electrical signal can be supplied to the first control electrode 2059 and the second control electrode 2061 of the waveguide structure 2001 to activate the evanescent coupling between the waveguides 2002 and 2008. The characteristic wavelength $\lambda_D$ of the continuous-wave optical signal that propagates clockwise in the waveguide 2002 can be tuned by controlling the bias conditions applied to the microresonator 2000 to adjust the charge (electrons) that fill the quantum well(s) of the n-type modulation doped QW structure (layers 1097-1091) for the waveguides 2002 and/or 2008, and or by controlled heating of the device to control the temperature of the microresonator 2000.

The optical closed loop microresonator of FIGS. 18A-18F can also be configured for optical-to-electrical conversion of an input optical signal supplied to the zig-zag waveguide structure 2001. In this case, the input optical signal is supplied to the waveguide 2008 and evanescent-wave coupling between the two waveguides 2008, 2002 in the coupling region G is activated to such that input optical signal is transmitted from the waveguide 2008 to the waveguide 2002 to generate the optical signal propagating in the waveguide 2002. The evanescent-wave coupling between the two waveguides 2008, 2002 in the coupling region G can be activated (and deactivated) by controlling the amount of charge (electrons) that fills the n-type modulation doped QW structure (layers 1097-1091) for the waveguides 2002 and 2008, which dictates the shifting of the absorption edge and index of refraction of the QW(s) of the n-type modulation doped QW structure for the waveguides 2002, 2008. Charge can be added to (or removed from) the n-type modulation doped QW structure (layers 1097-1091) for the waveguide 2008 by a suitable bias current source and/or bias current sink that is electrically coupled to the second control electrode 2061. Similarly, charge can be added to (or removed from) the n-type modulation doped QW structure (layers 1097-1091) for the waveguide 2002 by a suitable bias current source and/or bias current sink that is electrically coupled to the re-channel contact terminal electrode (i.e., the cathode terminal electrode 2053 of FIGS. 18A-18E) of the microresonator 2000.

In one embodiment suitable for optical-to-electrical conversion, the microresonator 2000 can be configured for thyristor operation where the optical signal propagating in the waveguide 2002 generates photocurrent by absorption which adds electrons to the n-type modulation doped QW structure (layers 1097-1091) and holes to the p-type modulation doped QW structure (layers 1019-105) such that the thyristor device switches ON and conducts current through the device between the anode terminal electrode 2051 and the thyristor cathode (i.e., the bottom contact electrode 2057 of FIGS. 18A-18E). Such optoelectronic operations provide the function of detection, current-to-voltage conversion (typically provided by a transimpedance amplifier), level shifting to obtain a ground reference and a decision circuit (typically realized by a comparator). Moreover, the microresonator 2000 has an advantage that it will only absorb at the resonator frequency and thus can be adapted to support different wavelengths for wavelength division multiplexing applications. In this configuration, the size of the embedded QDs of the template and emission substructures of layers 1097-1091 and/or layers 1023-1051 correspond to the desired wavelength $\lambda_D$.

In another embodiment suitable for optical-to-electrical conversion, the microresonator 2000 can be configured for optical detection analogous to a photodiode by applying a reverse bias between the anode terminal 2051 and the n-channel contact electrode (the cathode terminal electrode 2053 of FIGS. 18A-18F). In this configuration, the optical signal propagating in the waveguide 2002 generates photocurrent by absorption of the embedded QDs of the template and emission substructures of layers 1097-1091, which flows between the anode terminal 2051 and the n-channel contact electrode (the cathode terminal electrode 2053 of FIGS. 18A-18E). In this configuration, the size of the embedded QDs of the template and emission substructures of layers 1097-1091 correspond to the desired wavelength $\lambda_D$. Similar operations can by applying a reverse bias between the p-channel injector terminal 2055 and the bottom contact electrode 2057 of FIGS. 18A-18F. In this configuration, the optical signal propagating in the waveguide 2002 generates photocurrent by absorption of the embedded QDs of the template and emission substructures of layers 1023-1051, which flows between the p-channel injector terminal 2055 and the bottom contact electrode 2057. In this configuration, the size of the embedded QDs of the template and emission substructures of layers 1023-1051 correspond to the desired wavelength $\lambda_D$ In another embodiment suitable for optical-to-electrical conversion, the microresonator 2000 can be configured for optical detection analogous to an n-channel base BICFET phototransistor device by applying bias conditions to the terminals of the device (the emitter terminal electrode which corresponds to the anode terminal electrode 2051, the base terminal electrode which corresponds to the cathode terminal electrode 2053, and the collector terminal electrode which corresponds to the p-channel contact electrode 2055 of FIGS. 18A-18F) for constant current operation. In this configuration, the optical signal propagating in the waveguide 2002 generates photocurrent by absorption of the embedded QDs of the template and emission substructures of layers 1023-1051 and layers 1097-1091, which adds to the base current and thus to the collector current (and the emitter current) of the device. In this configuration, the size of the embedded QDs of the template and emission substructures of layers 1023-1051 and layers 1097-1091 correspond to the desired wavelength $\lambda_D$. Similar operations can be configured for optical detection analogous to a p-channel base BICFET phototransistor device by applying bias conditions to the terminals of the device (the emitter terminal electrode which corresponds to the bottom contact electrode 2057, the base terminal electrode which corresponds to the p-channel electrode 2055, and the collector terminal electrode which corresponds to the n-channel electrode 2053 of FIGS. 18A-18F) for constant current operation. In this configuration, the optical signal propagating in the waveguide 2002 generates photocurrent by absorption of the embedded QDs of the template and emission substructures of layers 1023-1051 and layers 1097-1091, which adds to the base current and thus to the collector current (and the emitter current) of the device. In this configuration, the size of the embedded QDs of the template and emission substructures of layers 1023-1051 and layers 1097-1091 correspond to the desired wavelength $\lambda_D$.

The optical closed loop microresonator of FIGS. 18A-18F can also be configured for other optoelectronic functions, such as modulation of an input optical signal supplied to the zig-zag waveguide structure 2001 for output from the zig-zag waveguide structure 2001 as well as optical switching of an input optical signal supplied to the zig-zag waveguide structure 2001. Such configurations are similar to those described in detail in International Appl. No. PCT/US12/51265 filed on Aug. 17, 2012 and published as WO2013/025964 on Feb. 21, 2013, commonly assigned to assignee of the present application and herein incorporated by reference in its entirety.

Figure 19A:
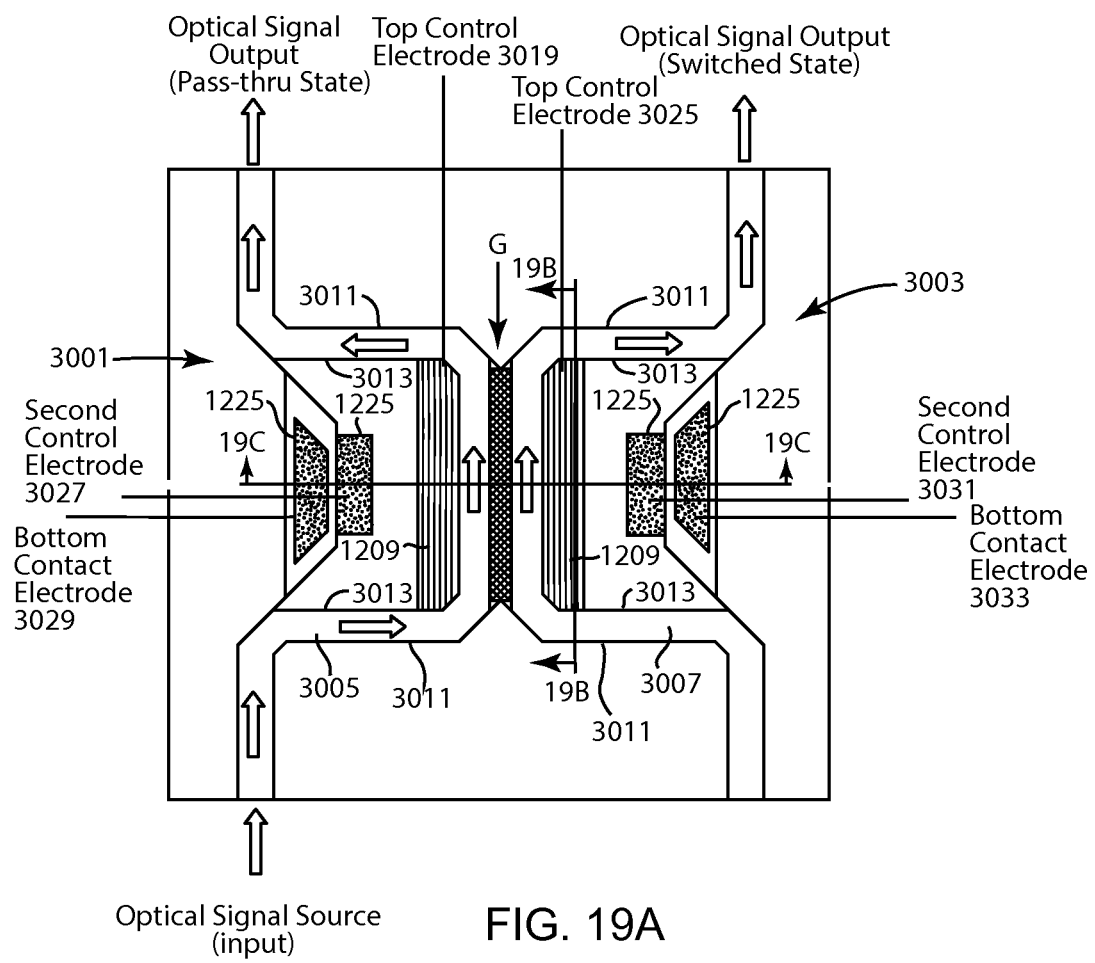
FIGS. 19A-19C are schematic illustrations of an exemplary waveguide optical coupler realized as part of an optoelectronic integrated circuit that employs the layer structure of FIGS. 12A to 12C.
Figure 19B:
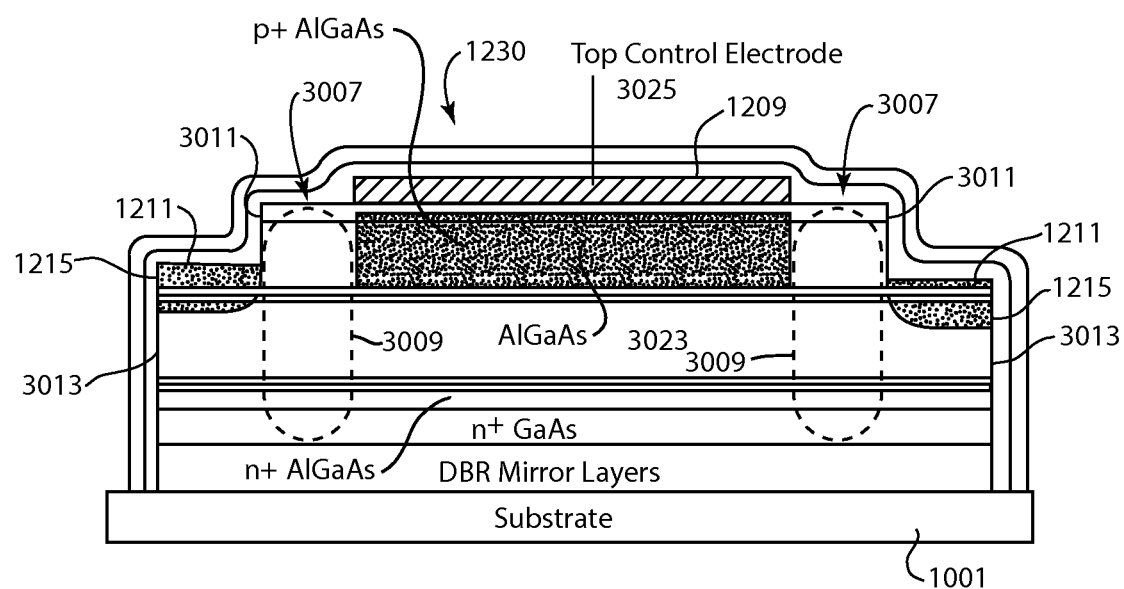
Figure 19C:
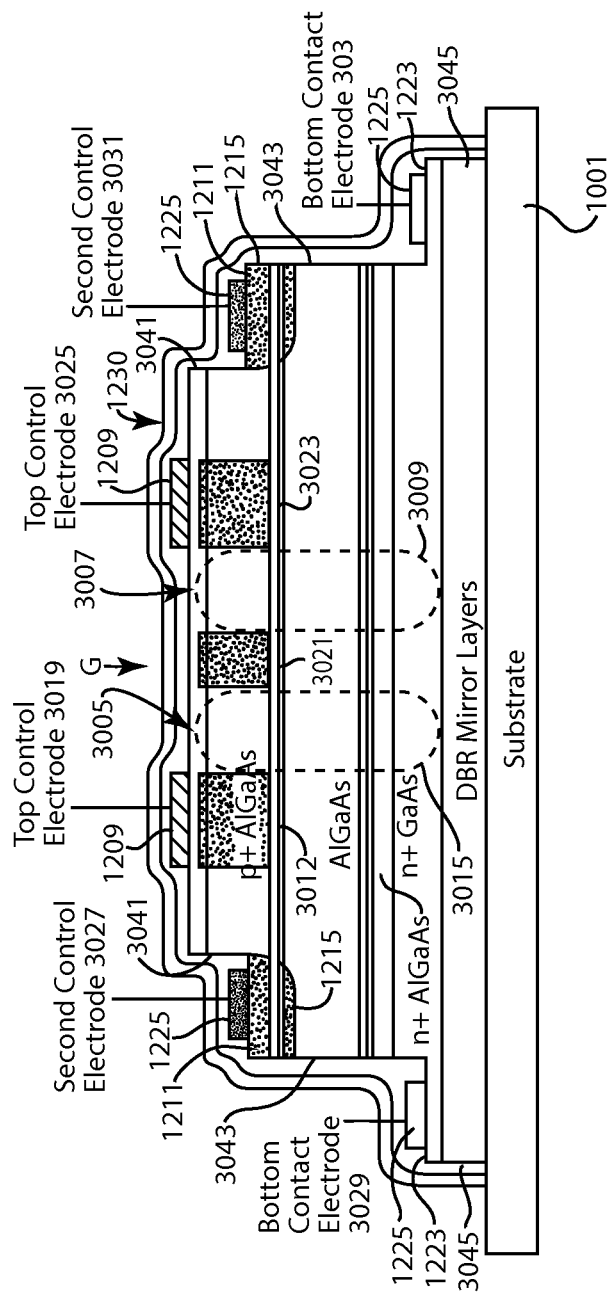

FIGS. 19A-19C illustrate a configuration of a waveguide optical coupler that can be made utilizing the layer structure of FIGS. 12A to 12C, which includes two zig-zag active waveguide structures 3001, 3003 integrated on the substrate 1001 and optically coupled to one another by evanescent-wave coupling over a gap region G. The zig-zag waveguide structure 3001 is defined by a rib waveguide 3005 that forms a zig-zag path. Similarly, the zig-zag waveguide structure 3003 is defined by a rib waveguide 3007 that forms a zig-zag path. The optical mode that travels through each respective rib waveguide is strongly confined within the respective rib waveguide by internal reflection at the reflective interfaces of the rib waveguide. Specifically, cladding for guiding the optical mode 3009 in the rib waveguide 3007 is provided by the top DBR mirror 1230 and the bottom DBR mirror defined by the periodic structure of layers 1003 and 1005 as best shown in the cross-section of FIG. 19B. Lateral confinement of the optical mode 3009 in the waveguide 3007 is provided by refractive index changes at the sidewalls 3011, 3013 that define the outer boundary of the waveguide 3007 (FIG. 19A), at n-type ion implants 1215 adjacent the top rib sidewalls 3011 (FIG. 19B), at the corner sidewalls, and at the interface of the top mirror 1230 that covers the sidewalls 3011. Similar structure is used for the upper cladding of waveguide 3005 for guiding the optical mode 3015 in the rib waveguide 3005.

In the coupling region, the waveguides 3005 and 3007 include straight sections that extend parallel to one another and closely-spaced from one another by the gap region G. In the straight section of the waveguide 3005, vertical confinement of the optical modes 3015, 3009 in the waveguides 3005, 3007 can be aided by the top mirror 1230 formed to cover the top and sidewalls 3011, 3013 of the waveguides 3005, 3007 as shown. Lateral confinement of the optical mode 3015 is provided by i) a refractive index change at the periphery of the implant region 3017 under the metal 1209 of the top control electrode 3019 as shown in FIG. 19C, and ii) a refractive index change at the periphery of the implant region 3021 in the coupling region (gap G) as evident from FIG. 19C. In the straight section of the waveguide 3007, lateral confinement of the optical mode 3009 is provided by i) a refractive index change at the periphery of the implant region 3023 under the metal 1209 of the top control electrode 3025 as shown in FIG. 19C, and ii) a refractive index change at the periphery of the implant region 3021 in the coupling region (gap G) as evident from FIG. 19C.

The width (W) of the waveguides 3005, 3007 can be less than 2 μm, and possibly 1 μm or less. The width of the gap region G (i.e., the spacing between the waveguides 3007, 3009) can be less than 2 μm, and possibly on the order of 1 μm or less.

The zig-zag active waveguide structure 3001 includes a top control terminal electrode 3019 that is electrically coupled to the top p-type ohmic contact layer (layer 1107) as best shown in FIG. 19C, a second control terminal electrode 3027 that is electrically coupled to the n-type modulation doped QW structure (layers 1097-1091) via an n-type ion implant 1215 as best shown in FIG. 19C, and a bottom contact terminal electrode 3029 that is electrically coupled to the bottom n-type contact layer (layer 1009) as best shown in FIG. 19C. The zig-zag active waveguide structure 3003 includes a top control terminal electrode 3025 that is electrically coupled to the top p-type ohmic contact layer (layer 1107) as best shown in FIG. 19C, a second control terminal electrode 3031 that is electrically coupled to the n-type modulation doped QW structure (layers 1097-1091) via an n-type ion implant 1215 as best shown in FIG. 19C, and a bottom contact terminal electrode 3033 that is electrically coupled to the bottom n-type contact layer (layer 1009) as best shown in FIG. 19C. Note that the implant regions 3017, 3021, 3023 can locally shift the band gap in the underlying n-type modulation doped quantum well structure (layers 1097-1091). This bandgap shift can prohibit charge transfer in the QWs of the n-type modulation doped QW structure (layers 1097-1091) across the gap region G between the adjacent waveguides 3005, 2007. For the waveguide 3005, voltage signals applied to the top control electrode 3019 can overcome this effect to allow charge to enter (or exit) from the QWs of the n-type modulation doped QW structure (layers 1097-1091) via the corresponding second control electrode 3027 as desired. For the waveguide 3007, voltage signals applied to the top control electrode 3025 can overcome this effect to allow charge to enter (or exit) from the QWs of the n-type modulation doped QW structure (layers 1097-1091) via the corresponding second control electrode 3031 as desired. It is also contemplated that additional process steps, such as etching away the top p+ contact layers (layers 1107-1105) and possibly additional layers thereunder in the gap region G between the adjacent waveguides 3005, 3007, can be performed in order to prevent any charge transfer across the gap region G between the adjacent waveguides 3005, 3007.

The waveguide optical coupler of FIGS. 19A to 19C can be configured for optical switching by biasing both bottom contact electrodes 3029, 3033 to ground via load resistance and applying control signals to the control electrodes 3019, 3027, 3025, 3031 in order to control the evanescent-wave coupling between the two waveguides 3005, 3007 in the coupling region G. Specifically, the evanescent-wave coupling between the two waveguides 3005, 3007 in the coupling region G can be activated (and deactivated) by controlling the amount of charge (electrons) that fills the n-type modulation doped QW structure (layers 1097-1091) for the waveguides 3005 and 3007, which dictates the shifting of the absorption edge and the index of refraction of the QW(s) of the n-type modulation doped QW structure for the waveguides 3005, 3007 over the length of the coupling region G for the desired optical switching state (pass-thru state or switched state).

For the pass-thru state where the input optical signal is supplied to the input of the waveguide structure 3001 and is output from waveguide structure 3001 as best shown in FIG. 19A, it is required that the light evanescently couple from waveguide 3005 to waveguide 3007 and then back to waveguide 3005 over the coupling region. There will be a wavelength $\lambda_{max}$ corresponding to the maximum shift of the absorption edge. According to Kramers Kronig relations, there will be an increase in refractive index for $\lambda > \lambda_{max}$, and a decrease in refractive index for $\lambda < \lambda_{max}$. For this pass-thru state, the largest index is required and thus the $\lambda$ of the input optical signal must be greater than $\lambda_{max}$ of the device. This means that for this pass-thru state, the control signals to the control electrodes 3019, 3027, 3025, 3031 can be configured to fill the QWs of the n-type modulation doped QW structures for both waveguides 3005, 3007 with electrons. These conditions dictate the shifting of the absorption edge and the index of refraction of the QW(s) of the n-type modulation doped QW structure for the waveguides 3005, 3007 over the length of the coupling region G to cause the light of the input optical signal to evanescently couple from waveguide 3005 to waveguide 3007 and then back to waveguide 3005 over the coupling region for output from waveguide structure 3001. For the waveguide 3005, the bias conditions for the pass-thru state can be realized by applying a forward bias of the top control electrode 3019 with respect to the second control electrode 3027 which results in minimal conduction between the top control electrode 3019 and the second control electrode 3027 while producing a field effect that fills the n-type modulation doped QW structure (layers 1097-1091) for the waveguide 3005 with charge (electrons). Such bias operations are similar to the bias conditions of the n-channel HFET in forming the 2-dimensional electron gas for the operation of the re-channel HFET as described above. For the waveguide 3007, the bias conditions for the pass-thru state can be realized by applying a forward bias of the top control electrode 3025 with respect to the second control electrode 3031 which results in minimal conduction between the top control electrode 3025 and the second control electrode 3031 while producing a field effect that fills the n-type modulation doped QW structure (layers 1097-1091) for the waveguide 3007 with charge (electrons). Again, such bias operations are similar to the bias conditions of the n-channel HFET in forming the 2-dimensional electron gas for the operation of the n-channel HFET as described above. It is also contemplated that the pass-thru state can be configured by supplying control signals to the control electrodes 3019, 3027, 3025, 3031 that empty charge from the QWs of the n-type modulation doped QW structures for both waveguides 3005, 3007. With the QWs of the n-type modulation doped QW structures for both waveguides 3005, 3007 both filled with or emptied of charge, there is no index difference between the waveguides 3005, 3007 and the pass-thru state is obtained.

For the switched state where the input optical signal is supplied to the input of the waveguide structure 3001 and is output from waveguide structure 3003 as best shown in FIG. 19A, it is required that the light evanescently couple from waveguide 3005 to waveguide 3007 over the coupling region (without coupling back to the waveguide 3005). For this switched state, the control signals to the control electrodes 3019, 3027, 3025, 3031 can be configured to fill only the QWs of the n-type modulation doped QW structure (layers 1097-1091) of waveguide 3005 with electrons, while emptying the QWs of the n-type modulation doped QW structure (layers 1097-1091) of waveguide 3007 of electrons. These conditions produce a change in the absorption edge and refractive index for two waveguides 3005, 3007 that causes the light of the input optical signal to evanescently couple from waveguide 3005 to waveguide 3007 over the coupling region (without coupling back to waveguide 3005) for output from waveguide structure 3003. For the waveguide 3005, the bias conditions for the switched state can be realized by applying a forward bias of the top control electrode 3019 with respect to the second control electrode 3027 which results in minimal conduction between the top control electrode 3019 and the second control electrode 3027 while producing a field effect that fills the n-type modulation doped QW structure (layers 1097-1091) for the waveguide 3005 with charge (electrons). Such bias operations are similar to the bias conditions of the n-channel HFET in forming the 2-dimensional electron gas for the operation of the n-channel HFET as described above. For the waveguide 3007, the bias conditions for the switched state can be realized by applying a reverse bias of the top control electrode 3025 with respect to the second control electrode 3031 which results in minimal conduction between the top control electrode 3025 and the second control electrode 3031 while producing a field effect that empties charge (electrons) from the n-type modulation doped QW structure (layers 1097-1091) for the waveguide 3007. It is also contemplated that the switched state can be configured by supplying control signals to the control electrodes 3019, 3027, 3025, 3031 that fill only the QWs of the n-type modulation doped QW structure (layers 1097-1091) of waveguide 3007 with electrons, while emptying the QWs of the n-type modulation doped QW structure (layers 1097-1091) of waveguide 3005 of electrons. With the QWs of the n-type modulation doped QW structures for one of the waveguides (such as 3005) filled with electrons, and the QWs of the n-type modulation doped QW structures for the other waveguide (such as 3007) emptied of electrons, there is an index difference between the waveguides 3005, 3007 and the switched state is obtained.

The bias conditions of the device as well as the electrical signals supplied to the control electrodes 3019, 3027, 3025, 3031 can be provided by resistors and/or transistors integrated on-chip (i.e., on the substrate 1001) or off-chip.

Figure 20A:
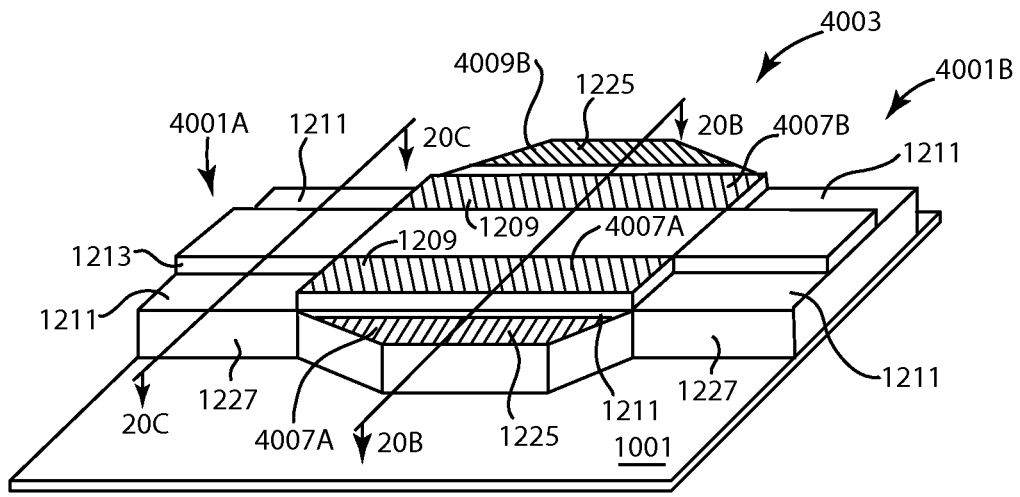
FIGS. 20A-20C are schematic illustrations of an exemplary waveguide optical amplifier realized as part of an optoelectronic integrated circuit that employs the layer structure of FIGS. 12A to 12C.
Figure 20B:
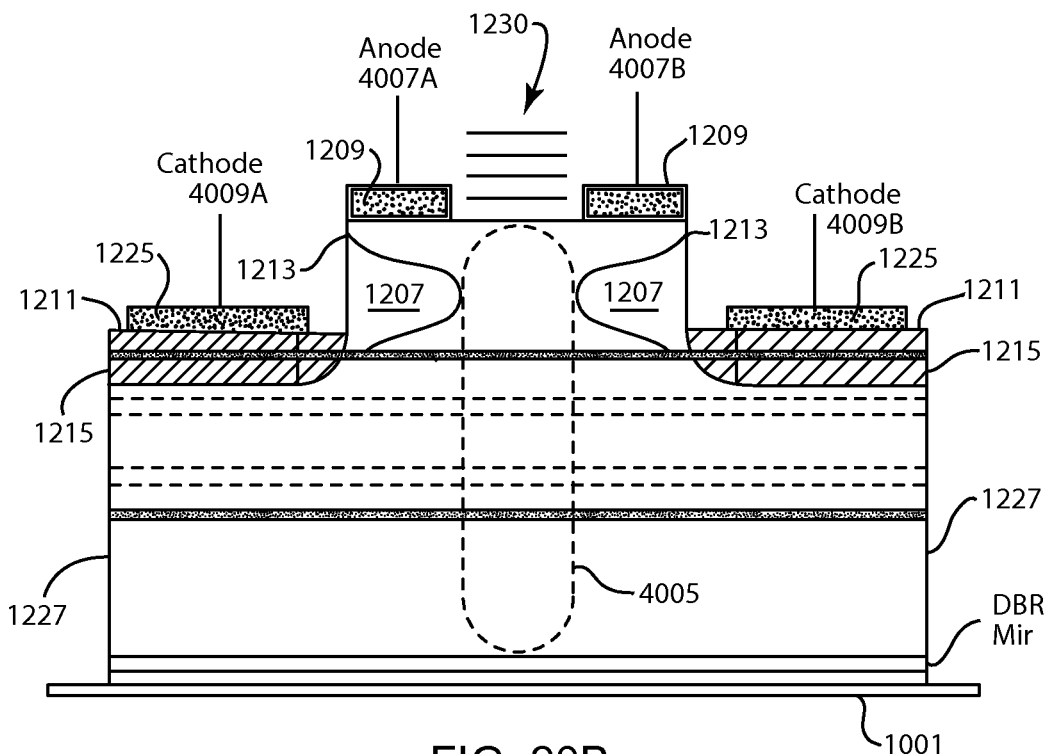
Figure 20C:
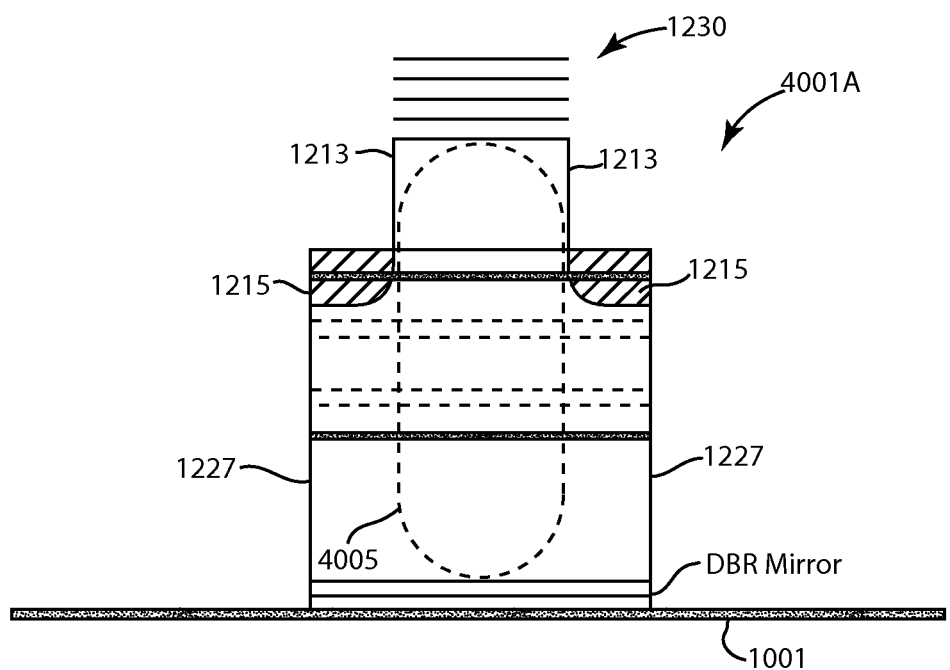

FIGS. 20A-20C illustrate straight passive waveguide sections 4001A, 4001B that are disposed on the input side and output side of a waveguide optical amplifier 4003 fabricated from the layer structure of FIGS. 12A to 12C. The straight passive waveguide sections 4001A, 4001B operate to passively guide light into and from the waveguide optical amplifier 4003. The waveguide optical amplifier 4003 is shown in more detail in the cross-section of FIG. 20B. One of the straight passive waveguide sections (4001A) is shown in more detail in the cross-section of FIG. 20C.

The straight passive waveguide sections 4001A, 4001B each employ a rib structure defined by opposed sidewalls 1227. The optical mode that travels through the respective rib waveguide structure is strongly confined within the respective rib waveguide structure by internal reflection at the reflective interfaces of the rib waveguide. Specifically, cladding for guiding the optical mode 4005 in the rib waveguide 4001A is provided by the top DBR mirror 1230 and the bottom DBR mirror defined by the periodic structure of layers 1003 and 1005 as best shown in the cross-section of FIG. 19B. Lateral confinement of the optical mode 4005 in the waveguide 4001A is provided by refractive index changes at the sidewalls 1213 that define the outer boundary of the waveguide 4001A (FIG. 20C), at n-type ion implants 1215 adjacent the top rib sidewalls similar to the passive waveguide sections of FIG. 15, and at the interface of the top mirror 1230 that covers the sidewalls 1213. Similar structure is used for the cladding of waveguide 4001B for guiding the optical mode 4005 in the rib waveguide 4001B. The top DBR mirror 1230 can extend in a continuous manner to form cladding over the aperture of the waveguide optical amplifier 4003 as is evident from the cross-section of FIG. 20B. In this configuration, the top DBR mirror 1230 operates as cladding for the optical mode 4005 that propagates through the waveguide optical amplifier 4003 between the top DBR mirror 1230 and the bottom DBR mirror formed by the periodic structure of layers 1003 and 1005. The lateral confinement of the optical mode 4005 is provided by the n-type ion implants 1207 under the anode metal 1209 of the waveguide optical amplifier 4003 that are subsequently formed as described below.

The waveguide optical amplifier 4003 further includes a top anode terminal electrode with two sections 4007A, 4007B that are electrically coupled to the top p-type ohmic contact layer (layer 1107) on opposite sides of the active waveguide region defined by the waveguide structure 1201 as best shown in FIGS. 20A and 20B. It also includes a cathode terminal electrode with two sections 4009A, 4009B that are electrically coupled to the n-type quantum well structure (layers 1097-1091) via n-type ion implants 1215 through opposite mesa regions 1211 outside the anode terminal sections 4007A, 4007B as best shown in FIGS. 20A and 20B.

The waveguide optical amplifier 4003 coupler of FIGS. 20A to 20C can be configured for optical amplification by forward biasing the anode terminal electrode sections 4007A, 400B with respect to the cathode terminal electrode sections 4009A, 4009B such that current flows between the anode electrode sections 4007A, 4007B and the cathode electrode sections 4009A, 4009B of the device, but at a level below the lasing threshold. In this configuration, the input optical signal that is supplied to the waveguide optical amplifier 4003 by the waveguide section 4001 and travels along the optical path of the waveguide optical amplifier 4003 is amplified in intensity by the respective device. The bias conditions of the device can be provided by resistors and/or transistors integrated on-chip (i.e., on the substrate 1001) or off-chip. In this configuration, the size of the embedded QDs of the template and emission substructures of layers 1097-1091 (and possibly the layers 1023-1051) correspond to the wavelength of the input optical mode to support the optical amplification function of the device.

The layers structure of FIGS. 12A-12C and the optoelectronic devices as described above (as well as the sequence of fabrication steps described below) can be adapted to realize other optoelectronic devices as part of the integrated circuit. For example, the device of FIGS. 20A-20C can be configured as an optical modulator with an optical path through the active waveguide region of the device. An input signal is applied to the anode electrode such that the anode electrode is biased with respect to the cathode electrode (which is electrically coupled to the n-type modulation doped QW structure of the device) over a range of voltage levels that produce an applied electric field that changes the absorption of the device. In this configuration, the optical signal that is supplied to the device and travels along the optical path of the device is modulated by the controlled time-varying absorption of the device. The modulation can be analog in nature by varying the electric field in a linear fashion. Alternatively, the modulation can be digital in nature by varying the electric field between two states: an on state with limited optical loss through the optical path and an off state that blocks the optical path through the active waveguide region of the device.

An integrated circuit employing the wide variety of optoelectronic devices and transistors as described above in conjunction with the layer structure of FIGS. 12A to 12C can be fabricated with a sequence of operations as follows.

First, alignment marks (not shown) are defined on the device structure.

Next, ion implantation of n-type ions is performed. The ion implantation can employ a mask defined by lift-off of a double layer consisting of a thin layer of silicon oxide (preferably 500 Å thick) and a thick layer of silicon nitride (preferably 2000 Å thick). The double layer mask defines openings for the n-type ion implant regions.

The ion implantation can form n-type implant regions 1207 for the optical devices as shown in FIGS. 15B, 16, 17, and 20B. The separation between such implant regions 1207 defines a waveguide region (or aperture) for the respective device. The implant regions 1207 can serve two functions. First, the implants 1207 create a p-n junction between the top p-type layers and the n-type implants that can funnel electrical p-type carriers (holes) injected from the top metal 1209 into the section of QW channel of the n-type modulation doped QW structure (layers 1097-1091) that is positioned between and under the n-type implants 1207. Second, the implants 1207 are slightly lower in index so that optical propagation is guided in the active waveguide region between the implants 1207.

For the optical closed loop microresonator of FIGS. 18A-18E, a central implant region 2012 can be formed by localized implantation of a suitable n+ species (such as silicon fluoride ions) into the device structure as best shown in FIGS. 18C and 18D. The perimeter of the central implant region 2012 is a Gaussian surface that defines the inner reflective surface of the waveguide 2002. The penetration depth of the central implant region 2012 (which is controlled by the power level during implantation) is in the top p-type region (preferably at or near layer 1101). During subsequent thermal anneal operations, the n-type species of the implant regions 1212 can diffuse to locally shift the band gap in the n-type modulation doped quantum well structure. The central implant region 2012 acts as a barrier to current flow so as to funnel current flowing from the anode terminal electrode 2051 into the active region of the waveguide 2002 and away from the central region of the device below the top anode terminal electrode 2051. Additionally, implant region 2014 can be formed by localized implantation of a suitable n+ species (such as silicon fluoride ions) into the device structure as best shown in FIG. 18D. The implant region 2014 extends along the length of the metal 1209 of the first control terminal electrode 2059 under such control terminal electrode. The perimeter of the central implant region 2014 is a Gaussian surface that defines the outer reflective surface of the waveguide 2008. The penetration depth of the implant region 2014 (which is controlled by the power level during implantation) is in the top p-type region (preferably at or near layer 1101). During subsequent thermal anneal operations, the n-type species of the implant regions 1214 can diffuse to locally shift the band gap in the n-type modulation doped quantum well structure. The implant region 2014 can be formed along with the implant regions 2012. Additionally, implant region 2016 can be formed by localized implantation of a suitable n+ species (such as silicon fluoride ions) into the device structure as best shown in FIG. 18D. The implant region 2016 extends along the length of the gap region G between the waveguides 2002 and 2008. The perimeter of the central implant region 2012 is a Gaussian surface that defines the inner reflective surfaces of the waveguides 2002 and 2008. The penetration depth of the implant region 2016 (which is controlled by the power level during implantation) is in the top p-type region (preferably at or near layer 1101). During subsequent thermal anneal operations, the n-type species of the implant regions 1214 can diffuse to locally shift the band gap in the n-type modulation doped quantum well structure. The implant region 2016 can be formed along with the implant regions 2012 and 2014.

For the waveguide optical coupler of FIGS. 19A-19C, implant regions 3017, 3021, and 3023 can be formed by localized implantation of a suitable n+ species (such as silicon fluoride ions) into the device structure as best shown in FIGS. 19B and 19C. The penetration depths of the implant regions 3017, 3021, and 3023 (which is controlled by the power level during implantation) is in the top p-type region (preferably at or near layer 1101). During subsequent thermal anneal operations, the n-type species of the implant regions 3017, 3021, 2023 can diffuse to locally shift the band gap in the n-type modulation doped quantum well structure. The implant region 3017 extends along the length of the metal 1209 of the top control terminal electrode 3109 under such top control terminal electrode 3019. The implant region 3023 extends along the length of the metal 1209 of the top control terminal electrode 3025 under such top control terminal electrode 3025. The implant region 3021 extends along the length of the gap region G between the waveguides 3005 and 3007. The perimeters of the implant regions 3017, 3021, 2023 are Gaussian surfaces that define the reflective surfaces of the respective waveguides.

Next, a metal layer 1209 (preferably tungsten) is deposited on the resultant structure to interface to the top layer 1107 over desired implant regions. The areas where metal layer 1209 interfaces to the top layer 1107 can form the metal of the gate terminal electrode 51 of the NHFET device (FIG. 13), the metal of the emitter terminal electrode 72 of the n-channel BICFET device (FIG. 14), the metal of the anode terminal electrode portions 81 of the quantum well laser (FIG. 15B), the metal of the anode terminal electrode portions 81 of the thyristor laser (FIG. 17), the metal of the central anode of the closed-loop microresonator and the control terminal electrode of FIGS. 18A-18D, the metal of the top control terminal electrodes 3019, 3025 for the waveguide optical coupler of FIGS. 19A-19C, and the metal of anode terminal electrode portions 4007A, 4007B of the waveguide optical amplifier 4003 of FIGS. 20A to 20C. For the optical devices of FIGS. 15A-15C, 16, and 17, portions of the anode metal 1209 lies over the n-type implant regions 1207 to provide an opening for the aperture of the respective optical device. For the waveguide optical amplifier 4003 of FIGS. 20A to 20C, portions of the anode metal 1209 lies over the n-type implant regions 1207 to define an opening corresponding to the waveguide region of the device.

Next, the metal layer 1209 is patterned to expose the desired double layer oxide/nitride features that underlie the metal layer 1209. This step can provide an offset (or spacing) between the patterned metal layer 1209 and the perimeter of the exposed double layer oxide/nitride features that is on the order of 1 um or less.

Figure 13:
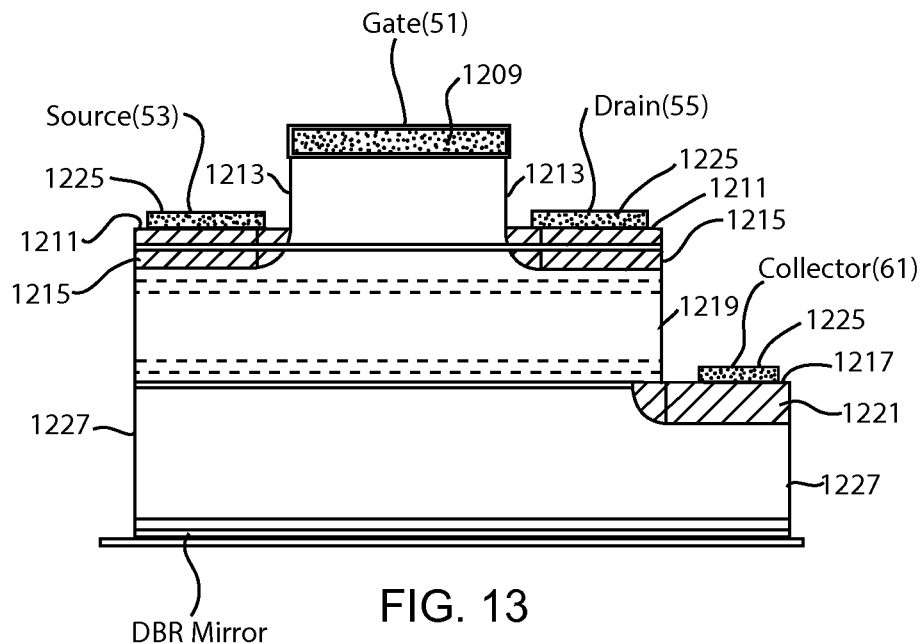
FIG. 13 is a schematic illustration of an exemplary n-channel HFET device realized as part of an optoelectronic integrated circuit that employs the layer structure of FIGS. 12A to 12C.
Figure 14:
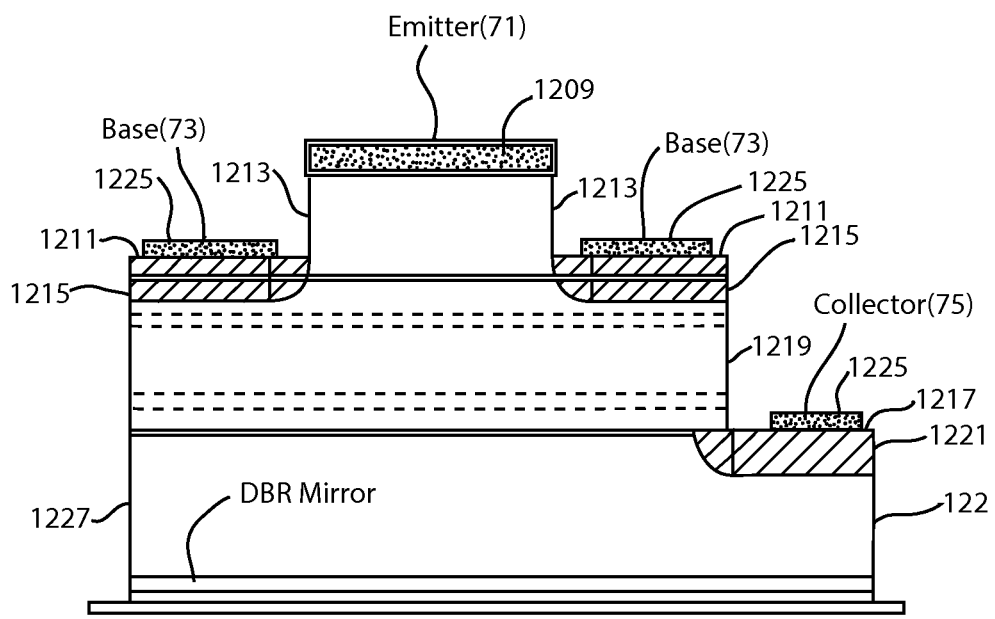
FIG. 14 is a schematic illustration of an exemplary n-channel base BICFET device realized as part of an optoelectronic integrated circuit that employs the layer structure of FIGS. 12A to 12C.

Next, with the waveguide regions and/or optical apertures of the optical devices protected with photoresist, patterning and etching operations are performed that expose a first set of mesa regions 1211 preferably at or near layer 1099 (which is above and near the n-type modulation doped quantum well structure formed by layers 1097-1091). For the n-channel HFET, the mesa regions 1211 are self-aligned to the metal 1209 of the gate 51 on opposite sides of the gate as shown in FIG. 13. For the n-channel BICFET (FIG. 14), the mesa regions 1211 are self-aligned to the metal layer 1290 of the emitter 71 on opposite sides of the emitter as shown in FIG. 14. For the laser/detectors of FIGS. 15A-15C, 16 and 17, the mesa regions 1211 are self-aligned to the anode metal 1209 on opposite sides of the active region (which lies between the implants 1207) as best shown in FIGS. 15B, 16, and 17. For the closed-loop microresonator of FIGS. 18A-18D, the mesa regions 1211 lie outside the closed-loop waveguide 2002 and inside the zig-zag waveguide structure 2001 near the straight section of the zig-zag waveguide structure 2001 as best shown in FIGS. 18C and 18D. For the waveguide optical coupler of FIGS. 19A-19C, the mesa regions 1211 are disposed opposite one another near the corresponding straight sections of the waveguides in the coupling region G as best shown in FIGS. 19A and 19C. For the waveguide optical amplifier of FIGS. 20A-20C, the mesa regions 1211 are self-aligned to the anode metal 1209 on opposite sides of the active waveguide region (which lies between the implants 1207) as best shown in FIGS. 20A and 20B. The etching operations that form the mesa regions 1211 preferably employ directional plasma etching techniques that forms sidewalls that extend downward in a substantially-vertical direction to the mesa regions 1211 therebelow. Such sidewalls can include the sidewalls 1213 of FIGS. 13-17 and 20A-20B, the sidewalls 2007, 2019 of FIGS. 18A-18D, and the sidewalls 3041 of FIG. 19C.

Next, an implant of n-type ions is implanted into the first set of mesa regions 1211 to form N+-type implant regions 1215, which are used to contact to the n-type QW structure (layers 1097-1091) for the device as needed, such as the n-channel HFET (FIG. 13), the n-channel BICFET (FIG. 14), the laser/detector s of FIGS. 15A-15C, 16 and 17, the closed-loop microresonator of FIGS. 18A-18C, the waveguide optical coupler of FIGS. 19A-19C, and the waveguide optical amplifier of FIGS. 20A-20C. The N+-type implant regions 1215 can also provide lateral confinement of light for the waveguide structures as described above.

Next, with the top mesa rib and portions of the N+-type implant regions 1215 protected with photoresist, patterning and etching operations are performed that expose a second set of mesa regions 1217 preferably at or near layer 1021 (which is above and near the p-type modulation doped quantum well structure formed by layers 1019-1015). The mesa regions 1217 are offset laterally from the mesa regions 1211. For the n-channel HFET, the mesa region 1217 can be offset laterally from the drain electrode 55 as shown in FIG. 13. Another mesa region 1217 (not shown) can also be offset laterally from the source electrode 55, if desired. For the n-channel BICFET, the mesa region 1217 can be offset laterally from a base terminal electrode portion 73 as shown in FIG. 14. An additional mesa region 1217 (not shown) can offset laterally from the opposite base terminal electrode portion if desired. For the quantum laser/detector of FIGS. 15A-15C, the mesa region 1217 is self-aligned to the anode metal 1209 on one end of the active waveguide region as best shown in FIG. 15A. For the quantum laser/detector of FIG. 16, the mesa regions 1217 are offset laterally from the mesa regions 1211. For the thyristor laser/detector of FIG. 17, the mesa region 1217 is self-aligned to the anode metal 1209 on the side of the active waveguide region opposite the mesa region 1211. For the closed-loop microresonator of FIGS. 18A-18D, the mesa region 1217 lies outside the closed-loop waveguide 2002 are best shown in FIG. 18C. The etching operation that forms the mesa regions 1217 preferably employs directional plasma etching techniques that forms sidewalls that extend downward in a substantially-vertical direction to the mesa regions 1217 therebelow. Such sidewalls can include the sidewalls 1219 of FIGS. 13-17, and the sidewalls 2021 of FIG. 18C.

Next, an implant of p-type ions is implanted into the second set of mesa regions 1217 to form P+-type implant regions 1221, which are used to contact to the p-type QW structure of layers 1019-1015 for the device as need, such as the n-channel HFET (FIG. 13), the n-channel BICFET (FIG. 14), the laser/detectors of FIGS. 15A-15C, 16 and 17, and the closed-loop microresonator of FIGS. 18A-18C. The P+-type implant regions 1217 can also provide lateral confinement of light for waveguide structures as described above.

Additional directional etching operations can be carried out to define a third set of mesa regions 1223 at the bottom ohmic contact layer 1009 for the p-channel HFET device (not shown), the quantum well laser/detector of FIG. 16, the thyristor laser/detector of FIG. 17, the closed-loop microresonator of FIGS. 18A-18C, and the waveguide optical amplifier of FIGS. 20A-20C as needed. The etching operation that forms the mesa regions 1223 preferably employs directional plasma etching techniques that forms sidewalls that extend downward in a substantially-vertical direction to the mesa regions 1223 therebelow. Such sidewalls can include the sidewalls 1224 of FIGS. 13-17, the sidewalls 2023 of FIG. 18C, and the sidewalls 3043 of FIG. 19C.

Next, the sidewalls of the resulting mesa structure are covered by a layer of silicon oxide (preferably 300 Å to 500 Å in thickness or possibly thinner), and metal contact areas are defined on the first set of mesa regions 1211, on the second set of mesa regions 1217, and on the third set of mesa regions 1223. The metal contact areas and oxide covered sidewalls are then covered by a metal layer 1225. Preferably, the metal layer 1225 comprises a composite metal structure formed by depositing Nickel (Ni) and Indium (In) metals, which is transformed during an RTA operation as set forth below into a thermally-stable low resistance metal layer. Exemplary NiIn composite metal structures can be derived from the deposition of an Ni/Ni—In(xN)/Ni multilayer structure (where each Ni—In layer is formed by codeposition of Ni and In). In the preferred embodiment, the same composite metal structure is used to form low resistance metal contact layers to both the n-type and p-type conduction channels of the integrated circuit. Other suitable metals and/or metal alloys can be used.

Next, the resultant structure is subject to a wet etchant that removes the oxide that underlies the metal layer 1225 (on the sidewalls outside metal contact regions on the first set of mesa regions 1211, on the second set of mesa regions 1217, and on the third set of mesa regions 1223) and leaves behind the metal layer 1225 that interfaces to the metal contact regions (on the first set of mesa regions 1211, on the second set of mesa regions 1217, and on the third set of mesa regions 1223). This step provides a small gap between the metal layer 1225 and the sidewalls that matches the thickness (preferably 300 Å to 500 Å in thickness or possibly thinner) of the removed oxide. This small gap reduces access resistance to the n-type and p-type modulation doped QW structures of the device. The wet etchant also removes the double layer oxide/nitride layers adjacent the top anode metal 1209. In order to prevent the anode metal 1209 from etching away in this wet etch, the anode metal 1209 can be protected by a suitable protective layer (such as thin layer of nickel). An example of a suitable wet etchant is a buffered HF etchant.

Next, it is contemplated that additional process steps, such as patterning and etching away the top p+ contact layers (layers 1107-1105) and possibly additional layers thereunder in the gap region(s) G between the adjacent waveguides of the evanescent-coupled waveguide devices as described herein, can be performed in order to prevent any charge transfer across such gap regions. The etched away areas can overlie and possibly extend into the n-type implant regions in such gap regions G (such as the implant region 2016 of the device of FIG. 18D and implant region 3021 of the device of FIG. 19C).

Next, an oxide layer is deposited that covers the structure, and the resultant structure is then subjected to a rapid thermal anneal (RTA) operation on the order of 800° C. to 900° C. (or greater). The RTA operation has two primary purposes. First, it activates all of the implant regions. Specifically, the RTA can cause the implant regions 1212, 1214, 1216 of FIGS. 18C-18D as well as the implant regions 3107, 3021, 3023 of FIGS. 19C-19D to diffuse and locally shift the band gap in the underlying n-type modulation doped quantum well structure (layers 1097-1091). This bandgap shift can prohibit charge transfer in the QWs of the n-type modulation doped QW structure (layers 1097-1091) across the gap region G between the adjacent waveguide sections. Voltage signals applied to the respective top control electrode of the device can overcome this effect to allow charge to enter (or exit) from the QWs of the n-type modulation doped QW structure (layers 1097-1091) as desired. Secondly, the RTA operation transforms the composite metal structure of the metal layers 1225 to form low-resistance metal contact layers to both the n-type and p-type conduction regions of the devices. Also note that during the RTA operation, the metal composite layers provide barrier layers to out-diffusion of the particular ion species that underlies such layers.

In this manner, the RTA-transformed metal layer 1225 can be patterned to define:

i) the source terminal electrode 53, the drain terminal electrode 55 and collector terminal electrode 61 of the n-channel HFET device (FIG. 13);

ii) the gate terminal electrode 57, the source terminal electrode 59, the drain terminal electrode 61, and the collector terminal electrode(s) 53/55 of the p-channel HFET device (not shown);

iii) the base terminal electrode(s) 73 and the collector terminal electrode 75 of the n-channel BICFET device (FIG. 14);

iv) the collector terminal electrode(s) 75, the base terminal electrode(s), and the emitter terminal electrode(s) of the p-channel BICFET device (not shown);

v) the cathode terminal electrode 83 and the collector electrode of the quantum well laser/detector of FIGS. 15A-15C;

vi) the anode terminal electrode, the cathode terminal electrode, and the collector electrode (which is configured as a floating electrode) for the quantum well laser/detector of FIG. 16;

vii) the n-injector terminal electrode, the p-injector terminal electrode, and the cathode terminal electrode for the thyristor laser/detector of FIG. 17;

viii) the electrodes of the closed-loop microresonator as shown in FIGS. 18A-18D;

ix) the electrodes of the waveguide optical coupler as shown in FIGS. 19A-19C; and x) the electrodes of the waveguide optical amplifier as shown in FIGS. 20A-20C;

Next, an isolation etch down to the substrate is performed in order to isolate the respective devices as needed. Preferably, the isolation etch down to the semi-insulating substrate 1001 is accomplished by a directional plasma etching operation that forms sidewalls that extend downward in a substantially-vertical direction to the substrate 1001 therebelow. Such sidewalls can include the sidewalls 1227 of FIGS. 13-17 and 20A-20C, the sidewalls 2006, 2018 and 2025, 2027 of FIGS. 18A-18C, and the sidewalls 3045 of FIG. 19C. Note that the isolation etch through the bottom DBR mirror can be omitted for the region between the microresonator and a transistor heater device (or portions thereof) in order to allow the heat generated by the transistor heater device to diffuse through the bottom DBR mirror to the microresonator for the desired heating for tuning the characteristic wavelength of the optical signal that propagates in the closed-path waveguide of the microresonator as described above.

Next, the resulting structure can be oxidized in a steam ambient to convert layers 1003 of the structure to AlO, which form the bottom DBR mirror for the respective devices.

To form an active device suitable for in-plane optical injection into a resonant vertical cavity and/or for in-plane optical emission from the resonant vertical cavity, a diffraction grating (for example, as described in detail in U.S. Pat. No. 6,031,243) can be formed above the waveguide region of the optical devices as described herein. Preferably, the diffraction grating is formed by ion beam milling of the silicon oxide of the waveguide structure 1201 overlying the active region of the respective optical device.

For cladding for the optical devices, the resultant structure can be processed to expose desired areas of the top layer 1107 and one or more dielectric layer pairs can be deposited in such areas of the top layer 1107 to form a top DBR mirror 1230 as shown in FIGS. 15B, 15C, 16, 17, 18C, 18D, 19B, 19C, 20B and 20C. The dielectric layer pairs form the highly-reflective mirror of the respective devices. Preferably, the dielectric layer pairs comprise $SiO_2$ (lower refractive index material) and a high refractive index material such as Si (for wavelengths in the band between 1310 nm and 1550 nm) or $TiO_2$ (for wavelengths below 1050 nm). The top mirror 1230 can achieve high reflectivity by employing multiple dielectric layer pairs. In the preferred embodiment, six or more dielectric layer pairs can be stacked upon one another to provide a reflectivity on the order of 99.7% or greater.

One or more protective layers can be deposited on the resultant structure, and a patterned metal layer and via interconnects to the electrode metal layers 1209, 1225 of the respective devices can be formed through the protective layer(s). This structure can be repeated for multiples levels of metallization as is well known in the semiconductor processing arts.

Advantageously, the self-assembled quantum dots (QDs) embedded within the QD-in-QW structures of the optoelectronic devices and integrated circuits as described herein improves the efficiency of such optoelectronic devices and integrated circuits. Specifically, the population inversion necessary for laser action and amplification as well as the photon absorption mechanism for necessary for optical detection occurs more efficiently with the introduction of the quantum dots and thus decreases the necessary current required for lasing action/amplification and increases the photocurrent produced by absorption. Furthermore, the size of the embedded QDs can be controlled to dictate the emission/absorption wavelength.

Moreover, the QD-in-QW structures are offset from the corresponding modulation doped quantum well structure. In one embodiment, such offset is in the range of 300 to 500 Å as provided by the spacer layers 22 and 30 of FIGS. 1-11 (layers 1057 and 1021 in the epitaxial layer structure of FIGS. 12A-12C. By offsetting the QDs from the corresponding modulation doped quantum well structure, the QDs do not negatively impact the performance (i.e., the maximum switching frequency and/or frequency response) of the QW channel transistors devices realized from the device structure, including the HFET and BICFET devices as described herein. However, the offset can negatively impact the threshold current and voltage required for certain optical functions (such as lasing and optical amplification) as well as the response time for optical detection. Thus, it is beneficial to minimize the offset to a point where the QDs do not negatively impact the performance of the QW channel transistors devices realized from the device structure. Note that a bias can be imposed to the collector region of the QW channel transistors devices in order to minimize the negative impact of the QDs on the performance of such devices.

The optoelectronic devices can be formed in arrays of emitters and/or detectors with associated waveguides and support electronics. The detector arrays can have an active imaging architecture or CCD architecture. The wavelengths can extend from the infrared band from 850 nm to 1550 nm.

The device structure as described herein can also be utilized to realize a single electron transistor (SET). The SET is a building block used in quantum computing that makes direct use of quantum-mechanical phenomena, such as superposition and entanglement, to perform operations on data. In quantum computing, a qubit (or quantum bit) refers to a unit of quantum information—the quantum analogue of the classical bit. The qubit is a two-state quantum-mechanical system, such as the spin state of a single electron: here the two states are the spin up and spin down states of the electron. In a classical system, a bit would have to be in one state or the other. In contrast, quantum mechanics allows the qubit to be in a superposition of both states at the same time, a property which is fundamental to quantum computing. Quantum computing can be used to carry out quantum mechanical (QM) algorithms that execute particular computation intensive problems. For example, Shor's algorithm was published in 1994, and shows that the problem of integer factorization is substantially faster when run on a quantum computer than when using the most efficient known classical factoring algorithm.

The SET confines an electron with a predetermined initial spin state (i.e., spin up state or spin down state) within a small volume surrounded by a potential barrier. During a load operation, an electron is loaded from a source electrode into the small volume via tunneling through the potential barrier between the source electrode and the small volume. The electron is then isolated for a period of time (computation period) within the small volume where no attempt is made to query the spin state of the electron (i.e. no energy is removed). At the end of the computation period, a read operation determines the final spin state (i.e., spin up or spin down) of the electron by attempting to read out the electron from the small volume to a drain electrode via tunneling through the potential barrier between the small volume and the drain electrode. From this description, it is evident that the SET provides a gateway between a quantum mechanical system and the macroscopic world. It is well known in physics that the true state of the variables in a quantum mechanical system can never be monitored in real time because the act of measurement forces the quantum mechanical system to be in one state or the other (i.e. to be deterministic) which by definition prevents the natural evolution of the quantum mechanical system in which the variables are not digital but instead consist of a certain probability of being in several different states simultaneously. However at some point (i.e., the end of the computational period, the data must be transferred to the macroscopic world where conventional computing principles can be applied.

Figure 21A:
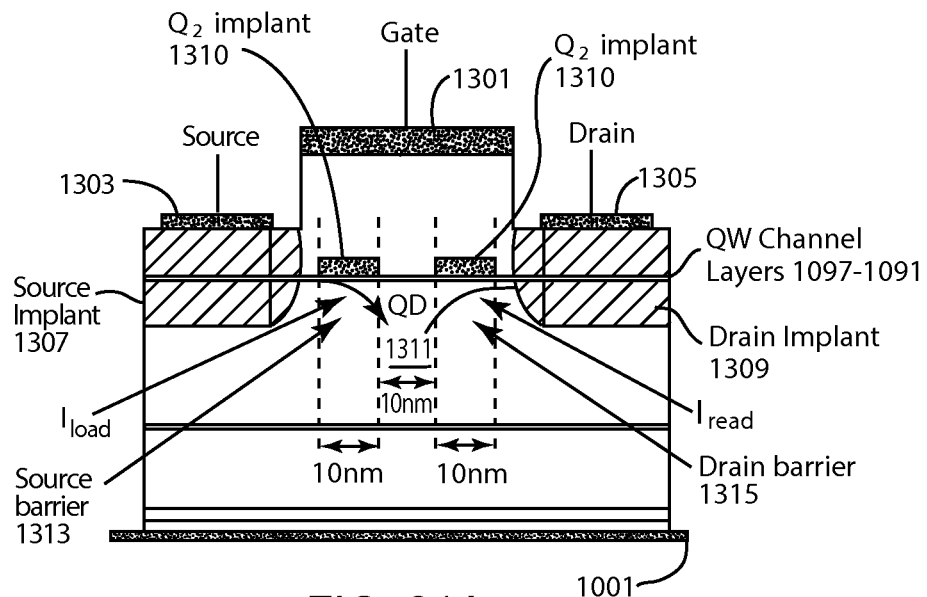
FIGS. 21A and 21B are a schematic cross-sectional view and top view, respectively, of an exemplary single electron transistor device in accordance with the present application.
Figure 21B:
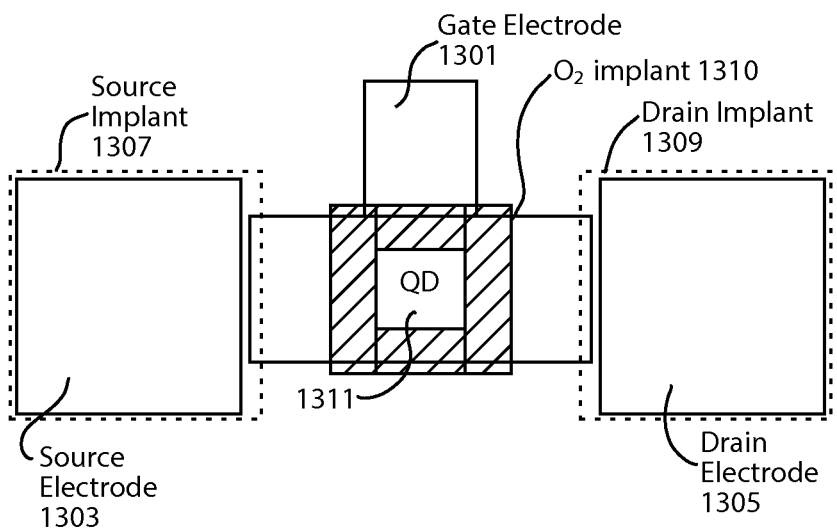

FIGS. 21A and 21B illustrate an exemplary embodiment of an SET realized from a device structure similar to that described above with respect to FIGS. 12A-12C. The SET is similar in structure to the NHFET device of FIG. 3 with a gate terminal electrode 1301, a source terminal electrode 1303, and a drain terminal electrode 1305. The source terminal electrode 1303 and the drain terminal electrode 1305 of the SET are operably coupled to opposite ends of a QW channel(s) realized in the n-type modulation doped QW structure of layers 1097-1091 by corresponding n-type source and drain implant regions 1307, 1309. A QD structure 1311 is formed in the device structure and covered by the gate terminal electrode 1301. The QD structure 1311 achieves confinement in the vertical (z) direction by the n-type modulation doped quantum well structure of layers 1097-1091. The QD structure 1311 is preferably realized by a single QD incorporated with the device structure, which can be isolated from other devices by etching down to the p+ layer 1101. To create the QD, a photomask is used to define an opening for ion implantation with the pattern of a ring or square. The internal diameter of the opening is about 100A (10 nm) and the width of the opening is also about 100A (10 nm) and defines the x and y dimensions of the QD while the quantum well defines the z dimension of the QD. Oxygen ions (i.e., O-) are implanted into the device structure through the ring-shaped photomask. The depth of the peak of the ring-shaped oxygen ion implant 1310 is centered over the N+ charge sheet 1097 of the n-type modulation doped quantum well structure of layers 1097-1091. The oxygen ion implant density is controlled such that the RTA cycle of the device structure causes the oxygen ions to react with the N+ doped charge sheet and convert it to high resistance. In one embodiment, the N+ charge sheet 1097 of 15% AlGaAs is doped to a level of $3.5 \times 10^{18}$ cm$^{-3}$ and the oxygen ions are implanted to a density of at least $1.75 \times 10^{19}$ cm$^{-3}$. It is expected that subjecting the sample to an RTA cycle of greater than 800° C. for 10 secs will be sufficient to convert the N+ charge sheet 1097 to high resistance. By converting the N+ charge sheet 1097 to high resistance, the threshold voltage over the width of the ring-shaped implant region will increase to >2V and the surface potential is essentially zero. Since the surface potential inside the ring-shaped implant region 1310 is about 1V, a QD is defined inside the ring-shaped implant region 1310 with dimensions of 60×100×100A with a well potential of approximately 1V. The ring-shaped implant region 1310 confines and isolates the electron in this QD during operation of the SET. Thus, a QD structure 1311 is defined internal to the SET with a potential barrier (labeled "Source Barrier 1313") of 100A thickness between the source terminal electrode 1303 and the QD structure 1311 and a potential barrier (labeled "Drain Barrier 1315") of 100A thickness between the QD structure 1311 and the drain terminal electrode 1305. The gate terminal electrode 1301 can be formed on the p+ layer 1101 similar to the gate of the n-channel HFET device. In this manner, the gate terminal electrode 1301 is formed over the QD structure 1311 and over both the source and drain barriers 1313, 1315. Since the gate terminal electrode covers the QD structure 1311, the voltage level of the gate terminal electrode 1301 controls the energy level in the QD structure 1311. However, the voltage of the gate terminal electrode 1301 will have little or no effect on the magnitude of the source and drain barriers 1313, 1315 because the N+ charge sheet 1097 has been converted to high impedance. The voltage level of the gate terminal electrode 1301 with respect to the source terminal electrode 1303 can be controlled to allow for tunneling of a single electron through the source barrier 1313, and the voltage level of the gate terminal electrode 1301 with respect to the drain terminal electrode 1305 can be controlled to allow for tunneling of the electron through the drain barrier 1315 during the read operation.

Figure 22A:
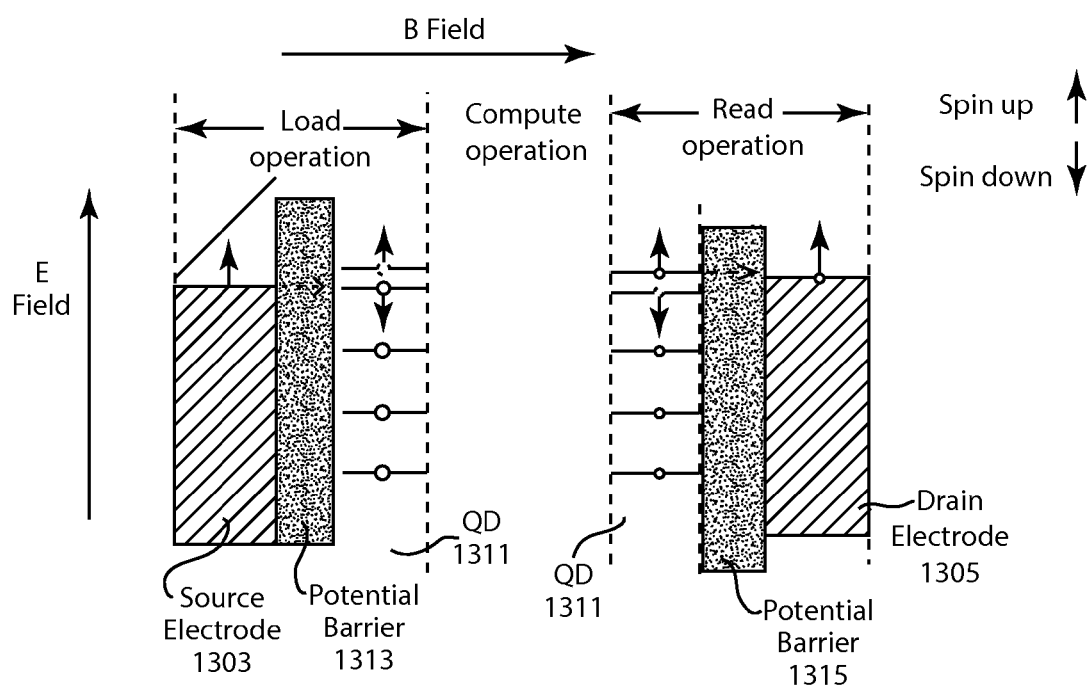
FIG. 22A is a schematic illustration of the load, compute and read operations of the exemplary single electron transistor of FIGS. 21A and 22B.
Figure 22B:
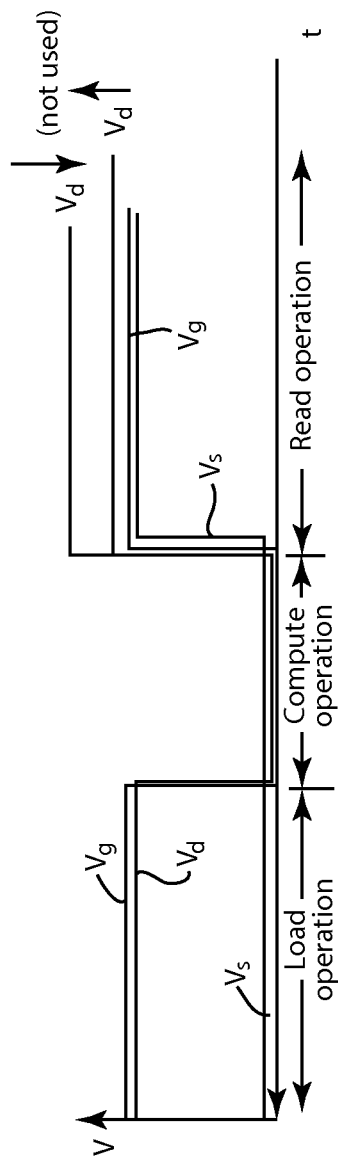
FIG. 22B are exemplary voltage signal waveforms that can be applied to the gate, source and drain terminal electrodes of the single electron transistor device to carry out the load, compute and read operations of FIG. 22A.
Figure 22C:
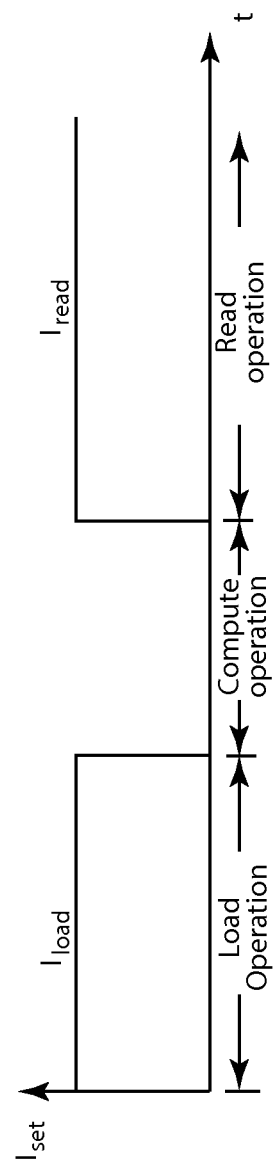
FIG. 22C are generalizations of current that flows into the quantum dot and read out from the quantum dot of the single electron transistor during the load, compute, and read operations, respectively of FIG. 22A.

The operation of the SET of FIGS. 21A and 21B is illustrated in the schematic diagram of FIG. 22A and the accompanying waveform diagram of FIGS. 22B and 22C. During the load operation, if the top energy level in the QD structure 1311 is aligned with the Fermi energy of the source terminal electrode 1303, electron tunneling can occur through the source barrier 1313 into the QD structure 1311 if the top energy level in the QD structure 1311 is empty. However, the top energy level in the QD structure 1311 is split into two levels by the Zeeman effect due to the presence of a large static magnetic field B with spin up being at a higher energy than spin down as shown in FIG. 22A. The static magnetic field B can be generated by an external permanent magnet, an electromagnet or other suitable device. The corresponding electrical field E is also shown. Therefore the Fermi energy of the source terminal electrode 1303 can be set to an appropriate energy to dictate a predefined spin state (e.g., initial "spin up" state). In this manner, a bias voltage level of the gate terminal electrode 1301 with respect to the source terminal electrode 1303 can be applied to enable electron tunneling through the source barrier 1313 into the QD structure 1311 as well as initialization of the spin state of the electron in the QD structure 1313 to the desired predefined "spin-up" state. This is performed during the load operation as illustrated in the exemplary waveforms of FIGS. 22B and 22C. It is assumed that the QD structure 1311 is small enough and the electron wavelength is large enough that only one electron at a time can tunnel. Therefore only one electron is loaded from the source terminal electrode 1303 into the QD structure 1311.

The compute operation follows the load operation. Specifically, once the electron has tunneled to the QD structure 1311, the electrostatic potential of the QD structure 1311 is move down (negative charge) by lowering the bias potential applied to the gate terminal electrode 1301 as illustrated in the exemplary waveforms of FIGS. 22B and 22C. The lower electrostatic potential of the QD structure 1311 limits the ability of the electron to tunnel back to the source terminal electrode 1303. Thus, during the compute operation, the electron is confined within the QD structure 1311 where it is isolated for a period of time (computation period) with no attempt made to query the spin state of the electron (i.e. no energy is removed).

The read operation follows the compute operation. During the read cycle, a bias voltage level of the gate terminal electrode 1301 with respect to the drain terminal electrode 1305 can be applied to enable electron tunneling from the QD structure 1311 through the drain barrier 1315 to the drain terminal electrode 1305. Specifically, such bias voltage is set to allow for tunneling of electrons that have the spin up energy state (while not allowing tunnel of electrons that have the spin down energy state). Thus, if the electron has the spin up state, the read operation will produce a minute current pulse output as shown in FIG. 22C. However, if the electron has the spin down state, no current output will be observed during the read operation. Note that in order to be practical, the thermal excitation current must be quite a bit less than the tunnel current. Therefore the tunnel thickness must be reduced and the barrier height increased sufficiently until this condition is met, for otherwise cooling will be required Although the SET as shown employs a single QD (which we can recognize by definition as being synonymous with a single qubit), it is clear that multiple QDs (i.e., qubits) with a source electrode input and a drain electrode output may be constructed with controlled tunneling barriers between the QDs. Furthermore, the QDs can be extended in both the x and y directions according to the implementation of an arbitrary quantum algorithm. The gate may be common to all the qubits or group of qubits, i.e. multiple gates may also be used. Thus, an arrangement of SETs may be constructed according to the design required for a specific algorithm, such as the Shor algorithm.

Advantageously, the SET of the present application allows for realization of electron spin state as a quantum mechanical variable in such a way that the SET is also compatible, in the same technology infrastructure, with conventional state-of-the-art logic circuits. This allows the inputs and outputs from SET quantum computing function to support and take advantage of the existing methodology for high performance computing.

There have been described and illustrated herein several embodiments of an optoelectronic integrated circuit employing quantum dots embedded in one or more quantum wells and a method of fabricating the same. While particular embodiments of the invention have been described, it is not intended that the invention be limited thereto, as it is intended that the invention be as broad in scope as the art will allow and that the specification be read likewise. Thus, while particular group III-V material system and heterostructures have been disclosed, it will be appreciated that other III-V material systems and heterostructures can be used to realize the optoelectronic integrated circuitry as described herein. It will therefore be appreciated by those skilled in the art that yet other modifications could be made to the provided invention without deviating from its spirit and scope as claimed.

What is claimed is:

1. A transistor device comprising:
   a gate terminal electrode disposed between a source terminal electrode and a drain terminal electrode;
   wherein the gate terminal electrode overlies a quantum dot structure embedded in a quantum well of a modulation doped quantum well structure that includes a charge sheet offset from the quantum well, and
   wherein a potential barrier surrounds the quantum dot structure.

2. A transistor device according to claim 1, wherein:
   the potential barrier is defined by an ion implant region that surrounds the quantum dot structure.

3. A transistor device according to claim 2, wherein:
   the ion implant region is formed from an ion species that reacts with the charge sheet of the modulation doped quantum well structure under predefined high temperature conditions.

4. A transistor device according to claim 3, wherein:
   location and dimensions of the potential barrier are dictated by the location and size of an opening defined by a photomask that allows for the implantation of the ion species.

5. A transistor device according to claim 3, wherein:
   the ion species comprises oxygen ions.

6. A transistor device according to claim 1, further comprising:
   means for biasing the gate and source terminal electrodes to allow for tunneling of a single electron from the source terminal electrode through the potential barrier surrounding the quantum dot structure and into the quantum dot structure; and
   means for biasing the gate and drain terminal electrodes to allow for selective tunneling of a single electron from the quantum dot structure through the potential barrier surrounding the quantum dot structure to the drain terminal electrode, wherein the selective tunneling of the single electron is based upon spin state of the single electron.

7. A transistor device according to claim 1, wherein:
   the quantum dot structure is self-assembled.

* * * * *